(12) United States Patent
Kim et al.

(10) Patent No.: US 7,528,409 B2
(45) Date of Patent: May 5, 2009

(54) ARRAY SUBSTRATE FOR LIQUID CRYSTAL DISPLAY DEVICE AND METHOD OF MANUFACTURING THE SAME

(75) Inventors: Hyo-Uk Kim, Gumi-si (KR);
Chang-Bin Lee, Busan (KR);
Byung-Kook Choi, Incheon (KR);
Dong-Young Kim, Gyeongbuk (KR)

(73) Assignee: LG. Display Co., Ltd., Seoul (KR)

( * ) Notice: Subject to any disclaimer, the term of this patent is extended or adjusted under 35 U.S.C. 154(b) by 59 days.

(21) Appl. No.: 11/639,567

(22) Filed: Dec. 15, 2006

(65) Prior Publication Data
US 2008/0001177 A1    Jan. 3, 2008

(30) Foreign Application Priority Data
Jun. 30, 2006    (KR) .................. 10-2006-0060986

(51) Int. Cl.
| H01L 29/10 | (2006.01) |
| H01L 29/76 | (2006.01) |
| H01L 31/036 | (2006.01) |
| H01L 31/112 | (2006.01) |
| H01L 29/04 | (2006.01) |
| H01L 31/0376 | (2006.01) |
| H01L 31/20 | (2006.01) |
| H01L 29/15 | (2006.01) |
| H01L 31/062 | (2006.01) |
| H01L 31/113 | (2006.01) |

(52) U.S. Cl. .................. 257/66; 257/57; 257/59; 257/72; 257/291; 257/E29.151

(58) Field of Classification Search .......... 257/59, 257/72, 291, 57, 66, E29.151
See application file for complete search history.

(56) References Cited

U.S. PATENT DOCUMENTS

| 6,580,127 | B1 * | 6/2003 | Andry et al. ............ 257/347 |
| 6,721,026 | B2 * | 4/2004 | Cheng et al. ............ 349/141 |
| 6,836,299 | B2 * | 12/2004 | Chung et al. ............ 349/42 |
| 7,336,324 | B2 * | 2/2008 | Kim et al. ............ 349/43 |
| 7,342,616 | B2 * | 3/2008 | Chae ............ 349/39 |
| 2005/0122443 | A1 * | 6/2005 | Kim et al. ............ 349/46 |
| 2005/0231669 | A1 * | 10/2005 | Kim ............ 349/138 |
| 2005/0248708 | A1 * | 11/2005 | Park et al. ............ 349/149 |
| 2005/0270446 | A1 * | 12/2005 | Kim et al. ............ 349/110 |
| 2005/0285195 | A1 * | 12/2005 | Choi et al. ............ 257/347 |
| 2006/0092351 | A1 * | 5/2006 | Kim et al. ............ 349/110 |
| 2006/0125986 | A1 * | 6/2006 | Choo et al. ............ 349/114 |
| 2006/0192907 | A1 * | 8/2006 | Kwon et al. ............ 349/43 |
| 2007/0109458 | A1 * | 5/2007 | Chae ............ 349/47 |
| 2007/0153203 | A1 * | 7/2007 | Kim et al. ............ 349/141 |

* cited by examiner

*Primary Examiner*—Ida M Soward
(74) *Attorney, Agent, or Firm*—Brinks Hofer Gilson & Lione

(57) ABSTRACT

An array substrate for a liquid crystal display device includes a substrate, a gate line on the substrate, a data line crossing the gate line to define a pixel region, a thin film transistor connected to the gate line and the data line and including a gate electrode, an active layer, an ohmic contact layer, a buffer metallic layer, a source electrode and a drain electrode, and a pixel electrode in the pixel region and connected to the thin film transistor, wherein the data line includes a transparent conductive layer and an opaque conductive layer, and each of the source and drain electrodes and the pixel electrode includes a transparent conductive layer.

18 Claims, 68 Drawing Sheets

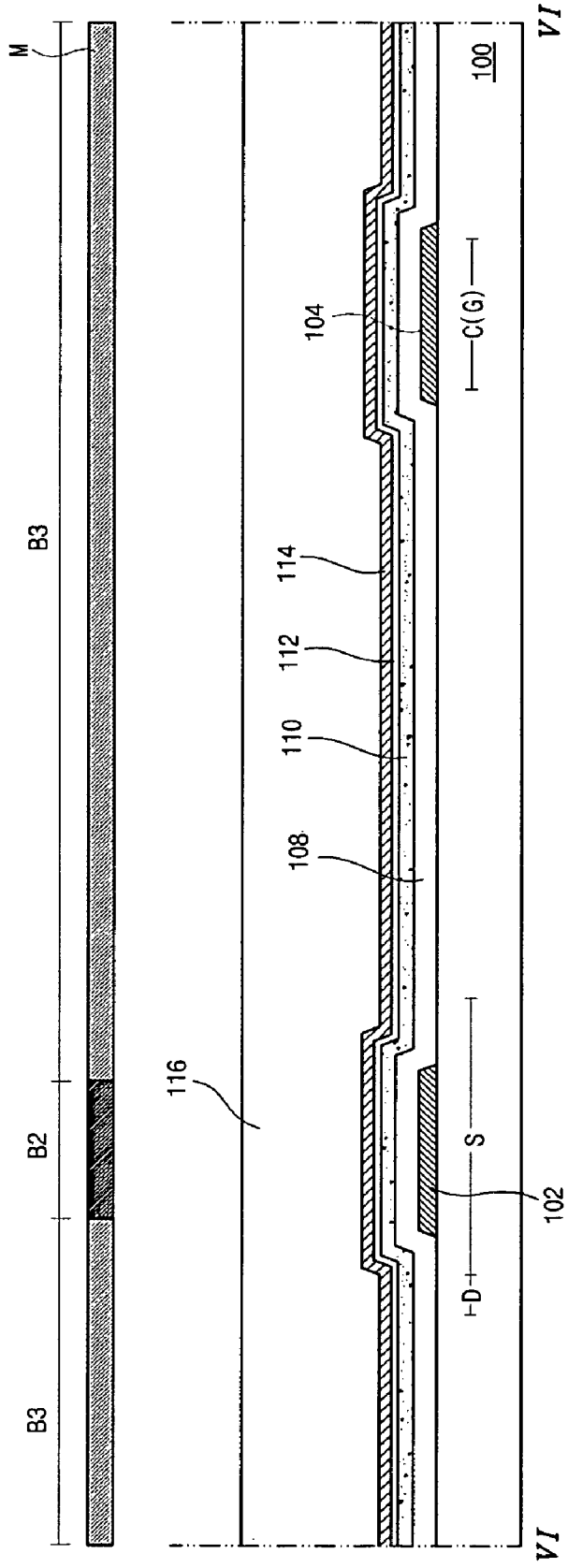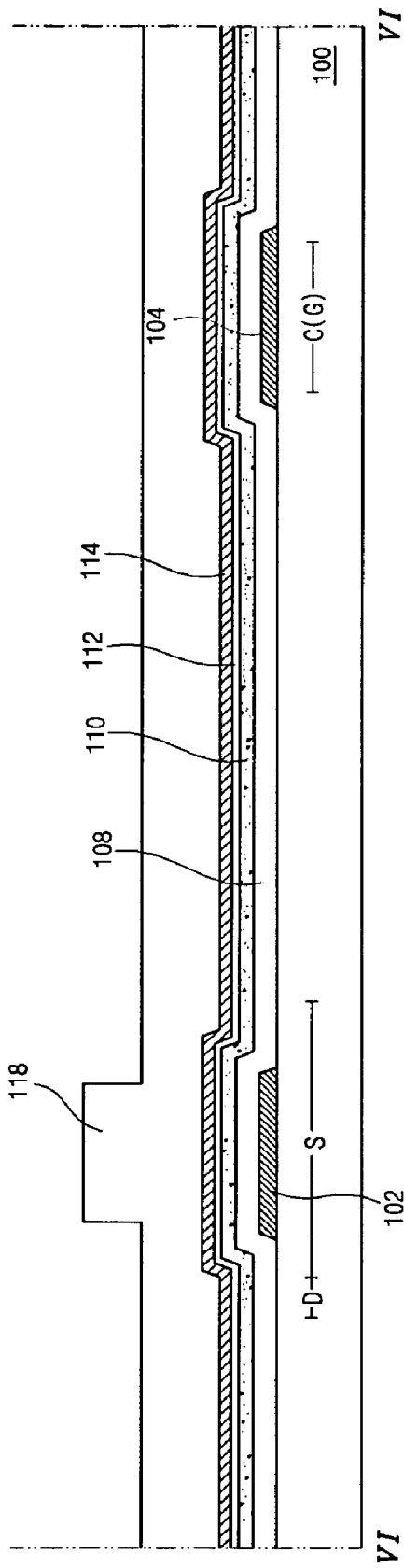

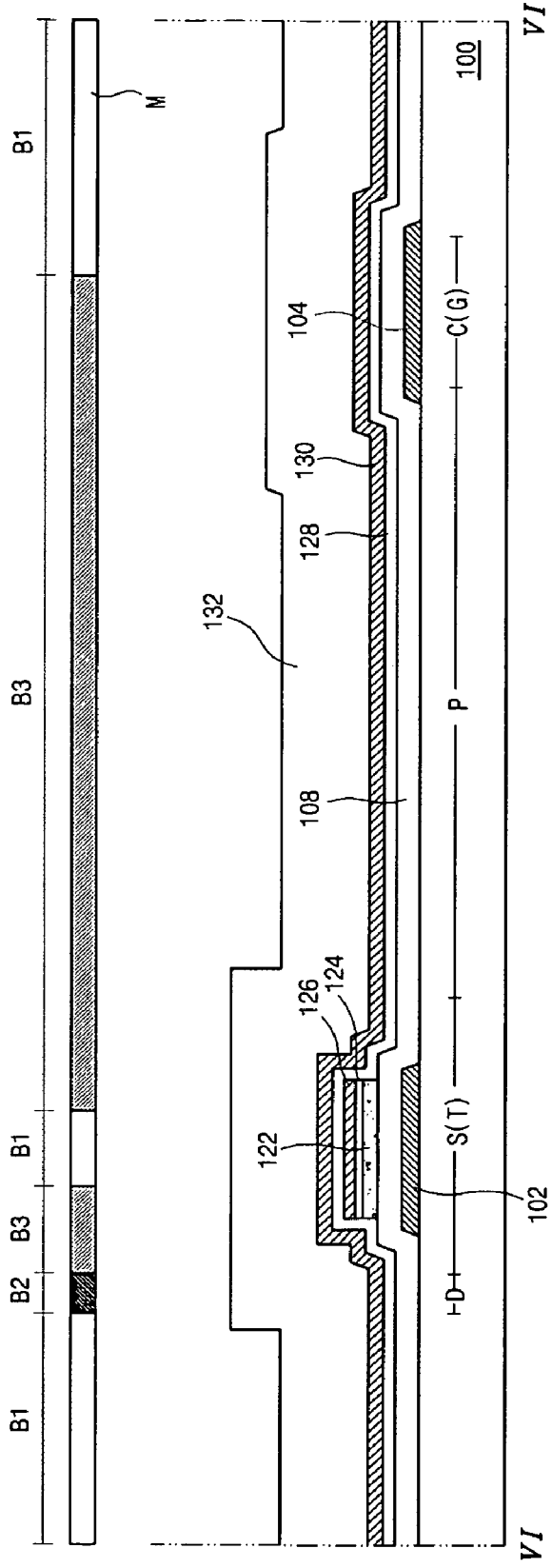
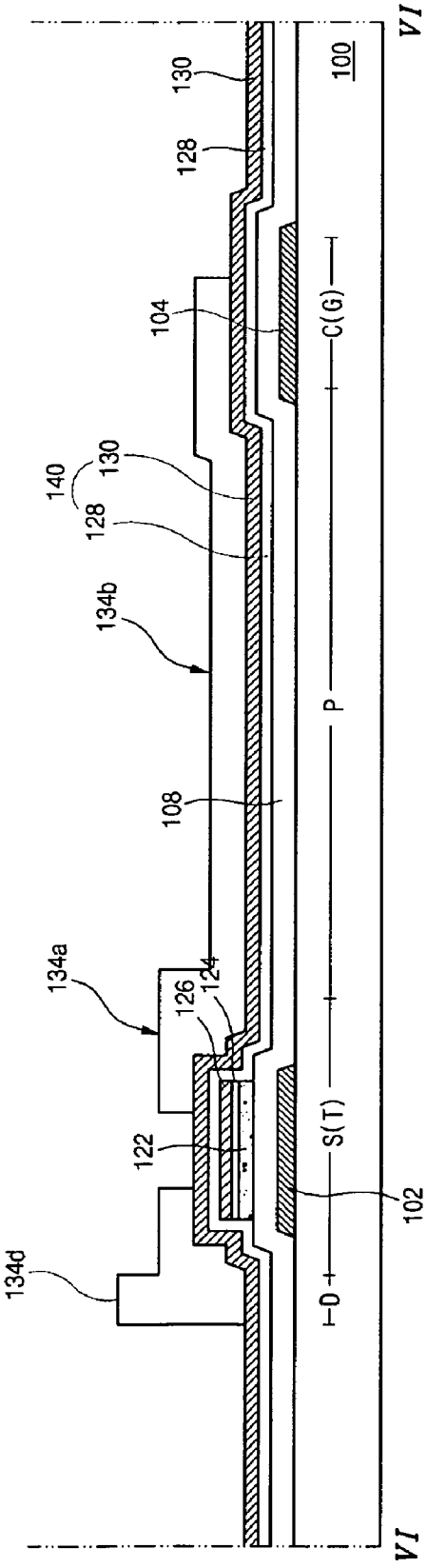
FIG. 9F
FIG. 9G

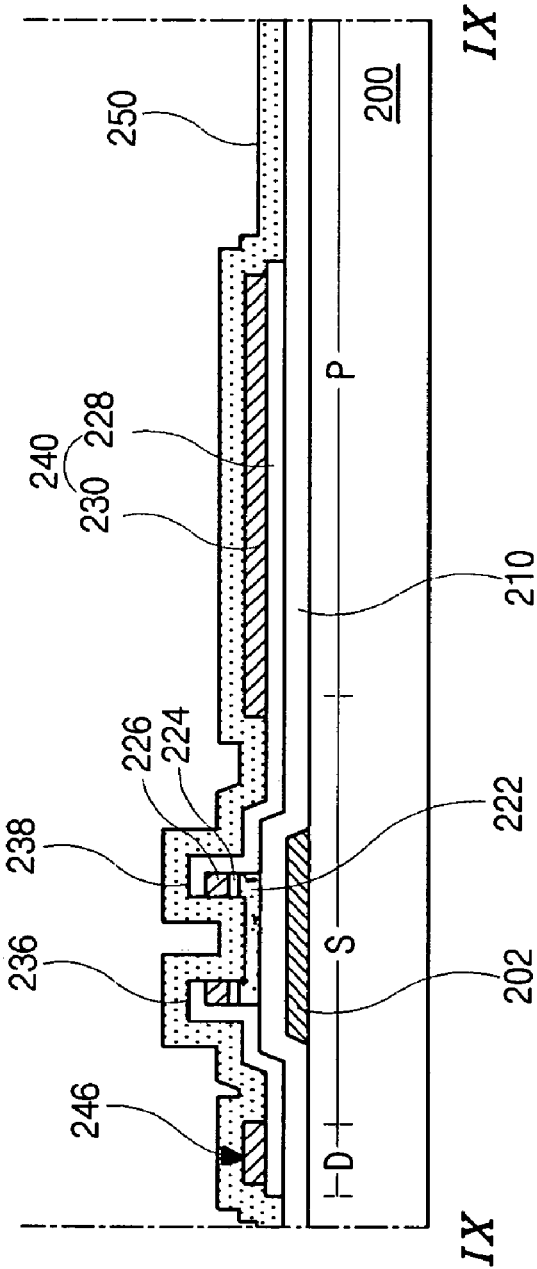
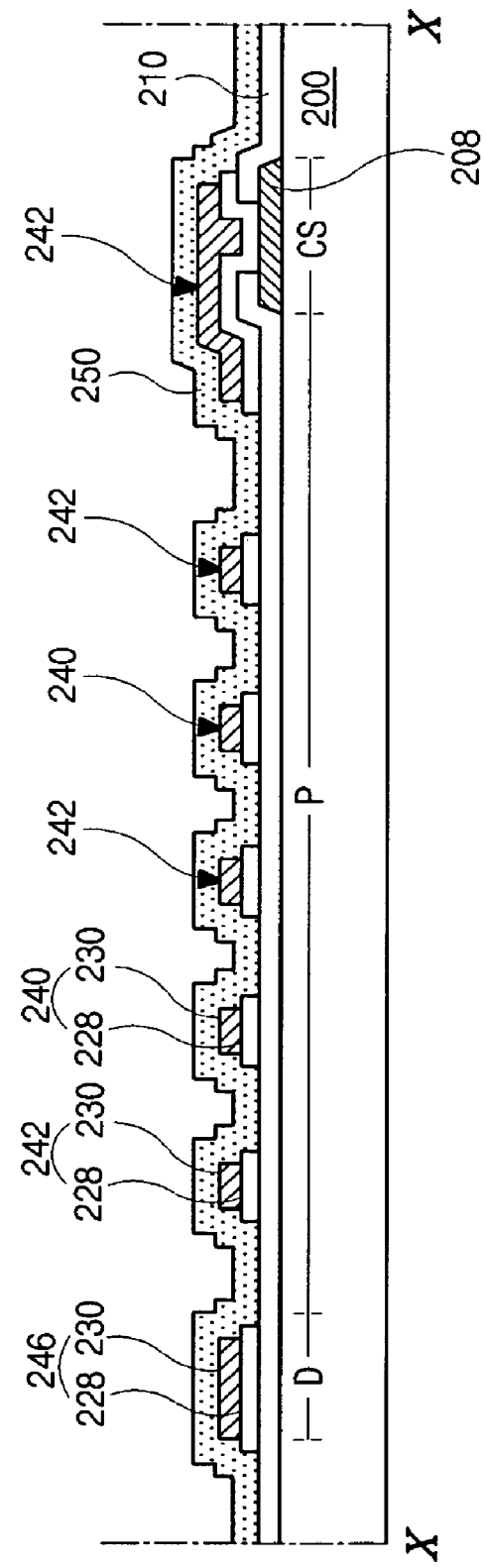
FIG. 15A
FIG. 15B

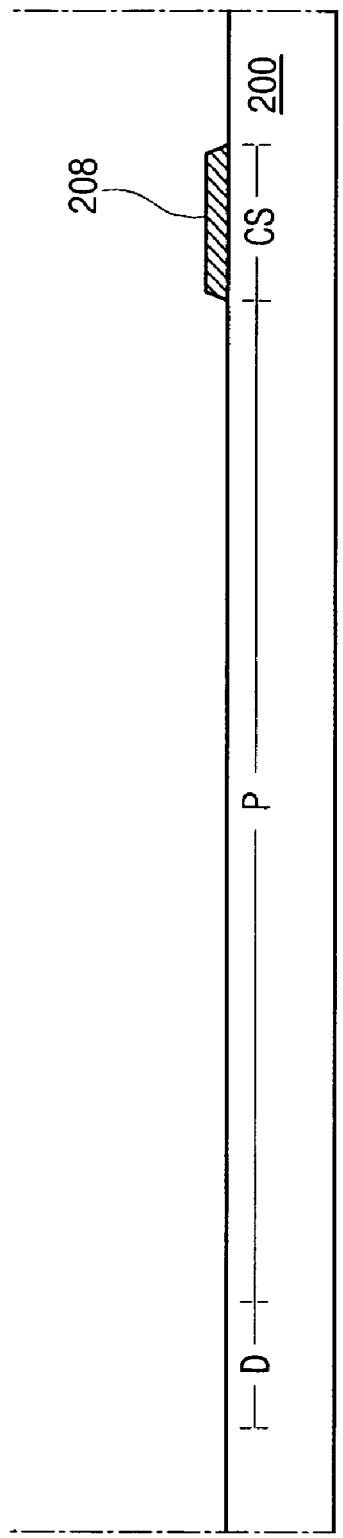
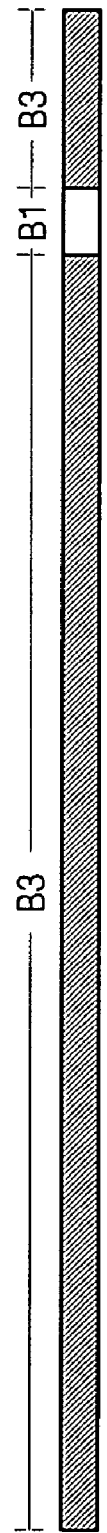
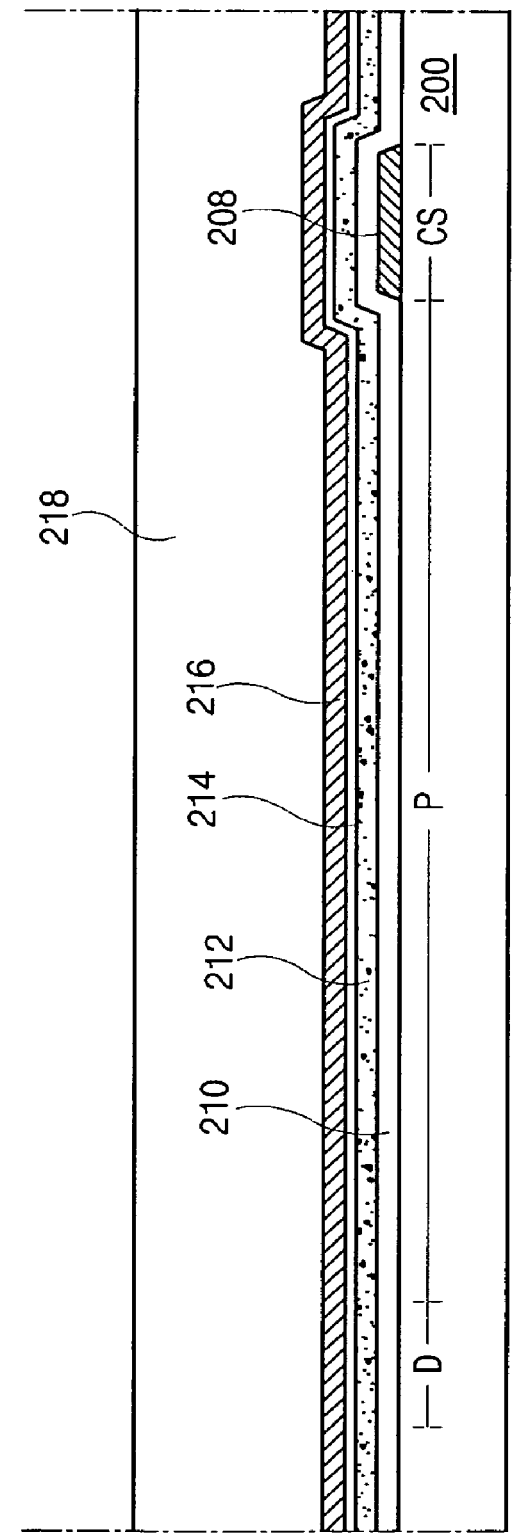
FIG. 17A
FIG. 17B

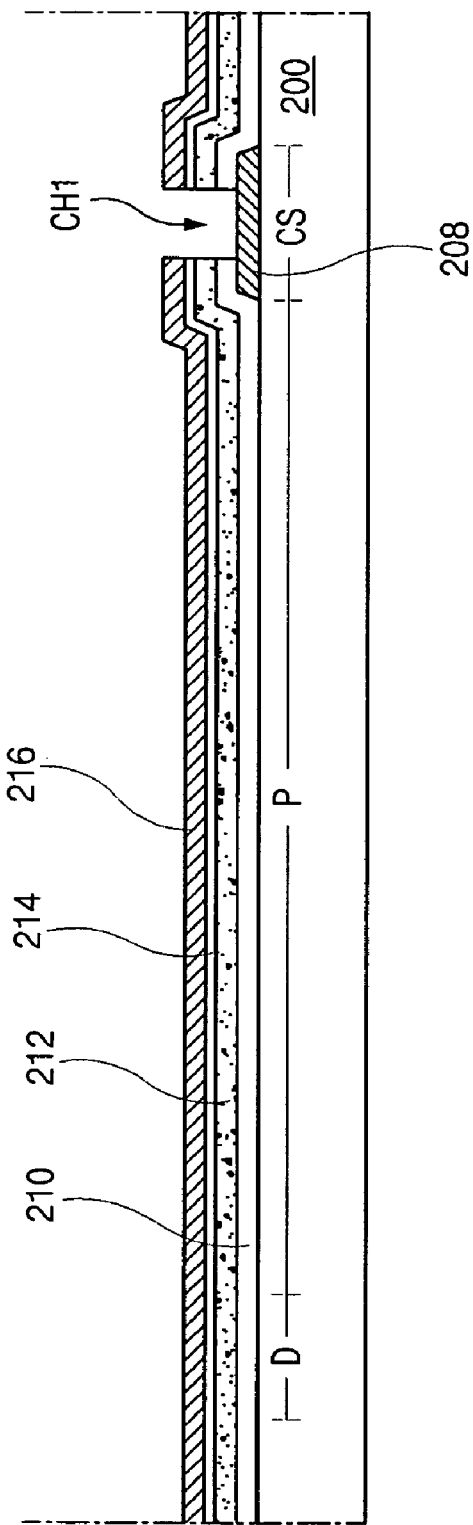
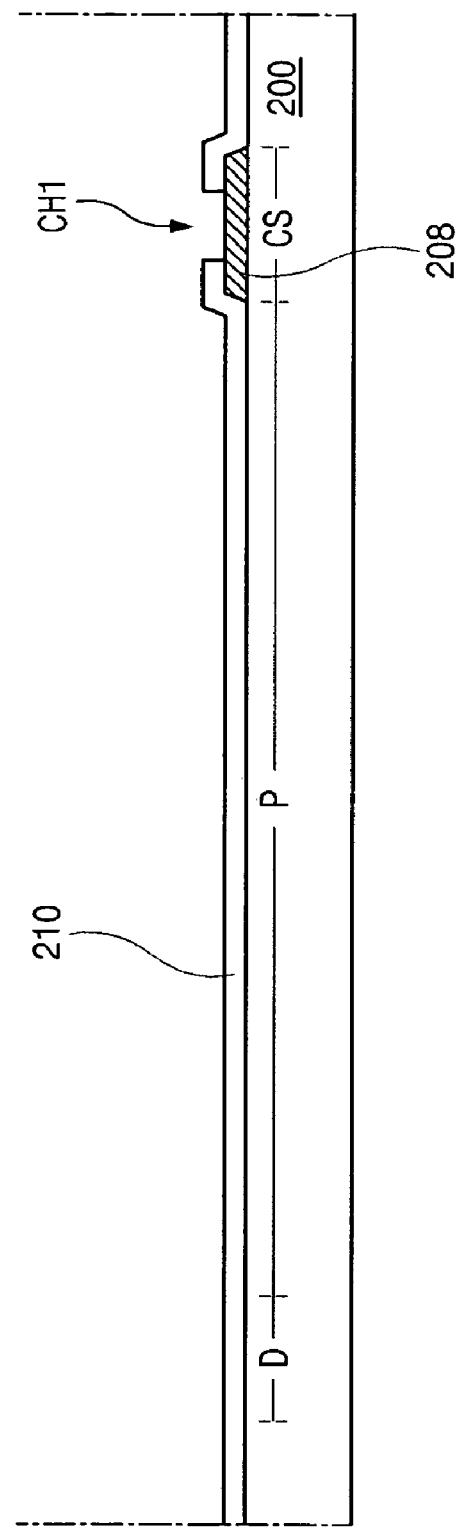
FIG. 17E
FIG. 17F

ARRAY SUBSTRATE FOR LIQUID CRYSTAL DISPLAY DEVICE AND METHOD OF MANUFACTURING THE SAME

This application claims the benefit of Korean Patent Application No. 2006-0060986, filed in Korea on Jun. 30, 2006, which is hereby incorporated by reference for all purposes as if fully set forth herein.

BACKGROUND

1. Technical Field

The present invention relates to a liquid crystal display device, and more particularly, to an array substrate for a liquid crystal display (LCD) device and a method of manufacturing the same.

2. Discussion of the Related Art

Liquid crystal display ("LCD") devices are driven based on optical anisotropy and polarization characteristics of a liquid crystal material. Liquid crystal molecules have a long and thin shape, and the liquid crystal molecules are regularly arranged along a certain direction. An alignment direction of the liquid crystal molecules depends on the intensity or the direction of an electric field applied to the liquid crystal molecules. Light passes through the LCD device along the alignment direction of the liquid crystal molecules. By controlling the intensity or the direction of the electric field, the alignment direction of the liquid crystal molecules changes, and images are displayed.

Generally, an LCD device includes two substrates, which are spaced apart and facing each other, and a liquid crystal layer interposed between the two substrates. Each of the substrates includes an electrode. The electrodes from respective substrates face one the other. An electric field is induced between the electrodes by applying a voltage to each electrode. An alignment direction of liquid crystal molecules changes in accordance with a variation in the intensity or the direction of the electric field. The direction of the electric field is perpendicular to the substrates. The LCD device has relatively high transmittance and a large aperture ratio.

Active matrix liquid crystal display ("AMLCD") devices, which include thin film transistors as switching devices for a plurality of pixels, have been widely used due to their high resolution and ability to display fast moving images.

The LCD device will be described hereinafter with reference to accompanying drawings.

FIG. 1 is a schematic perspective view of an LCD device according to the related art.

In FIG. 1, an LCD device 51 includes a first substrate 5 and a second substrate 10 spaced apart from each other. A liquid crystal layer (not shown) is interposed between the first and second substrates 5 and 10. A black matrix 6 and a color filter layer is formed on an inner surface of the first substrate 5, which faces the second substrate 10, and a common electrode 9 is formed on the color filter layer. The color filter layer includes color filters of red, green and blue 7a, 7b and 7c.

Gate lines 14 and data lines 26 are formed on an inner surface of the second substrate 10, which faces the first substrate 5. The gate lines 14 and the data lines 26 cross each other to define pixel regions P. A thin film transistor T is formed at each crossing point of the gate and data lines 14 and 26. A pixel electrode 32 is formed in each pixel region P and is connected to the thin film transistor T. The pixel electrode 32 is formed of a transparent conductive material that transmits light relatively well, such as indium tin oxide (ITO).

The first substrate 5, which includes the black matrix 6, the color filter layer, and the common electrode 9, may be referred to as a color filter substrate. The second substrate 10, which includes the gate lines 14, the data lines 26, the thin film transistors T, and the pixel electrodes 32, may be referred to as an array substrate.

The array substrate may be manufactured through 5 or 6 mask processes. For example, the array substrate may be manufactured through 5 mask processes as follows. Gate lines, gate electrode and gate pads are formed on a substrate through a first mask process. Active layers and ohmic contact layers are formed through a second mask process. Data lines, source electrodes, drain electrodes and data pads are formed through a third mask process. A passivation layer is formed substantially on an entire surface of the substrate, and contact holes exposing the drain electrodes are formed in the passivation layer through a fourth mask process. Pixel electrodes, which are connected to the drain electrodes through the contact holes, are formed through a fifth mask process.

The mask process includes many steps of coating a thin film with photoresist, exposing the photoresist to light, developing the photoresist, etching the thin film, and removing the photoresist. As the number of mask processes increases, manufacturing costs and time increase. In addition, the probability that problems may occur also increases, and the productivity yield decreases.

To solve the problems, 4 mask processes for manufacturing the array substrate have been proposed.

FIG. 2 is a plan view of an array substrate for an LCD device manufactured through 4 mask processes according to the related art.

In FIG. 2, gate lines 62 are formed on a substrate 60, and data lines 98 cross the gate lines 62 to define pixel regions P. A gate pad 66 is formed at one end of each gate line 62, and a data pad 99 is formed at one end of each data line 98. A gate pad electrode GP is formed on the gate pad 66 and contacts the gate pad 66. A data pad electrode DP is formed on the data pad 99 and contacts the data pad 99.

A thin film transistor T is formed at each crossing point of the gate and data lines 62 and 98. The thin film transistor T includes a gate electrode 64, a first semiconductor layer 90a, and source and drain electrodes 94 and 96. The gate electrode 64 is connected to the gate line 62. The first semiconductor layer 90a is disposed over the gate electrode 64. The source and drain electrodes 94 and 96 are formed on the first semiconductor layer 90a and are spaced apart from each other. The source electrode 94 is connected to the data line 98.

A pixel electrode PXL is formed in each pixel region P. The pixel electrode PXL is connected to the drain electrode 96 and is transparent.

A metallic layer 86 is formed over a part of each gate line 62 and is connected to the pixel electrode PXL. The metallic layer 86 has an island shape. The gate line 62 and the metallic layer 86 form a storage capacitor Cst with a gate insulating layer (not shown) interposed therebetween. The gate line 62 functions as a first electrode, the metallic layer 86 acts as a second electrode, and the gate insulating layer functions as a dielectric substance.

A second semiconductor layer 90b is formed under the data line 98, and a third semiconductor layer 90c is formed under the metallic layer 86. The second semiconductor layer 90b extends from the first semiconductor layer 90a.

In the array substrate manufactured through 4 mask processes, intrinsic amorphous silicon layers are exposed at edges of the source and drain electrodes 94 and 96 and the data line 98. Therefore, the intrinsic amorphous silicon layers are exposed to light, and photo-leakage currents are caused.

There occurs coupling with the pixel electrode PXL due to the photo-leakage currents. The coupling causes a wavy noise in a displayed image.

Descriptions will be followed with reference to FIGS. 3A and 3B.

FIGS. 3A and 3B are cross-sectional views of an array substrate according to the related art and correspond to the line II-II and the line V-V of FIG. 2, respectively.

In FIGS. 3A and 3B, when the array substrate is manufactured through 4 mask processes, a first semiconductor layer 90a is formed under source and drain electrodes 94 and 96, and a second semiconductor layer 90b is formed under the data line 98. Each of the first and second semiconductor layers 90a and 90b includes an intrinsic amorphous silicon layer (a-Si:H) and an impurity-doped amorphous silicon layer (for example, n+ a-Si:H). The intrinsic amorphous silicon layer of the first semiconductor layer 90a is referred to as an active layer 92a, and the impurity-doped amorphous silicon layer of the first semiconductor layer 90a is referred to as an ohmic contact layer 92b. The intrinsic amorphous silicon layer 70 of the second semiconductor layer 90b is exposed at both sides of the data line 82. That is, the intrinsic amorphous silicon layer 70 of the second semiconductor layer 90b is exposed to a light source (not shown), and photo-leakage currents are caused in the intrinsic amorphous silicon layer 70 of the second semiconductor layer 90b. The intrinsic amorphous silicon layer 70 is repeatedly activated and inactivated according to subtly flickering of the light source, and the photo-leakage currents changes due to this. The photo-leakage currents are coupled with signals of the pixel electrode PXL, and liquid crystal molecules over the pixel electrode PXL are distorted. A wavy noise that wavy lines are shown on the displayed image occurs. Moreover, the photo-leakage currents in the active layer 92a cause problems in operations of the thin film transistor T.

Meanwhile, the intrinsic amorphous silicon layer 70 of the second semiconductor layer 90b has a protruded part with a width of about 1.7 μm beyond each side of the data line 98. Generally, the data line 98 and the pixel electrode PXL have a distance of about 4.75 μm therebetween considering the alignment margin. However, the distance "d" between the data line 98 and the pixel electrode PXL should be about 6.45 μm because of the protruded part. The pixel electrode PXL becomes more distant from the data line 98 by the width of the protruded part of the intrinsic amorphous silicon layer 70, and a black matrix BM covering an area between the data line 98 and the pixel electrode PXL should have a wider width W1. Accordingly, the aperture area decreases.

As stated above, the formation and structure of the second semiconductor layer 90 under the data line 98 are due to 4 mask processes. Hereinafter, 4 mask processes will be described with reference to accompanying drawings.

FIGS. 4A to 4G, FIGS. 5A to 5G and FIGS. 6A to 6G are cross-sectional views of an array substrate in processes of manufacturing the same according to the related art. FIGS. 4A to 4G correspond to the line II-II of FIG. 2, FIGS. 5A to 5G correspond to the line III-III of FIG. 2, and FIGS. 6A to 6G correspond to the line IV-IV of FIG. 2.

FIG. 4A, FIG. 5A and FIG. 6A show the array substrate in a first mask process. In FIG. 4A, FIG. 5A and FIG. 6A, a switching region S, a pixel region P, a gate region G, a data region D, and a storage region C are defined on a substrate 60. The pixel region P includes the switching region S. The gate region G includes the storage region C.

A gate line 62, a gate pad 66, and a gate electrode 64 are formed on the substrate 60 including the regions S, P, G, D and C. The gate pad 66 is formed at one end of the gate line 62.

The gate electrode 64 is connected to the gate line 62 and is disposed in the switching region S. The gate line 62, the gate pad 66 and the gate electrode 64 are formed by depositing one or more selected from a conductive metallic group including aluminum (Al), aluminum alloy (AlNd), tungsten (W), chromium (Cr) and molybdenum (Mo). The gate line 62, the gate pad 66 and the gate electrode 64 may be a single layer of the above-mentioned metallic material or may be a double layer of aluminum (Al)/chromium (Cr) or aluminum (Al)/molybdenum (Mo).

FIGS. 4B to 4E, FIGS. 5B to 5E and FIGS. 6B to 6E show a second mask process.

In FIG. 4B, FIG. 5B and FIG. 6B, a gate insulating layer 68, an intrinsic amorphous silicon layer (a-Si:H) 70, an impurity-doped amorphous silicon layer (n+ or p+ a-Si:H) 72 and a conductive metallic layer 74 are formed substantially on an entire surface of the substrate 70 including the gate line 62, the gate pad 66 and the gate electrode 64.

The gate insulating layer 68 is formed of an inorganic insulating material including silicon nitride ($SiN_x$) and silicon oxide ($SiO_2$) or an organic insulating material including benzocyclobutene (BCB) and acrylic resin. The conductive metallic layer 74 is formed of one or more selected from the above-stated conductive metallic group.

A photoresist layer 76 is formed by coating an entire surface of the substrate 60 including the conductive metallic layer 74 with photoresist. A mask M is disposed over the photoresist layer 76. The mask M includes a light-transmitting portion B1, a light-blocking portion B2, and a light-half transmitting portion B3. The light-transmitting portion B1 transmits substantially all light, and the photoresist layer 76 is entirely exposed to the light to thereby chemically change. The light-blocking portion B2 completely blocks the light. The light-half transmitting portion B3 includes slits or a half transparent layer to decrease the intensity of light or transmittance of the light. Thus, the photoresist layer is partially exposed to light therethrough.

The light-half transmitting portion B3 is disposed over the gate electrode 64 in the switching region S. The light-blocking portion B2 is disposed in the storage region C, in the switching region S and in the data region D. In the switching region S, the light-blocking portion B2 is disposed at both sides of the light-half transmitting portion B3. The light-transmitting portion B1 is disposed in other regions.

The photoresist layer 76 is exposed to light through the mask M and then is developed.

In FIG. 4C, FIG. 5C and FIG. 6C, first, second and third photoresist patterns 78a, 78b and 78c are formed in the switching region S, the data region D and the storage region C, and the conductive metallic layer 74 is partially exposed. Next, the exposed conductive metallic layer 74, the impurity-doped amorphous silicon layer 72 thereunder, and the intrinsic amorphous silicon layer 70 are removed. The conductive metallic layer 74 may be removed simultaneously with the under layers 72 and 70. Or the conductive metallic layer 74 may be wet-etched, and then the impurity-doped amorphous silicon layer 72 and the intrinsic amorphous silicon layer 70 may be dry-etched.

In FIG. 4D, FIG. 5D and FIG. 6D, a first metallic pattern 80, a second metallic pattern 82, and a third metallic pattern 86 are formed under the first, second and third photoresist patterns 78a, 78b and 78c, respectively. The second metallic pattern 82 extends from the first metallic pattern 80 along a side of the pixel region P. The third metallic pattern 86 corresponds to the storage region C and has an island shape. A first semiconductor pattern 90a, a second semiconductor pattern 90b, and a third semiconductor pattern 90c are formed under the first metallic pattern 80, the second metallic pattern 82 and the third metallic pattern 86, respectively. Each of the first, second and third semiconductor patterns 90a, 90b and 90c includes the intrinsic amorphous silicon layer 70 and the impurity-doped amorphous silicon layer 72.

Next, an ashing process is performed to remove a part of the first photoresist pattern 78a corresponding to the gate electrode 64, and the first metallic pattern 80 is exposed. At this time, other parts of the first photoresist pattern 78a, the second photoresist pattern 78b, and the third photoresist pattern 78c are partially removed. The thicknesses of the first, second and third photoresist patterns 78a, 78b and 78c are decreased, and the first, second and third metallic patterns 80, 82 and 86 are partially exposed at peripheries of the first, second and third photoresist patterns 78a, 78b and 78c.

In FIG. 4E, FIG. 5E and FIG. 6E, the exposed first metallic pattern 80 and the impurity-doped amorphous silicon layer 72 of the first semiconductor layer 90a of FIG. 4D are removed, and a source electrode 94, a drain electrode 96 and an ohmic contact layer 92b are formed. The intrinsic amorphous silicon layer of the first semiconductor layer 90a functions as an active layer 92a.

Here, when the impurity-doped amorphous silicon layer 72 of the first semiconductor layer 90a of FIG. 4D is removed, the intrinsic amorphous silicon layer, that is, the active layer 92a is over-etched so that particles may not remain on the surface of the active layer 92a.

The second metallic pattern 82 of FIG. 6D, which contacts the source electrode 94, becomes a data line 98, and one end of the data line 98 becomes a data pad 99. The third metallic pattern 86 of an island shape and the gate line 62 in the storage region C function as electrodes for a capacitor. The gate line 62 acts as a first electrode, and the third metallic pattern 86 functions as a second electrode. The gate line 62, the gate insulating layer 68, the third semiconductor pattern 90c and the third metallic pattern 86 constitute a storage capacitor Cst.

Next, the photoresist patterns 78a, 78b and 78c are removed.

FIG. 4F, FIG. 5F and FIG. 6F show a third mask process. In FIG. 4F, FIG. 5F and FIG. 6F, a passivation layer PAS is formed substantially on an entire surface of the substrate 60 including the source and drain electrodes 94 and 96, the data line 98 including the data pad 99, and the storage capacitor Cst. The passivation layer PAS may be formed by depositing one selected from an inorganic insulating material group including silicon nitride (SiNx) and silicon oxide (SiO2) or by coating the substrate 60 with one selected from an organic insulating material group including benzocyclobutene (BCB) and acrylic resin.

Subsequently, the passivation layer PAS is patterned to thereby form a drain contact hole CH1, a storage contact hole CH2, a gate pad contact hole CH3 and a data pad contact hole CH4. The drain contact hole CH1 partially exposes the drain electrode 96, the storage contact hole CH2 exposes the third metallic pattern 86, the gate pad contact hole CH3 partially exposes the gate pad 66, and the data pad contact hole CH4 partially exposes the data pad 99.

FIG. 4G, FIG. 5G and FIG. 6G show a fourth mask process. In FIG. 4G, FIG. 5G and FIG. 6G, a pixel electrode PXL, a gate pad electrode GP and a data pad electrode DP are formed on the substrate 60 including the passivation layer PAS by depositing one selected from a transparent conductive metallic group including indium tin oxide (ITO) and indium zinc oxide (IZO) and then patterning it. The pixel electrode PXL contacts the drain electrode 96 and the third metallic pattern 86. The gate pad electrode GP contacts the gate pad 66, and the data pad electrode DP contacts the data pad 99.

The array substrate for a liquid crystal display device may be manufactured through the above-mentioned 4 mask processes. The manufacturing costs and time can be reduced due to the 4 mask processes, and the probability that problems may occur also decreases.

However, in the array substrate manufactured through 4 mask processes, the semiconductor layer is exposed at both sides of the data line. The exposed semiconductor layer is affected by light to cause wavy noise on displayed images. In addition, the aperture ratio decreases due to the semiconductor layer.

Meanwhile, photo-leakage currents may be caused in the active layer of the thin film transistor, and the thin film transistor may operate improperly.

SUMMARY

In a first aspect, an array substrate for a liquid crystal display device includes a substrate, a gate line on the substrate, a data line crossing the gate line to define a pixel region, a thin film transistor connected to the gate line and the data line and including a gate electrode, an active layer, an ohmic contact layer, a buffer metallic layer, a source electrode and a drain electrode, and a pixel electrode in the pixel region and connected to the thin film transistor. The data line includes a transparent conductive layer and an opaque conductive layer, and each of the source and drain electrodes and the pixel electrode includes a transparent conductive layer.

In a second aspect, a method of manufacturing an array substrate for a liquid crystal display device includes using a first mask process and forming a gate electrode and a gate line on a substrate; using a second mask process and forming an active layer, an ohmic contact layer and a buffer metallic layer over the gate electrode; using a third mask process and forming a source electrode, a drain electrode, a pixel electrode and a data line on the substrate including the active layer, the ohmic contact layer and the buffer metallic layer, the data line including a transparent conductive layer and an opaque conductive layer, each of the source electrode, the drain electrode and the pixel electrode including a transparent conductive layer; and using a fourth mask process and forming a first insulating layer covering the source and drain electrodes, the data line and the pixel electrode.

In a third aspect, an array substrate for a liquid crystal display device includes a substrate, a gate line on the substrate, a data line crossing the gate line to define a pixel region, a thin film transistor connected to the gate line and the data line and including a gate electrode, an active layer, an ohmic contact layer, a buffer metallic layer, a source electrode and a drain electrode, pixel electrodes in the pixel region and connected to the thin film transistor, and common electrodes in the pixel region and alternating with the pixel electrodes. The data line includes a transparent conductive layer and an opaque conductive layer, and each of the source and drain electrodes includes a transparent conductive layer.

In a fourth aspect, a method of manufacturing method of an array substrate for a liquid crystal display device includes using a first mask process and forming a gate electrode and a gate line on a substrate; using a second mask process and forming an active layer, an ohmic contact layer and a buffer metallic layer over the gate electrode; using a third mask process and forming a source electrode, a drain electrode, pixel electrodes, common electrodes and a data line, the data line including a transparent conductive layer and an opaque conductive layer, each of the source electrode and the drain electrode including a transparent conductive layer; and using a fourth mask process and forming a first insulating layer covering the source and drain electrodes, the data line, the pixel electrodes and the common electrodes.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this specification, illustrate embodiments of the disclosure and together with the description serve to explain the principles of the disclosure. In the drawings:

FIGS. 9A to 9K, FIGS. 10A to 10K, and FIGS. 11A to 11K are cross-sectional views of an array substrate in processes of manufacturing the same according to the first embodiment of the present invention;

FIGS. 15A, 15B, 15C and 15D are cross-sectional views of an array substrate according to the third embodiment of the present invention;

FIGS. 16A to 16L, FIGS. 17A to 17L, FIGS. 18A to 18L, and FIGS. 19A to 19L are cross-sectional views of an array substrate in processes of manufacturing the same according to the third embodiment of the present invention;

DETAILED DESCRIPTION

Reference will now be made in detail to the embodiments of the present disclosure, examples of which are illustrated in the accompanying drawings.

In the present invention, an array substrate is manufactured through 4 mask processes in which an active layer is formed over and within a gate electrode, and source and drain electrodes are formed of a transparent conductive material.

Figure 1:
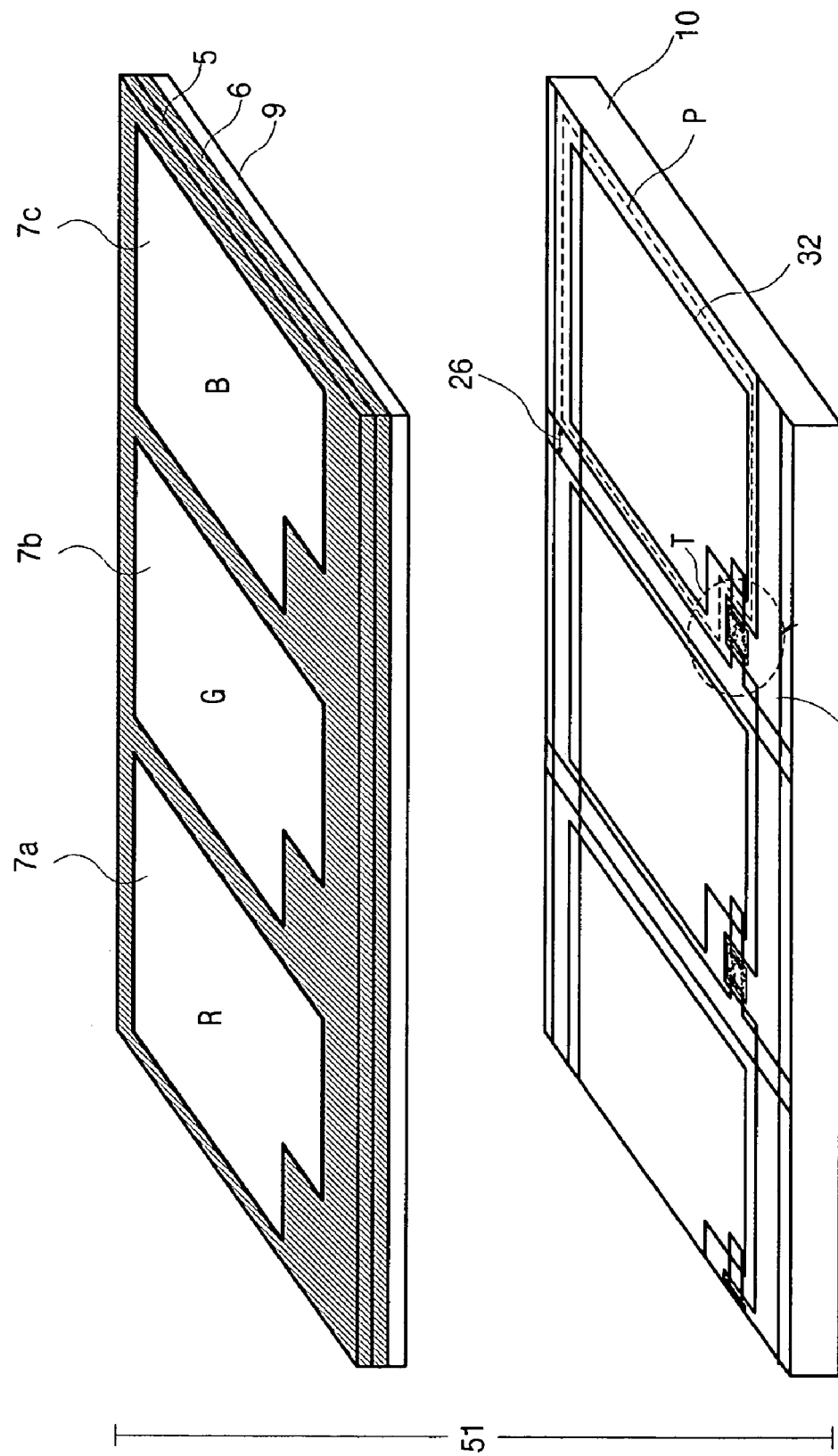
FIG. 1 is a schematic perspective view of an LCD device according to the related art.
Figure 2:
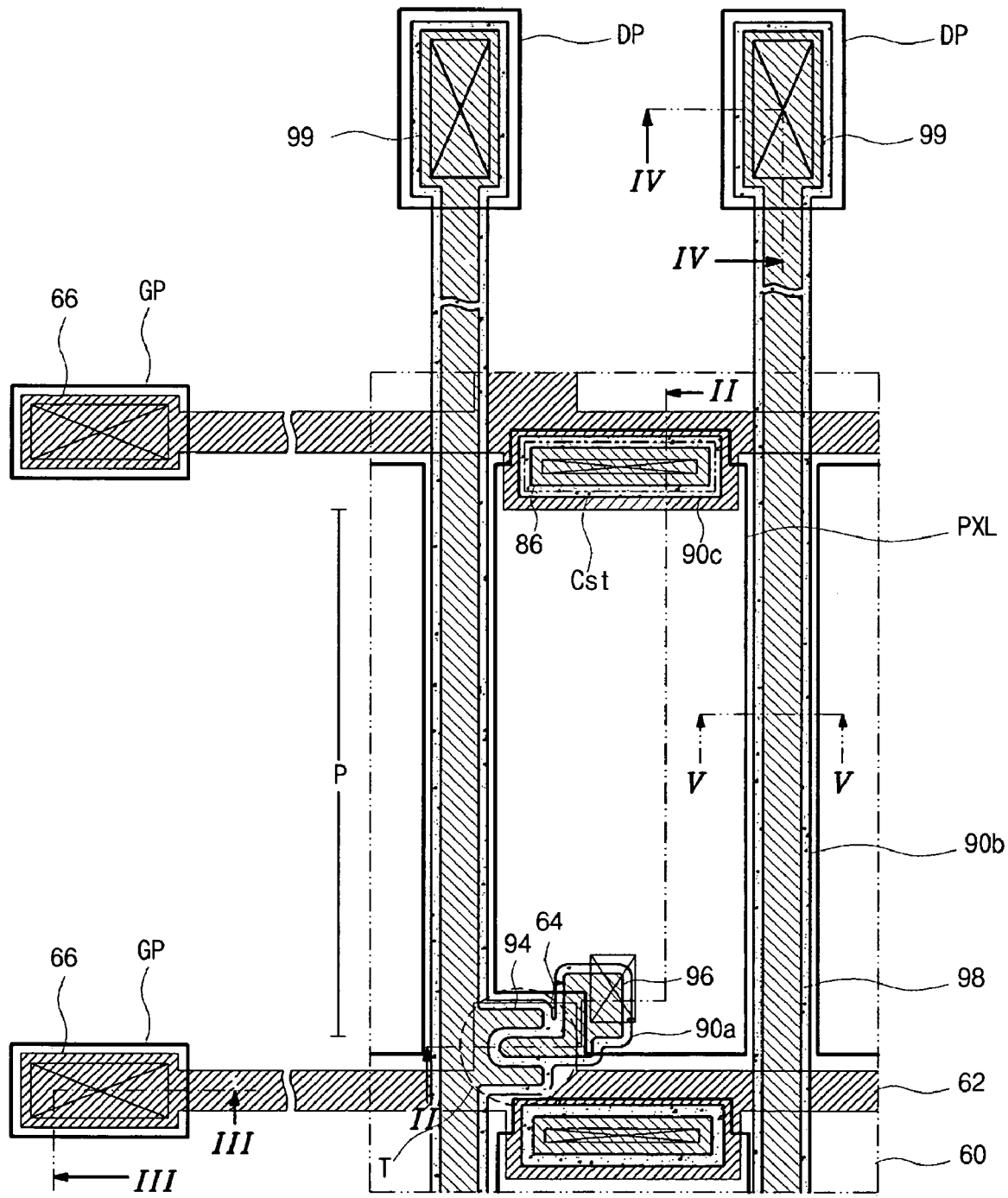
FIG. 2 is a plan view of an array substrate for an LCD device manufactured through 4 mask processes according to the related art.
Figure 3A:
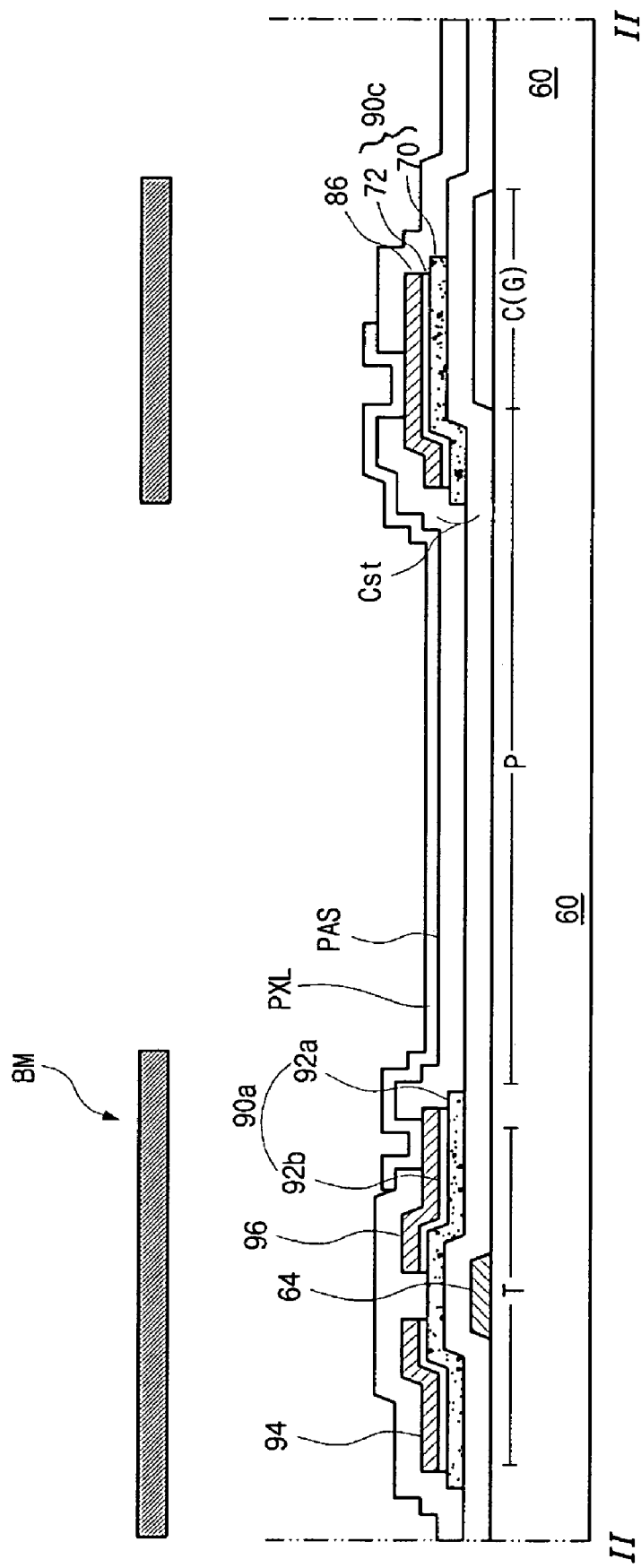
FIGS. 3A and 3B are cross-sectional views of an array substrate according to the related art.
Figure 3B:
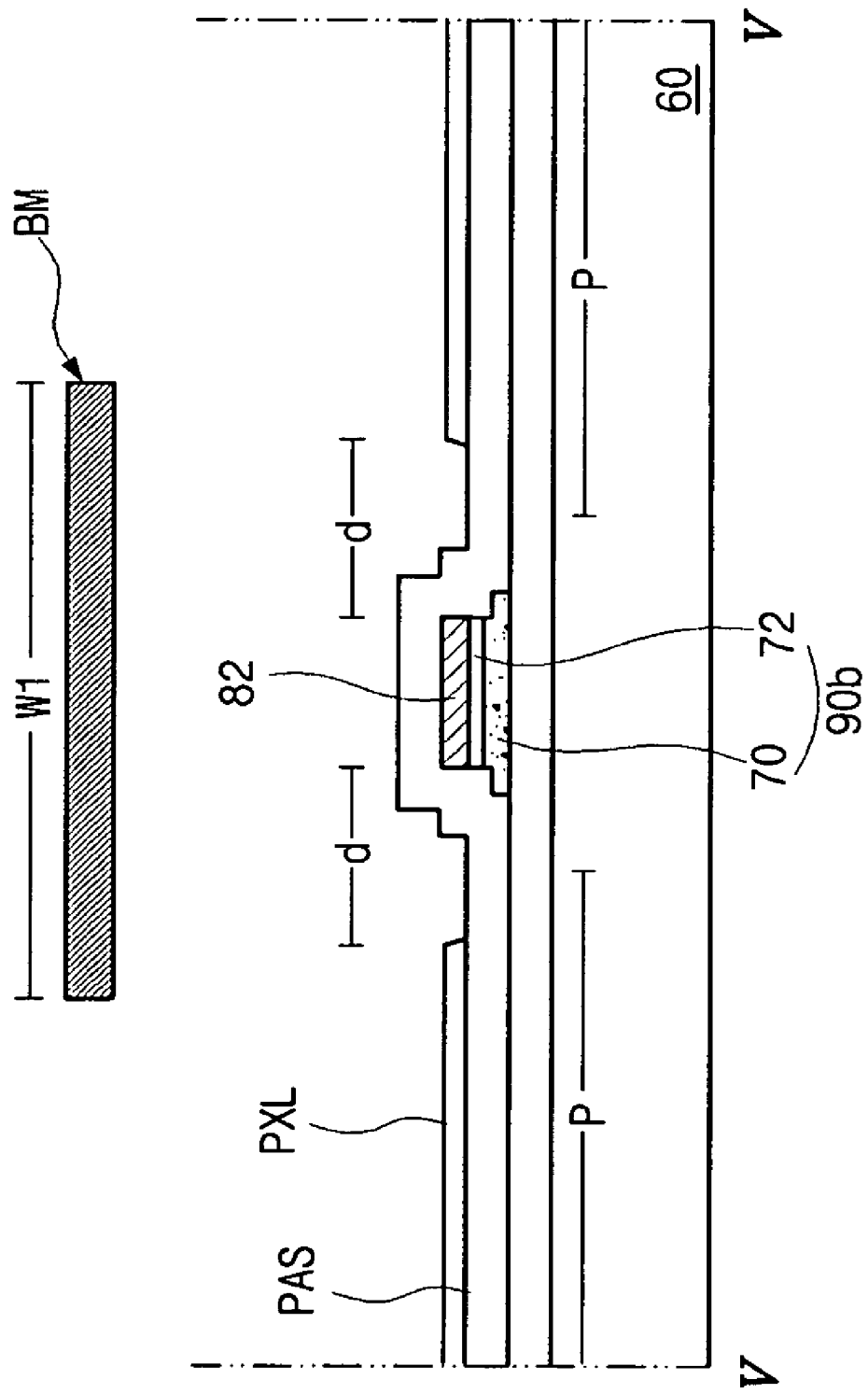
Figure 4A:
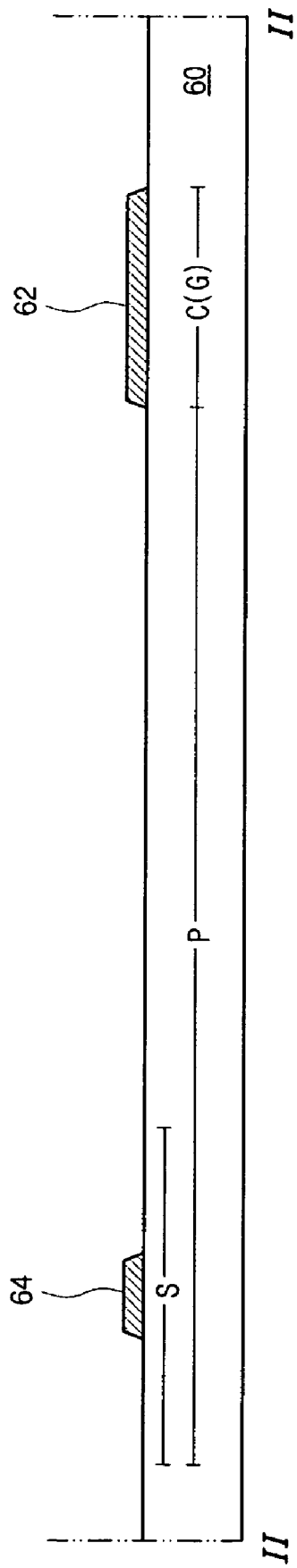
FIGS. 4A to 4G, FIGS. 5A to 5G and FIGS. 6A to 6G are cross-sectional views of an array substrate in processes of manufacturing the same according to the related art.
Figure 4B:
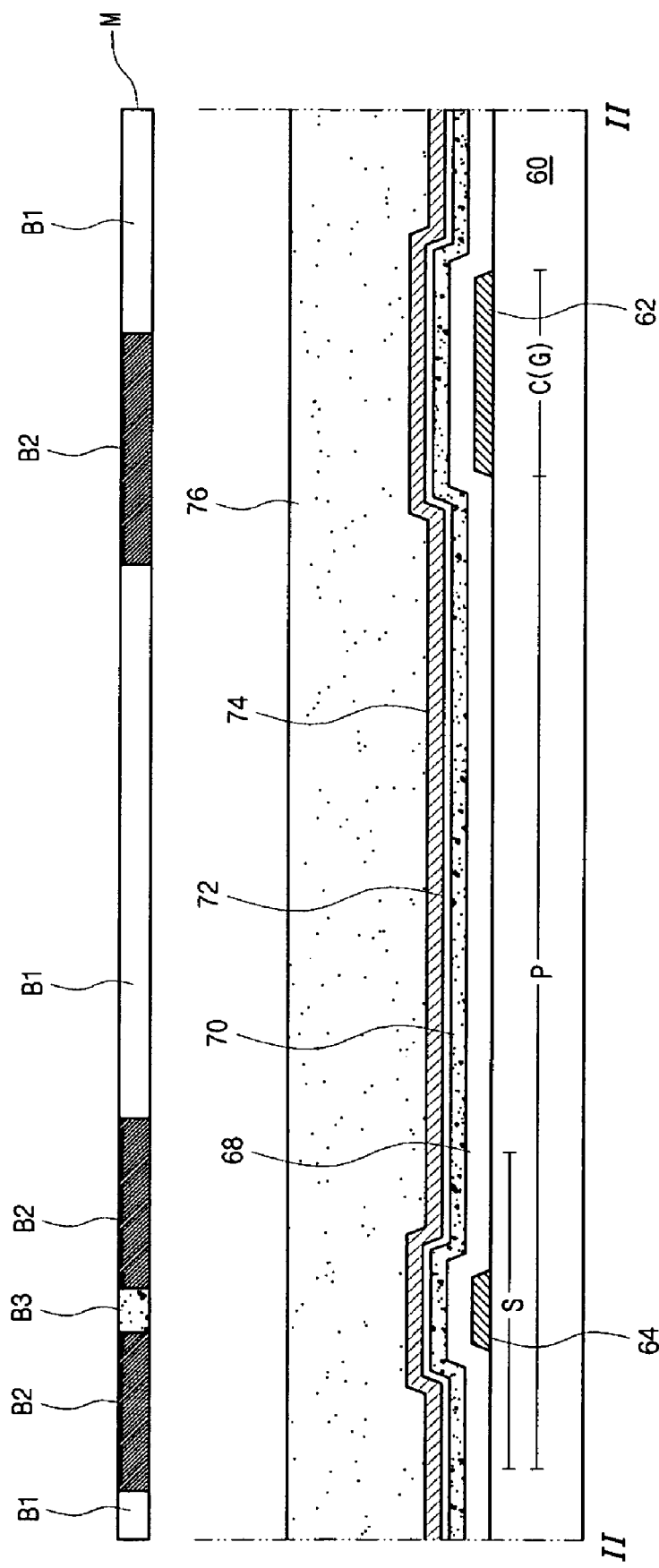
Figure 4C:
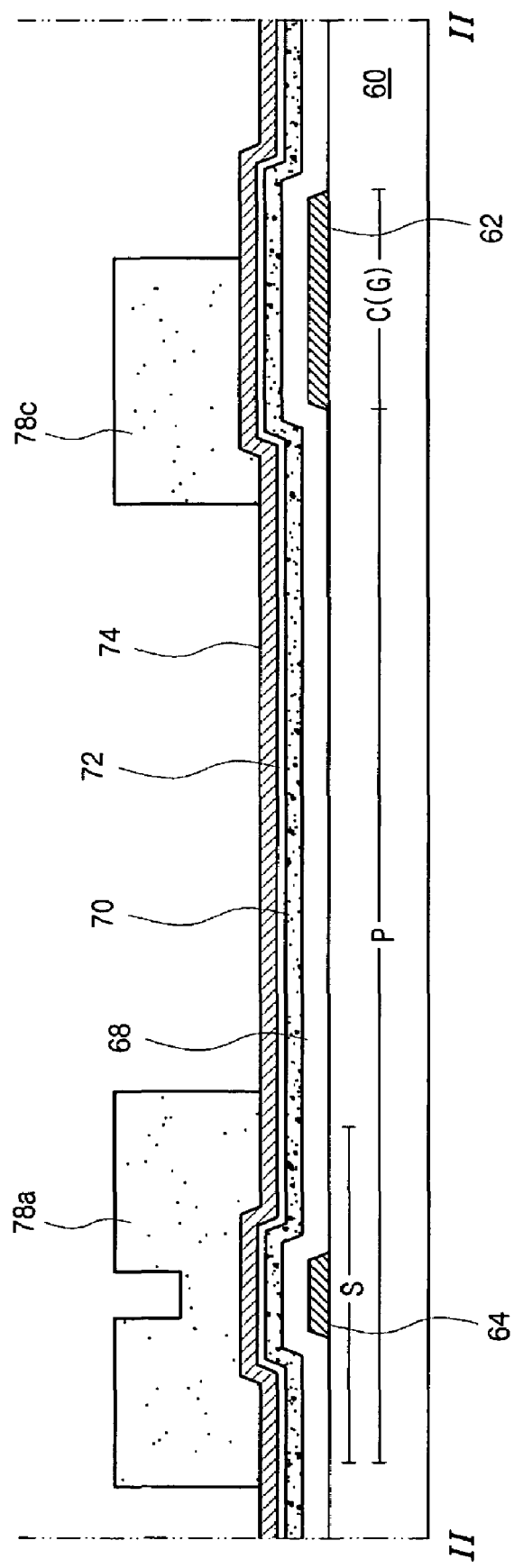
Figure 4D:
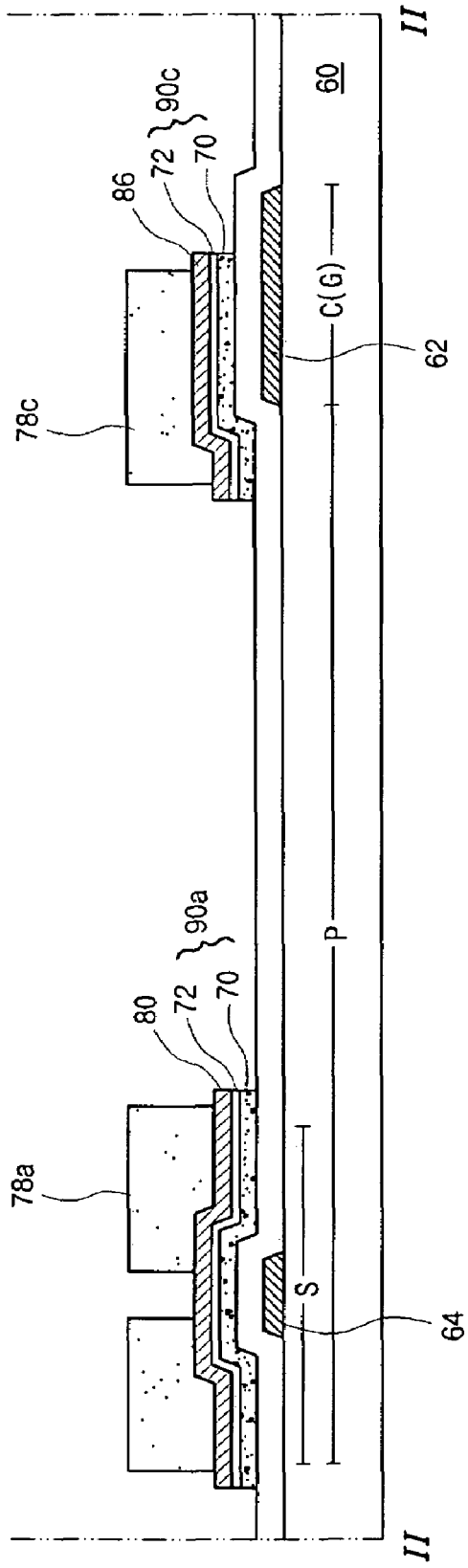
Figure 4E:
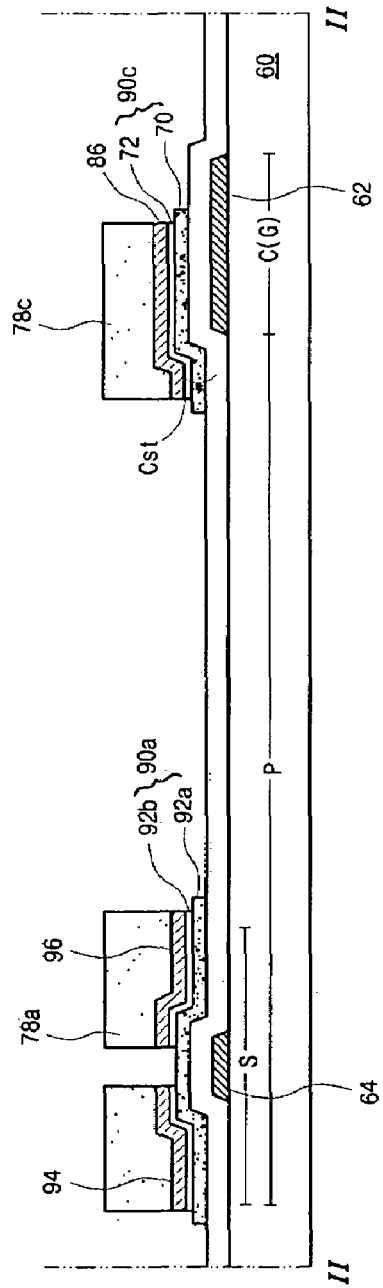
Figure 4F:
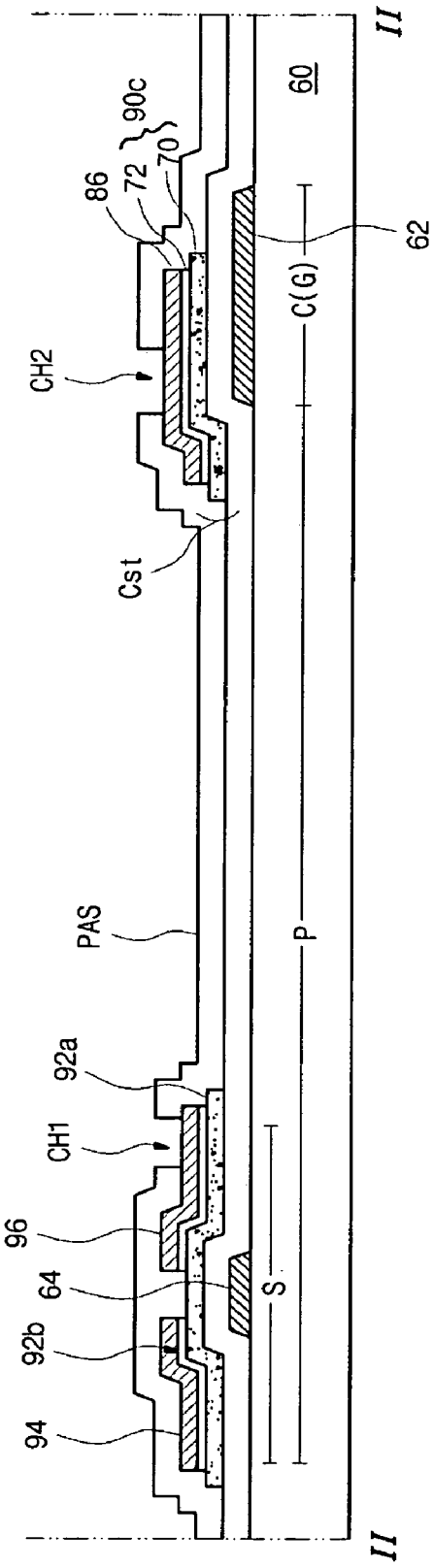
Figure 4G:
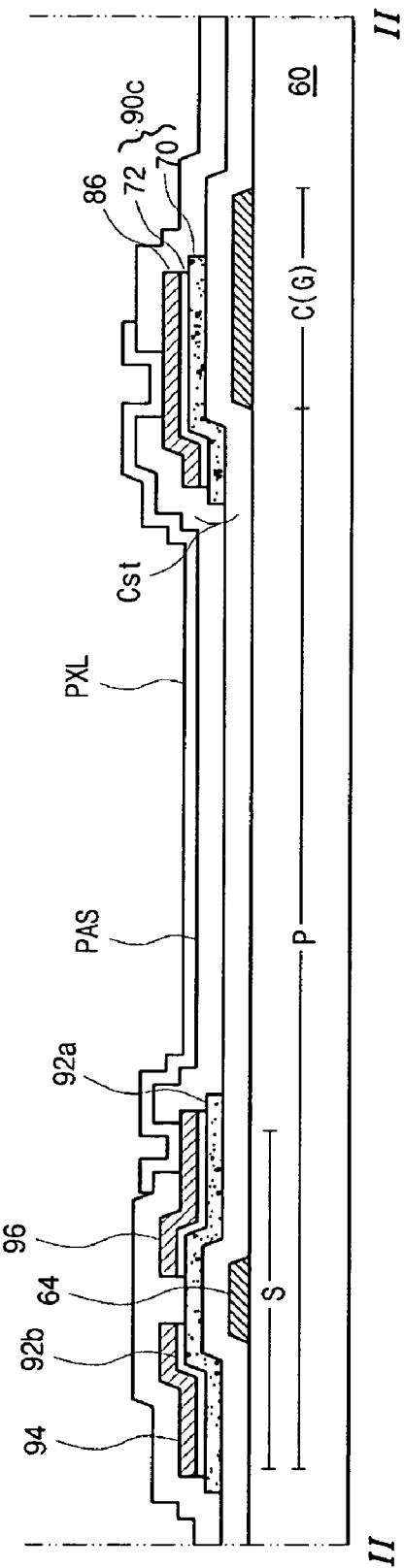
Figure 5A:
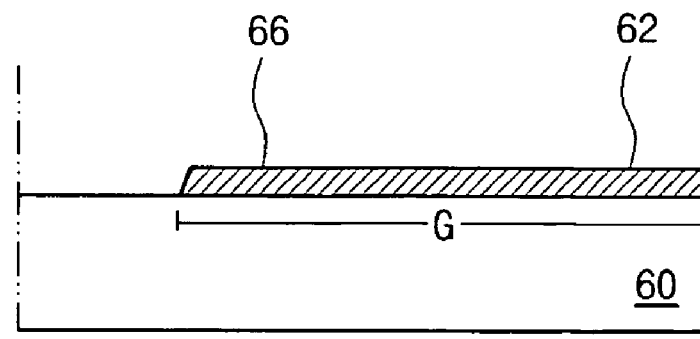
Figure 5B:
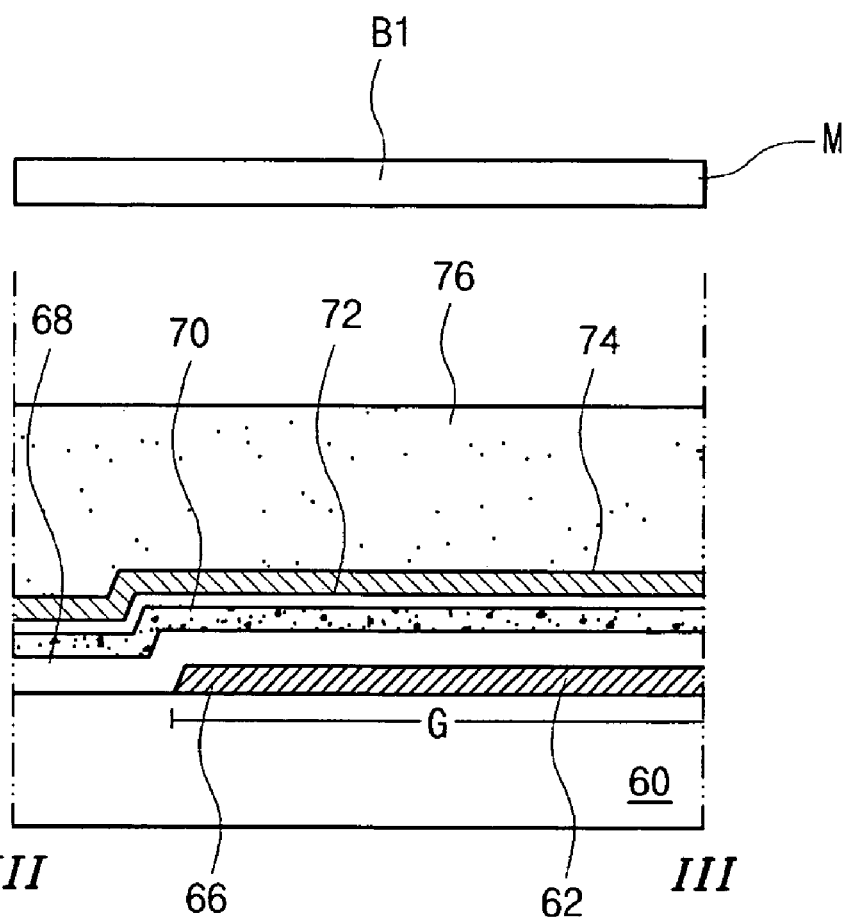
Figure 5C:
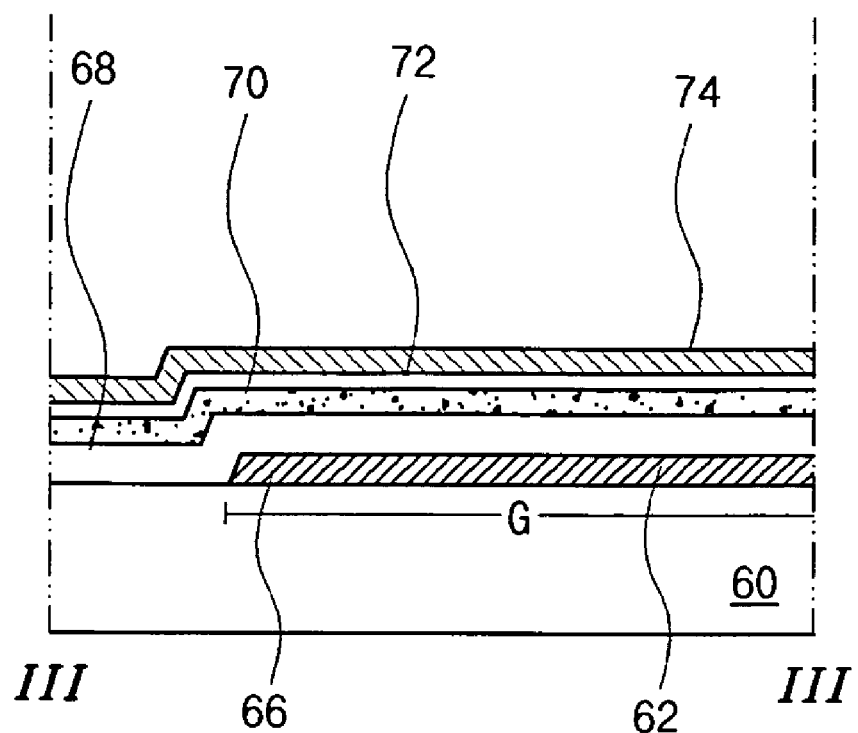
Figure 5D:
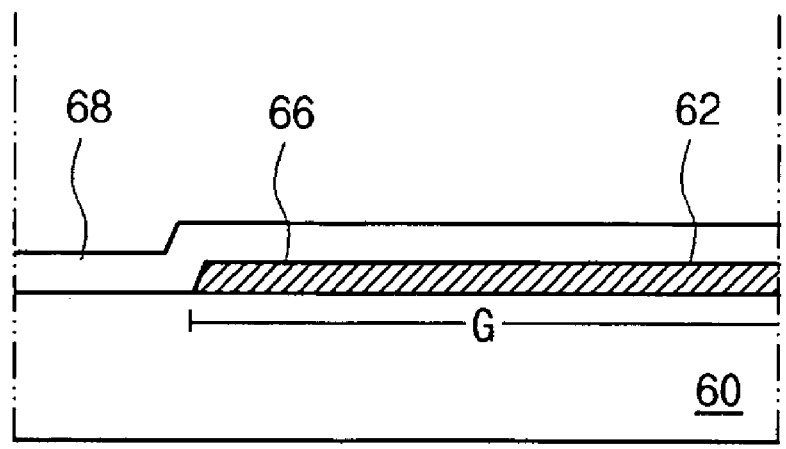
Figure 5E:
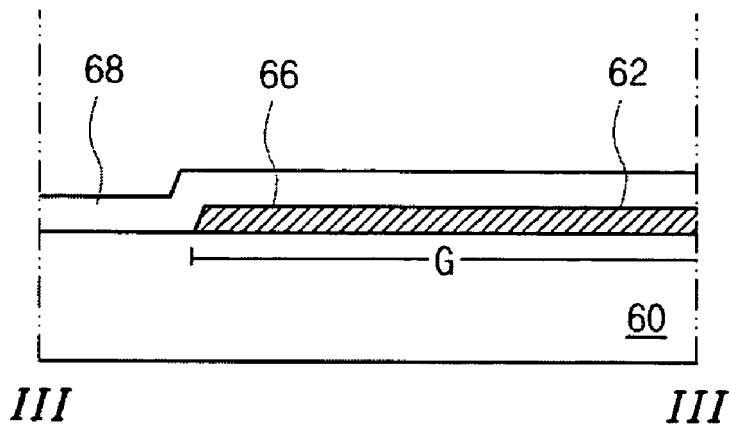
Figure 5F:
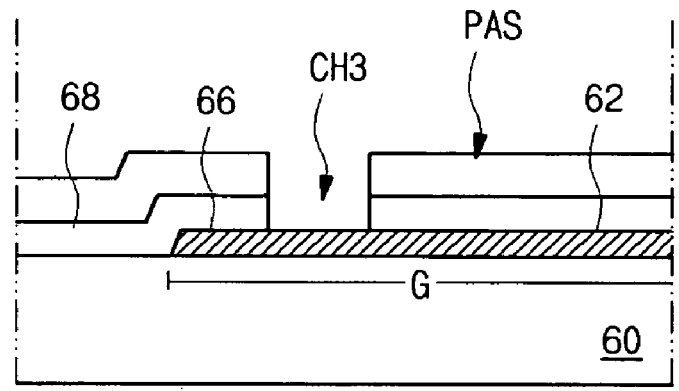
Figure 5G:
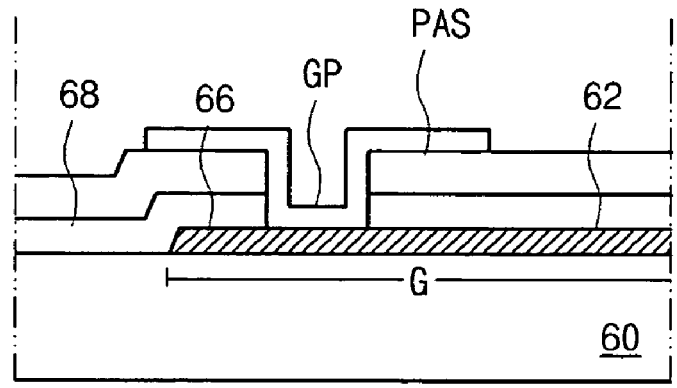
Figure 6A:
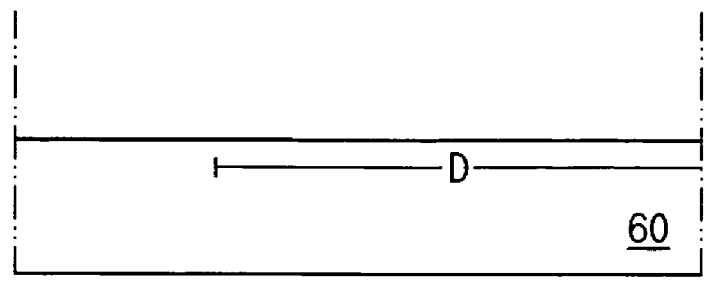
Figure 6B:
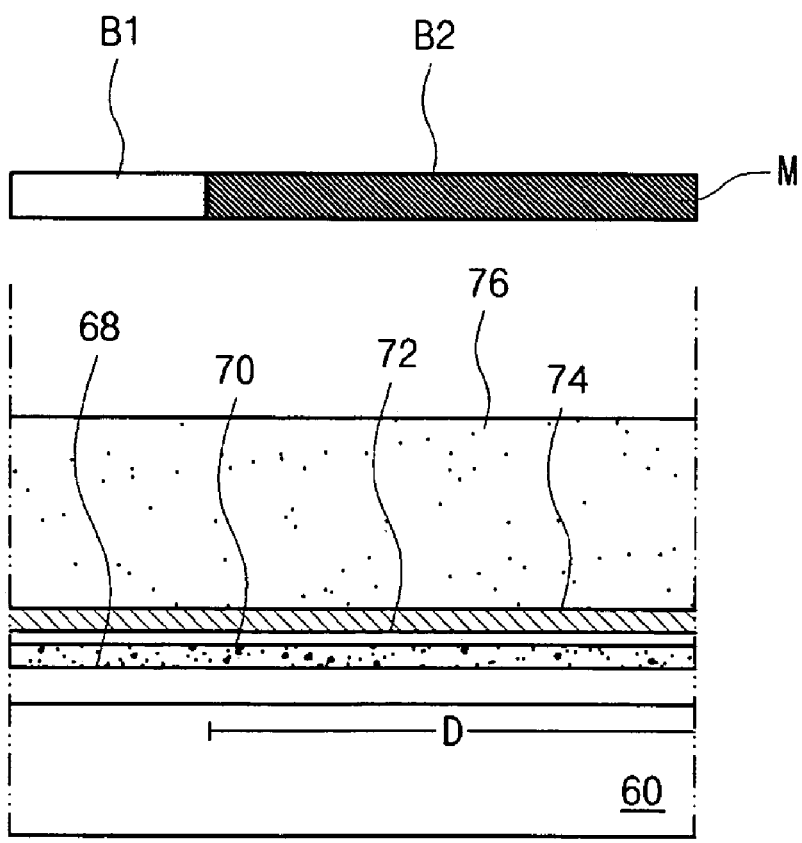
Figure 6C:
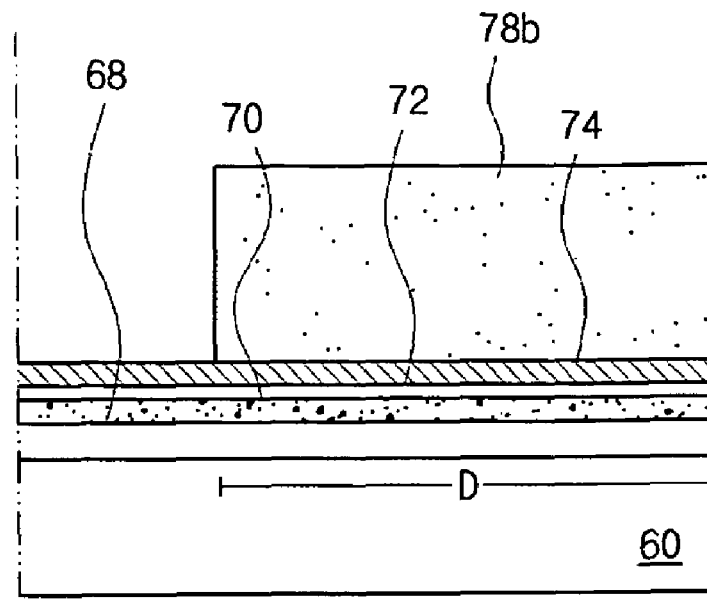
Figure 6D:
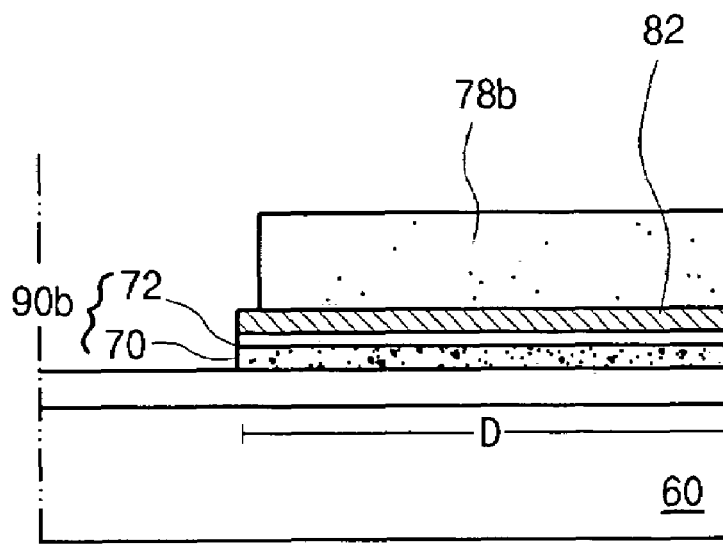
Figure 6E:
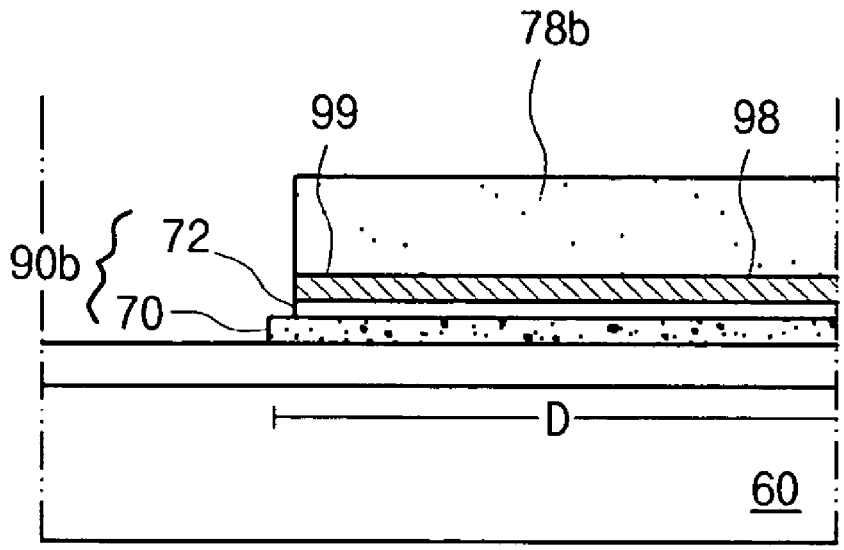
Figure 6F:
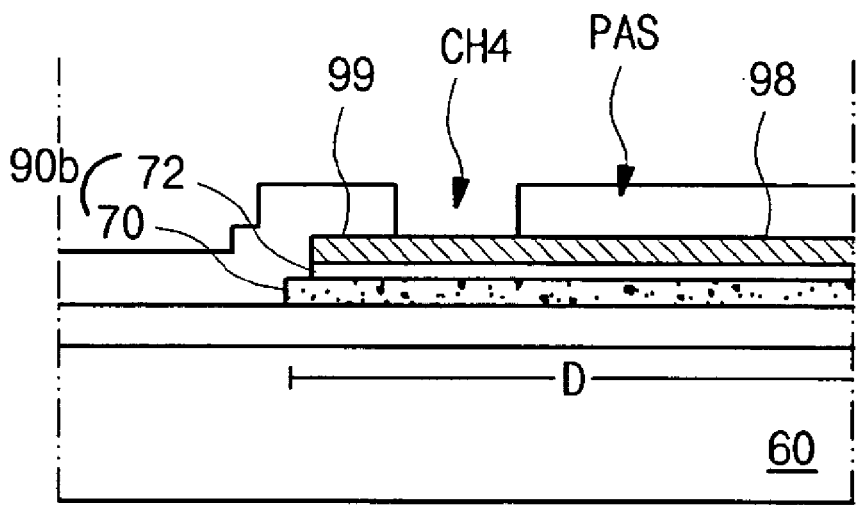
Figure 6G:
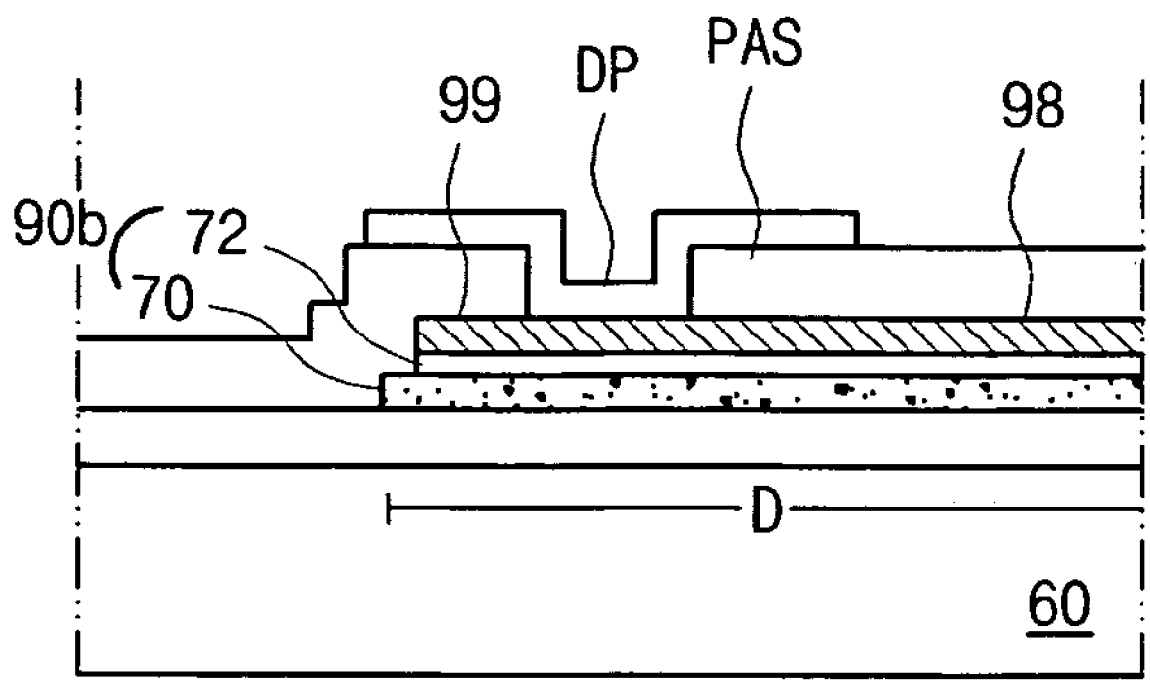
Figure 7:
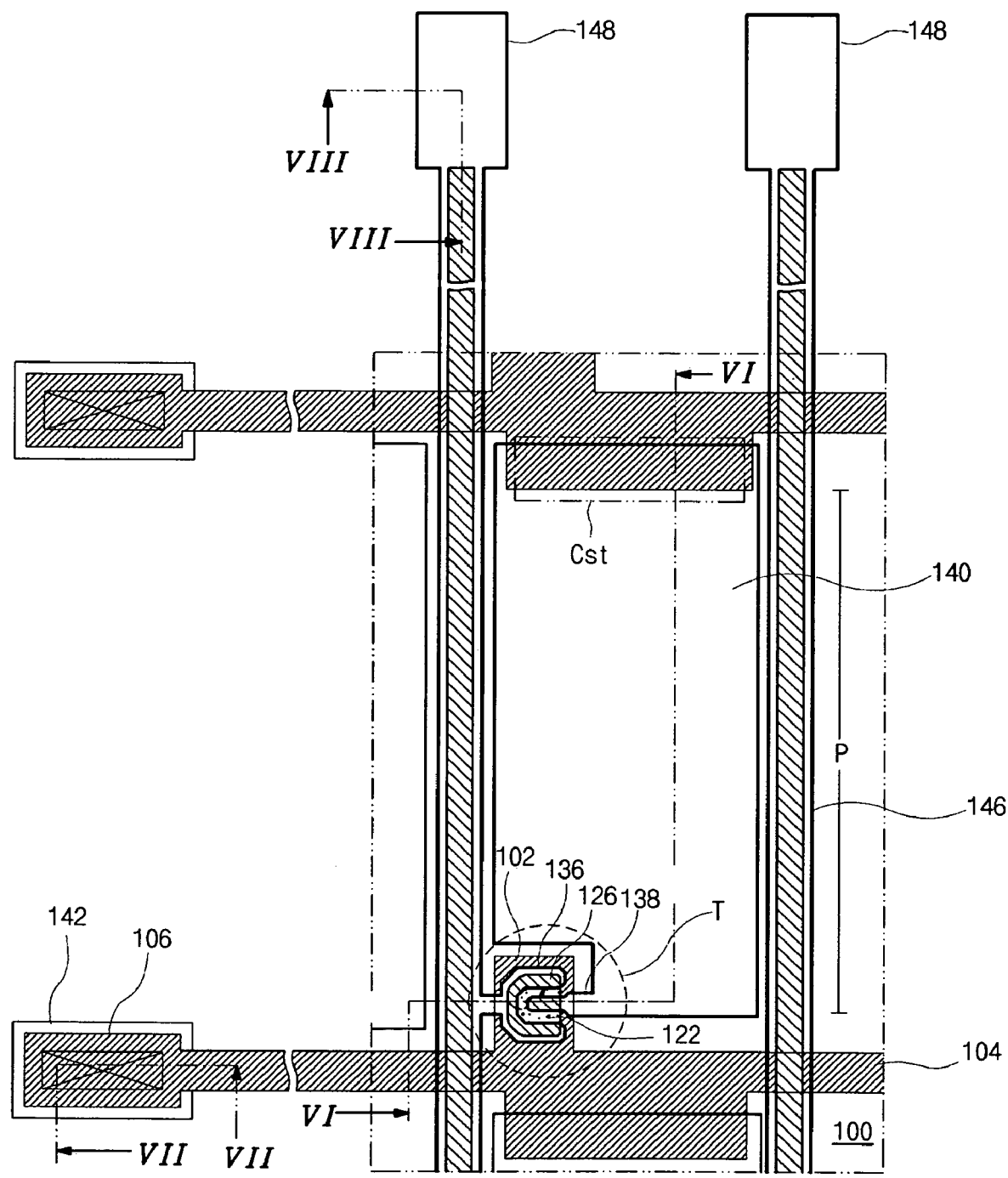
FIG. 7 is a plan view of an array substrate for an LCD device according to a first embodiment of the present invention.

FIG. 7 is a plan view of an array substrate for a liquid crystal display (LCD) device according to a first embodiment of the present invention. In FIG. 7, a gate line 104 is formed on an insulating substrate 100 along a first direction, and a data line 146 is formed along a second direction. The gate line 104 and the data line 146 cross each other to define a pixel region P. A gate pad 106 is formed at one end of the gate line 104, and a data pad 148 is formed at one end of the data line 146. A gate pad electrode 142 is formed one the gate pad 106, and the gate pad electrode 142 is transparent.

A thin film transistor T is formed at a crossing point of the gate line 104 and the data line 146. The thin film transistor T includes a gate electrode 102, an active layer 122, an ohmic contact layer (not shown), a buffer metallic layer 126, a source electrode 136 and a drain electrode 138. The buffer metallic layer 126 contacts the ohmic contact layer and the source and drain electrodes 136 and 138. The source and drain electrodes 136 and 138 are transparent. A part of the active layer 122 is exposed between the source and drain electrodes 136 and 138, and the exposed part of the active layer 122 functions as a channel of the thin film transistor T. To increase a drain current by increasing a width of the channel and decrease a length of the channel, the source electrode 136 has a U-shape, and the drain electrode 138 has a rod-shape. The drain electrode 138 is spaced apart from the source electrode 136, and one end of the drain electrode 138 is surrounded by the source electrode 136.

A pixel electrode 140 is formed in the pixel region P and is connected to the drain electrode 138. The pixel electrode 140 is transparent. The pixel electrode 140 extends over the gate line 104. The pixel electrode 140 overlaps the gate line 104 to form a storage capacitor Cst, wherein the gate line 104 acts as a first electrode and the pixel electrode 140 functions as a second electrode.

The array substrate of FIG. 7 is manufactured through 4 mask processes. Here, the active layer 122 is formed over and within the gate electrode 102, and there is no semiconductor layer under the data line 146.

Figure 8A:
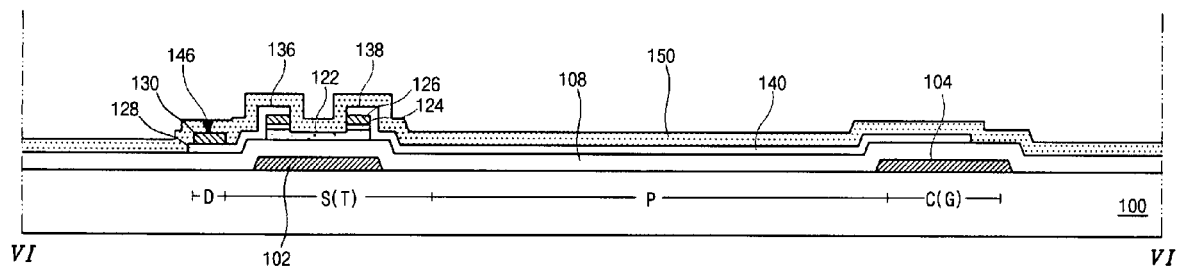
FIGS. 8A, 8B and 8C are cross-sectional views of an array substrate according to the first embodiment of the present invention.
Figure 8B:
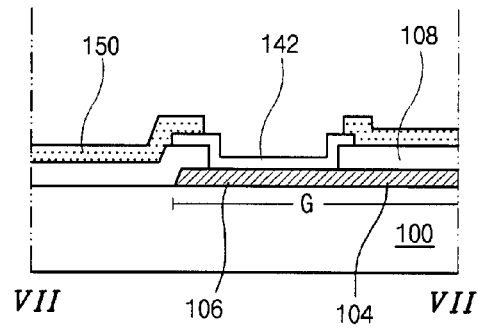
Figure 8C:
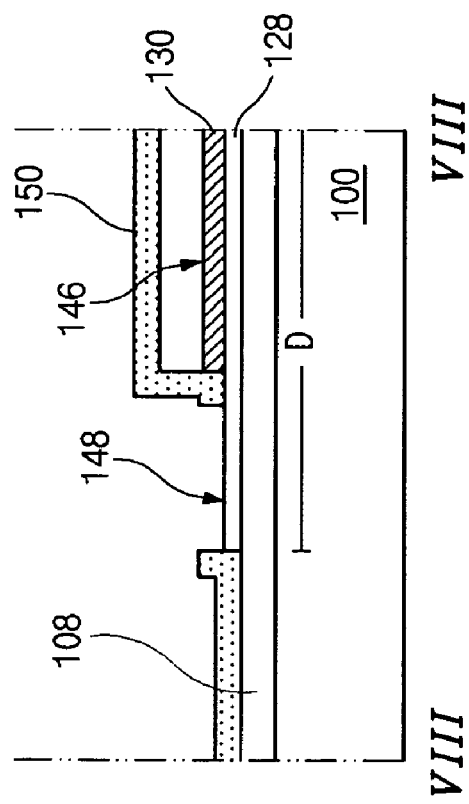

FIGS. 8A, 8B and 8C are cross-sectional views of an array substrate according to the first embodiment of the present invention. FIGS. 8A, 8B and 8C correspond to the line VI-VI, the line VII-VII, and the line VIII-VIII of FIG. 7, respectively. FIG. 8A shows a switching region and a pixel region, FIG. 8B shows a gate region including a gate line and a gate pad, and FIG. 8C shows a data region including a data line and a data pad.

In FIGS. 8A, 8B and 8C, a pixel region P, a gate region G, a data region D, a storage region C, and a switching region S are defined on a substrate 100. The gate region G includes the storage region C. The switching region S is next to the pixel region P.

A thin film transistor T is formed in the switching region S on the substrate 100. The thin film transistor T includes a gate electrode 102, a first insulating layer 108, an active layer 122, an ohmic contact layer 124, a buffer metallic layer 126, and source and drain electrodes 136 and 138 that are sequentially formed. The source and drain electrodes 136 and 138 include a transparent conductive layer. The buffer metallic layer 126 decreases contact resistance between the ohmic contact layer 124 and each transparent conductive layer of the source and drain electrodes 136 and 138.

A data line 146 is formed along a side of the pixel region P. The data line 146 is connected to the source electrode 136. The data line 146 includes a transparent conductive layer 128 and an opaque conductive layer 130. A data pad 148 is formed at one end of the data line 146. The data pad 148 includes a transparent conductive layer 128.

A gate line 104 is formed along another side of the pixel region P. The gate line 104 is connected to the gate electrode 102. Although not shown in the figures, the gate line 104 crosses the data line 146. A gate pad 106 is formed at one end of the gate line 104. A gate pad electrode 142 is formed on the gate pad 106. The gate pad electrode 142 is formed of a transparent conductive material.

Here, the active layer 122 and the ohmic contact layer 124 are formed over and within the gate electrode 102, and there are no intrinsic amorphous silicon layer and impurity-doped amorphous silicon layer under the data line 146. Therefore, the wavy noise does not occur, and the aperture ratio is prevented from decreasing.

Moreover, since the source and drain electrodes 136 and 138 are transparent, the source and drain electrodes 136 and 138 do not reflect light from a backlight at a rear side of the substrate 100. Thus, the light from the backlight is prevented from going on the active layer 122, and the photo-leakage currents are not caused in the active layer 122.

A method of manufacturing the array substrate through 4 mask processes will be explained hereinafter with reference to accompanying drawings.

FIGS. 9A to 9K, FIGS. 10A to 10K, and FIGS. 11A to 11K illustrate an array substrate in processes of manufacturing the same according to the first embodiment of the present invention. FIGS. 9A to 9K are cross-sectional views along the line VI-VI of FIG. 7, FIGS. 10A to 10K are cross-sectional views along the line VII-VII of FIG. 7, and FIGS. 11A to 11K are cross-sectional views along the line VIII-VIII of FIG. 7.

Figure 9A:
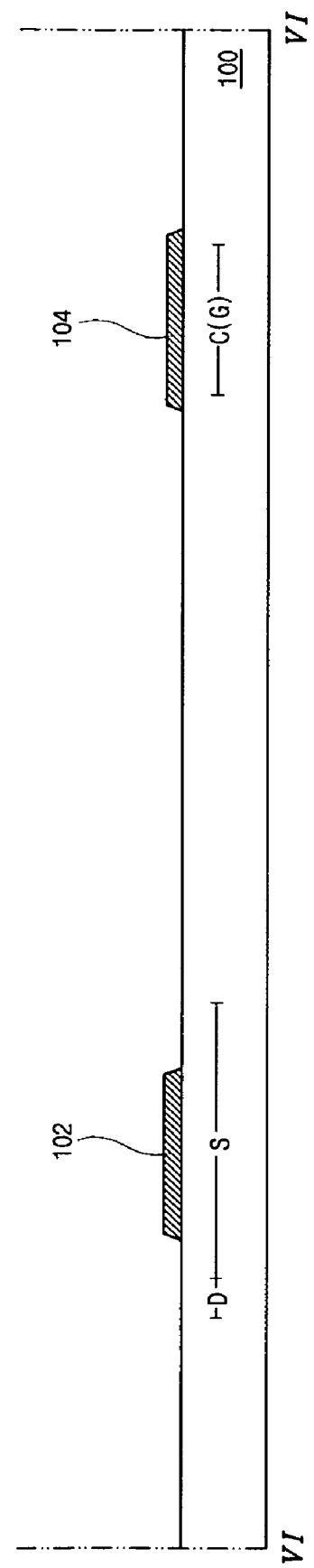
Figure 10A:
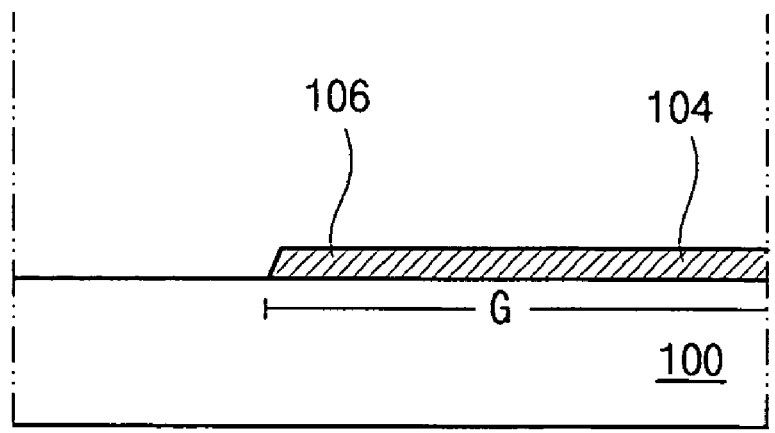
Figure 11A:
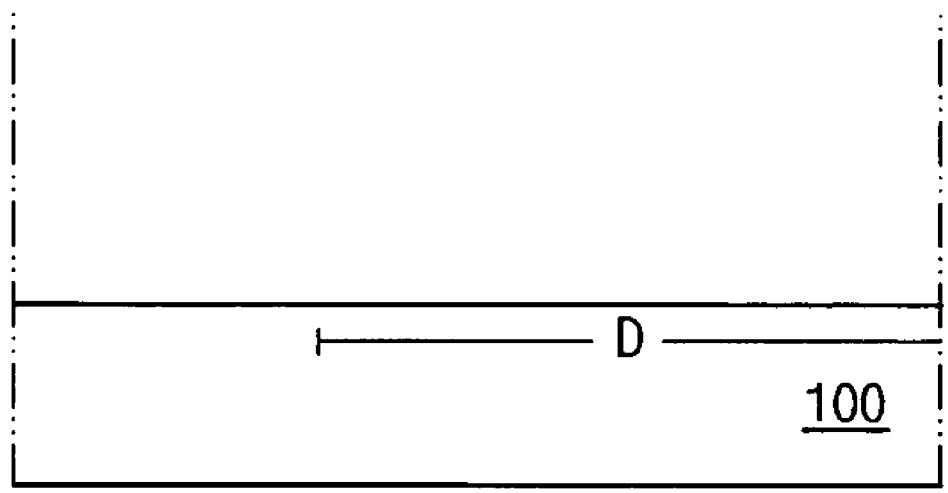

FIG. 9A, FIG. 10A and FIG. 11A show the array substrate in a first mask process. In FIG. 9A, FIG. 10A and FIG. 11A, a switching region S, a pixel region P, a gate region G, a data region D, and a storage region C are defined on a substrate 100. The gate region G includes the storage region C.

A first conductive metallic layer (not shown) is formed on the substrate 100, where the regions S, P, G, D and C are defined, by depositing one or more selected from a conductive metallic group including aluminum (Al), aluminum alloy (AlNd), chromium (Cr), molybdenum (Mo), tungsten (W), titanium (Ti), copper (Cu), and tantalum (Ta). The first conductive metallic layer is patterned through a first mask process, and a gate electrode 102, a gate line 104 and a gate pad 106 are formed. The gate electrode 102 is disposed in the switching region S, and the gate line 104 and the gate pad 106 are disposed in the gate region G. The gate pad 106 is formed at one end of the gate line 104.

FIGS. 9B to 9E, FIGS. 10B to 10E, and FIGS. 11B to 11E show the array substrate in a second mask process.

Figure 10B:
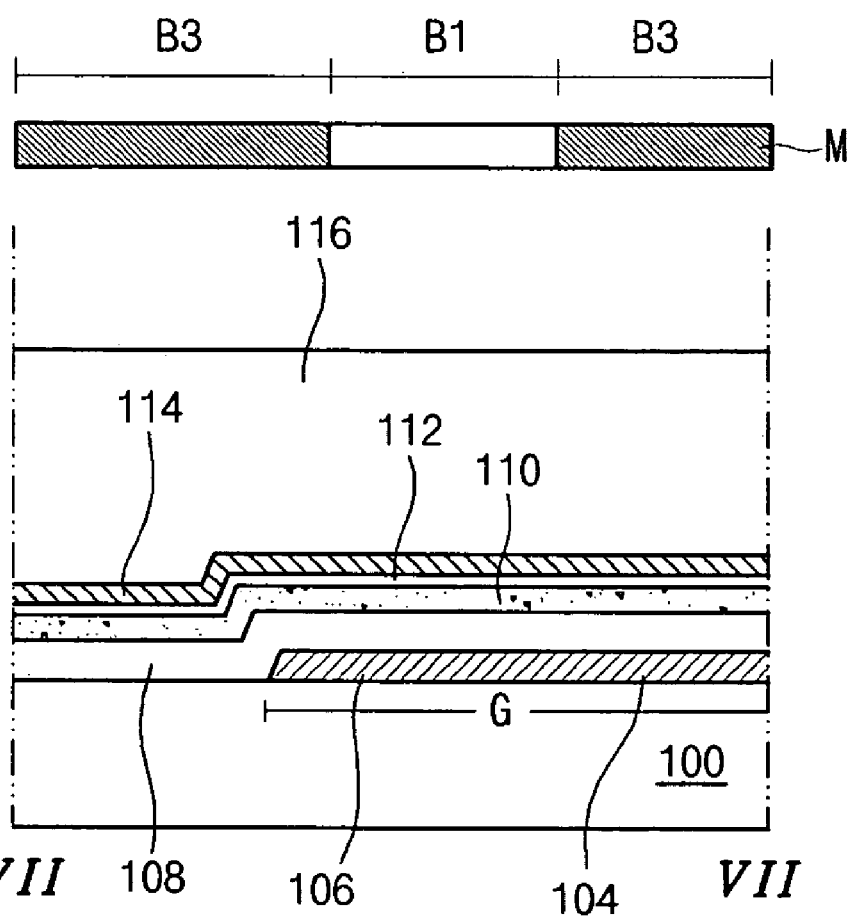
Figure 11B:
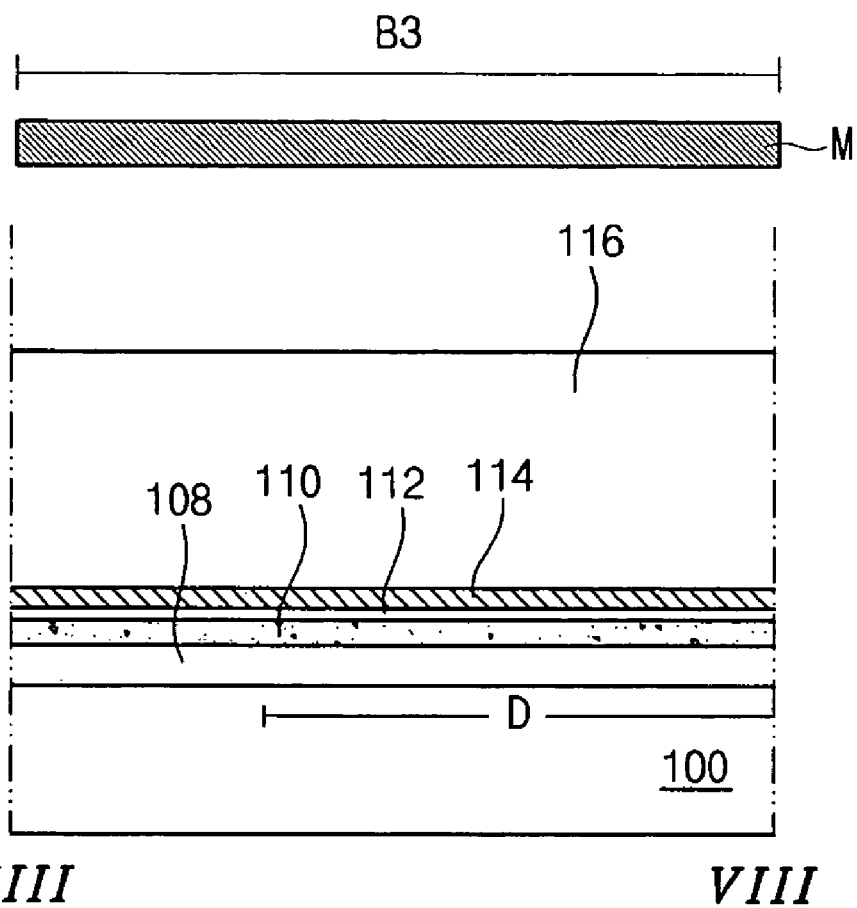

In FIG. 9B, FIG. 10B and FIG. 11B, a first insulating layer 108, an intrinsic amorphous silicon layer (a-Si:H) 110, an impurity-doped amorphous silicon layer (for example, n+ a-Si:H) 112, and a second conductive metallic layer 114 are sequentially formed substantially on an entire surface of the substrate 100 including the gate electrode 102, the gate line 104 and the gate pad 106. A photoresist layer 116 is formed on the second conductive metallic layer 114 by coating the substrate 100 with photoresist.

The first insulating layer 108 may be formed by depositing one or more selected from an inorganic insulating material group including silicon nitride ($SiN_x$) and silicon oxide ($SiO_2$). The second conductive metallic layer 114 may be formed of one selected from the above-mentioned conductive metallic group, and the second conductive metallic layer 114, beneficially, may be formed of a metallic material that can be dry-etched, for example, molybdenum (Mo).

A mask M is disposed over the photoresist layer 116. The mask M includes a light-transmitting portion B1, a light-blocking portion B2, and a light-half transmitting portion B3. The light-blocking portion B2 corresponds to the switching region S, the light-transmitting portion B1 corresponds to the gate region G for the gate pad 106, and the light-half transmitting portion B3 corresponds to other regions except the switching region S and the gate region G for the gate pad 106. The size of the light-blocking portion B2 corresponding to the switching region S is not larger than the gate electrode 102.

Next, the photoresist layer 116 is exposed to light through the mask M and then is developed.

Figure 10C:
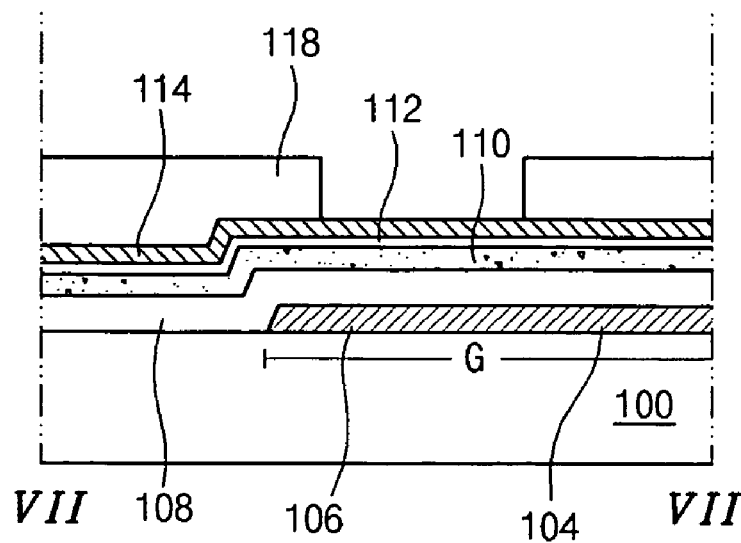
Figure 11C:
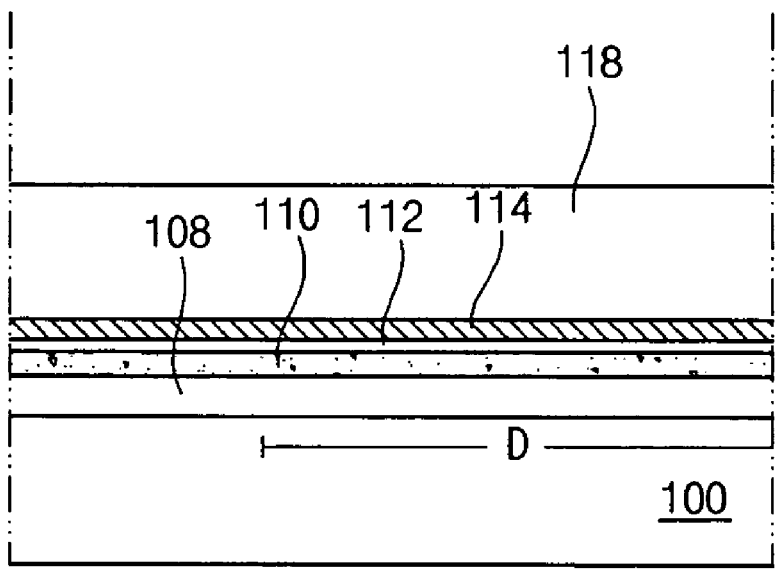

In FIG. 9C, FIG. 10C and FIG. 11C, a photoresist pattern 118 is formed after developing the photoresist layer 116 of FIG. 9B, FIG. 10B and FIG. 11B. The photoresist pattern 118 has a first part of a first thickness in the switching region S and a second part of a second thickness in other regions except the switching region S and the gate region G for the gate pad 106. The photoresist pattern 118 is removed in the gate region G for the gate pad 106 to expose the second conductive metallic layer 114. The first thickness is substantially the same as the original thickness of the photoresist layer 116 of FIG. 9B, FIG. 10B and FIG. 11B. The second thickness is thinner than the first thickness.

The exposed second conductive metallic layer 114, the impurity-doped amorphous silicon layer 112, the intrinsic amorphous silicon layer 110 and the first insulating layer 108 are removed in the gate region G for the gate pad 106.

Figure 9D:
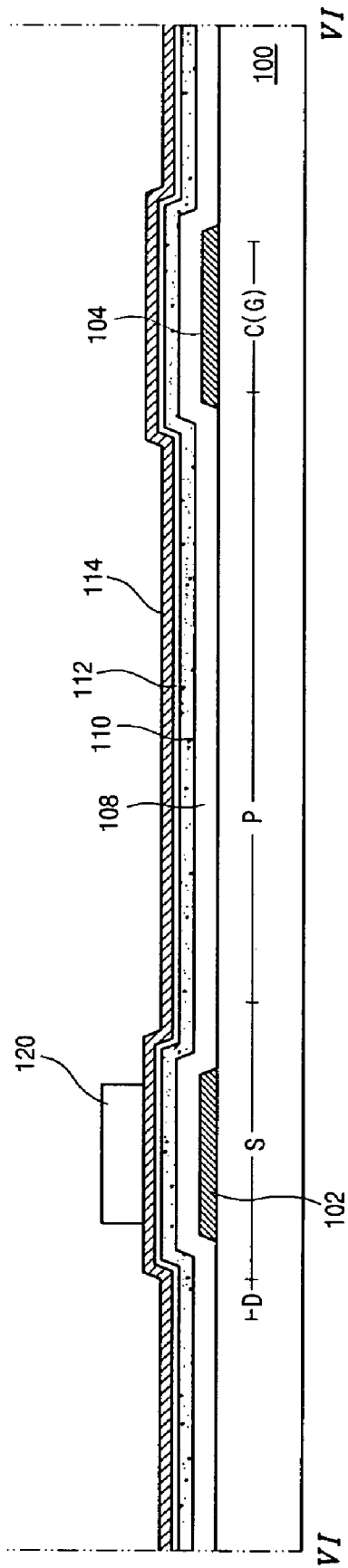
Figure 10D:
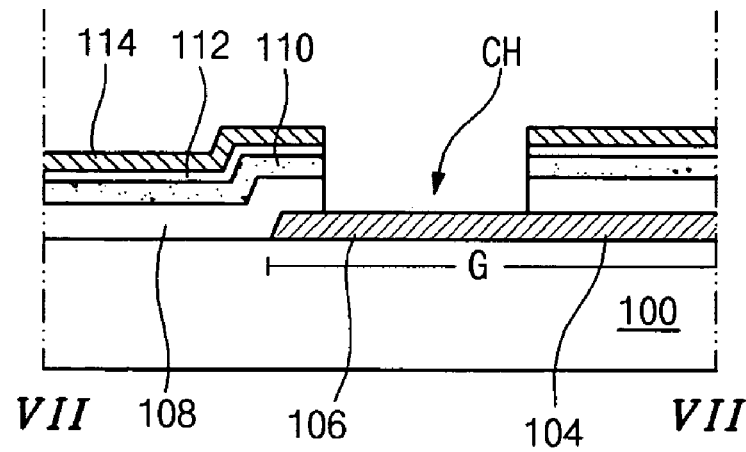
Figure 11D:
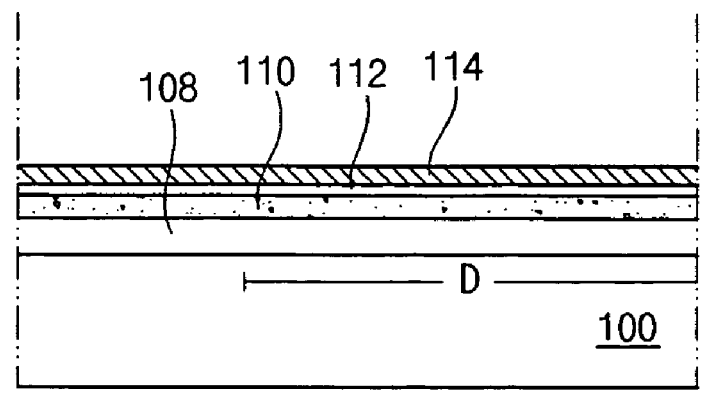

In FIG. 9D, FIG. 10D and FIG. 11D, a gate pad contact hole CH is formed. The gate pad contact hole CH exposes the gate pad 106. Next, an ashing process is performed to remove the second part of the photoresist pattern 118 of FIGS. 9C, 10C and 11C. At this time, the first part of the photoresist pattern 118 of FIG. 9C is also partially removed, and a photoresist pattern 120 remains in the switching region S. The photoresist pattern 120 has a thinner thickness than the first part of the photoresist pattern 118 of FIG. 9C. The second conductive metallic layer 114 is exposed in the other regions except the switching region S and the gate region G for the gate pad 106.

The second conductive metallic layer 114, the impurity-doped amorphous silicon layer 112, and the intrinsic amorphous silicon layer 110 are removed by using the photoresist pattern 120 as an etching mask. Then, the photoresist pattern 120 is removed.

Figure 9E:
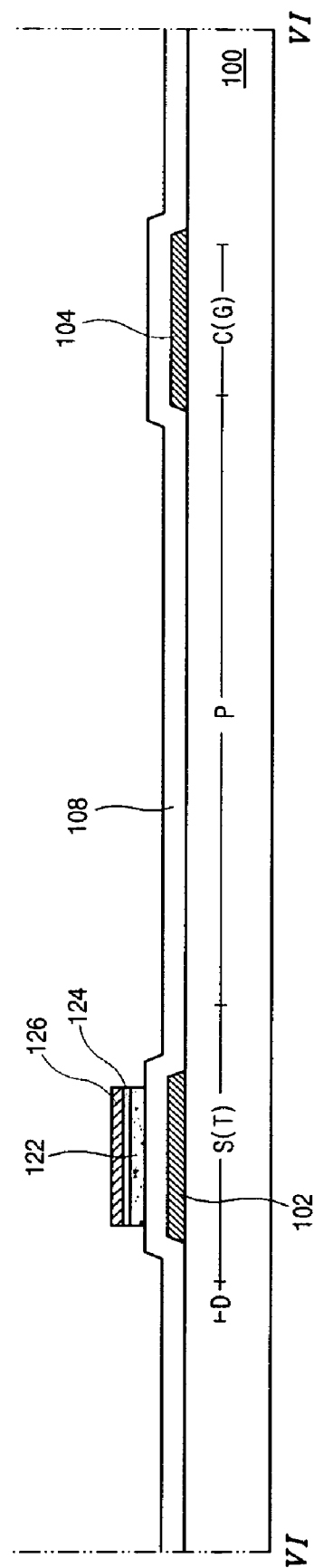
Figure 10E:
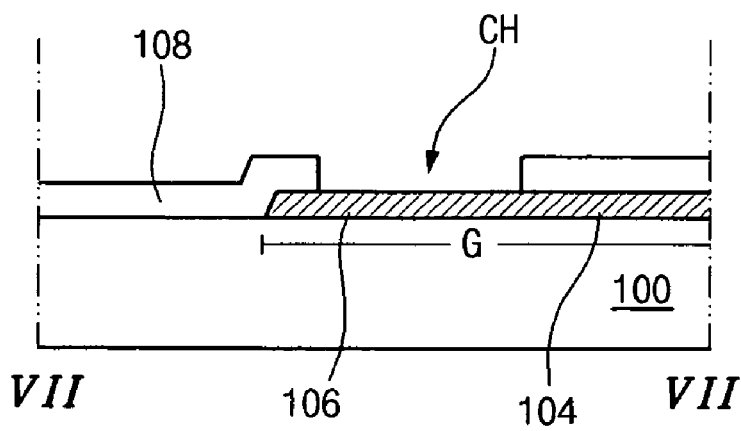
Figure 11E:
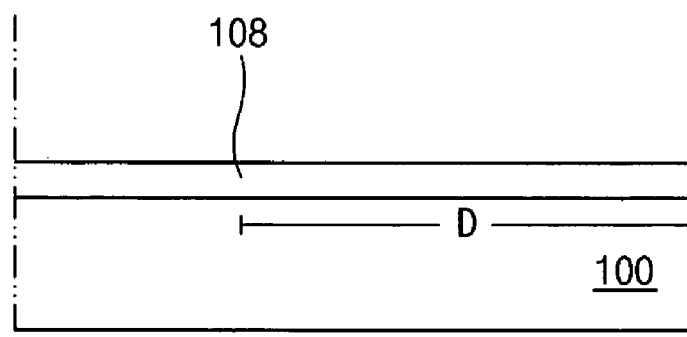

In FIG. 9E, FIG. 10E and FIG. 11E, an active layer 122, an ohmic contact layer 124, and a buffer metallic layer 126 are formed in the switching region S. The first insulating layer 108 is disposed in the other regions except the gate region G for the gate pad 106. The gate pad 106 is exposed through the gate pad contact hole CH.

FIGS. 9F to 9J, FIGS. 10F to 10J, and FIGS. 11F to 11J show the array substrate in a third mask process.

Figure 10F:
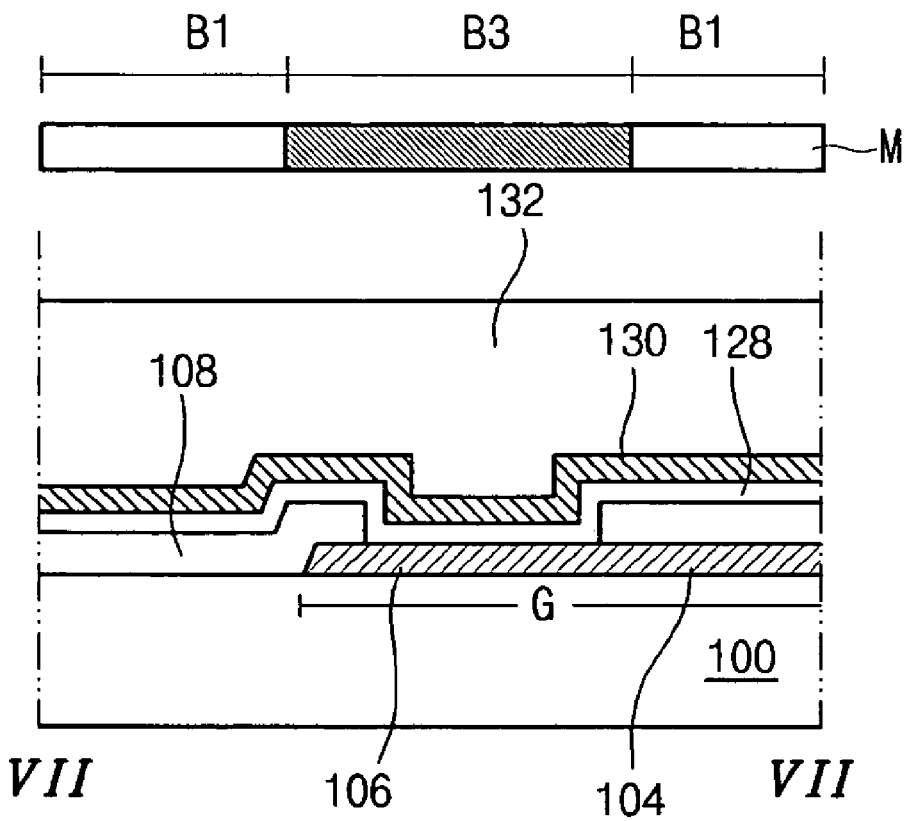
Figure 11F:
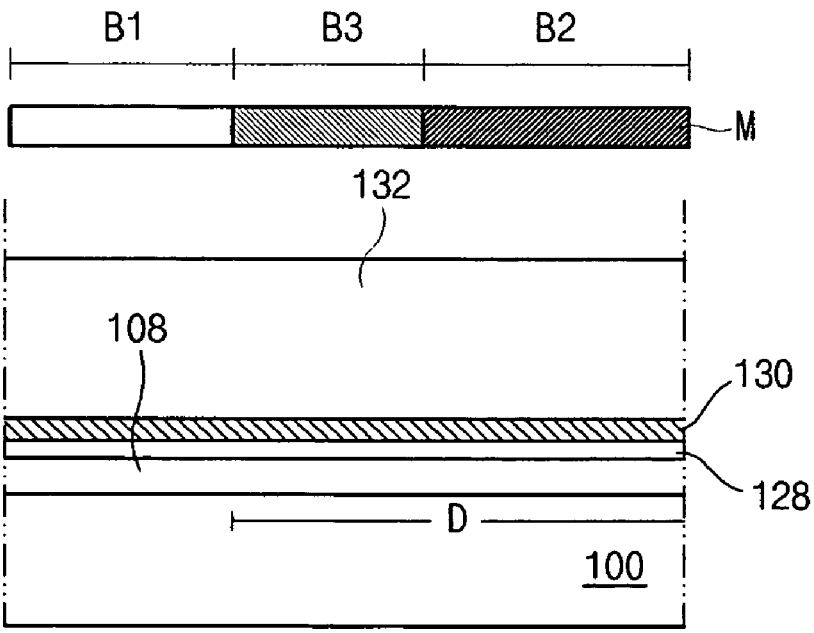

In FIG. 9F, FIG. 10F and FIG. 11F, a transparent conductive layer 128 and an opaque conductive layer 130 are sequentially formed substantially on an entire surface of the substrate 100. A photoresist layer 132 is formed on the opaque conductive layer 130 by coating the substrate 100 with photoresist. A mask M is disposed over the photoresist layer 132. The mask M includes a light-transmitting portion B1, a light-blocking portion B2 and a light-half transmitting portion B3.

The light-blocking portion B2 corresponds to the data region D except one end thereof. The light-half transmitting portion B3 corresponds to both sides of the switching region S and the pixel region P, the gate region G for the gate pad 106, and the one end of the data region D. The light-half transmitting portion B3 also corresponds to a part of the storage region C. The light-transmitting portion B1 corresponds to the center of the switching region S between the both sides of the switching region S and other regions.

The photoresist layer 132 is exposed to light through the mask M and then is developed.

Figure 10G:
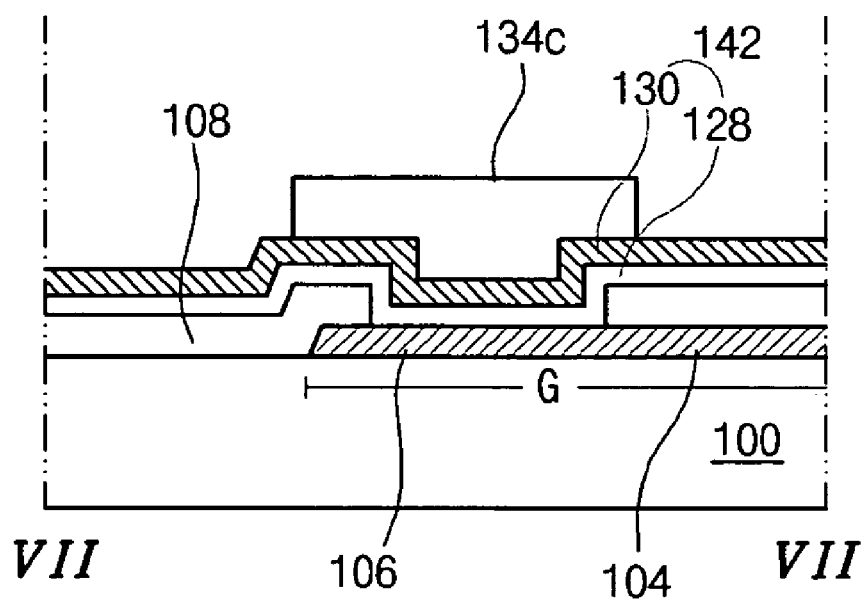
Figure 11G:
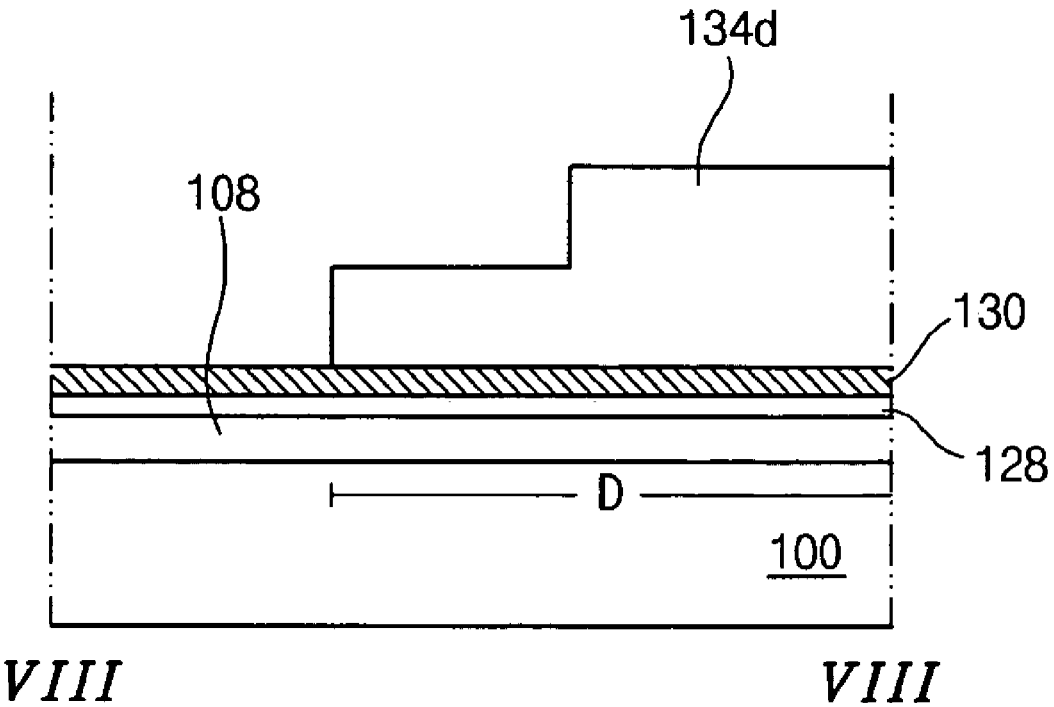

In FIG. 9G, FIG. 10G, and FIG. 11G, first, second, third, and fourth photoresist patterns 134a, 134b, 134c, and 134d are formed. The first photoresist pattern 134a is disposed in the switching region S. The first photoresist pattern 134a includes two parts spaced apart from each other. The second photoresist pattern 134b is disposed in the pixel region P and the part of the storage region C. The third photoresist pattern 134c is disposed in the gate region G for the gate pad 106. The fourth photoresist pattern 134d is disposed in the data region D. The fourth photoresist pattern 134d includes a first part and a second part, and the second part of the photoresist pattern 134d corresponds to the one end of the data region D. The first part of the fourth photoresist pattern 134d has a first thickness that is substantially the same as the original thickness of the photoresist layer. The first photoresist pattern 134a, the second photoresist pattern 134b, the third photoresist pattern 134c and the second part of the fourth photoresist pattern 134d have a second thickness that is thinner than the first thickness.

The opaque conductive layer 130 and the transparent conductive layer 128 are removed by using the first, second, third and fourth photoresist patterns 134a, 134b, 134c and 134d as an etching mask.

Figure 9H:
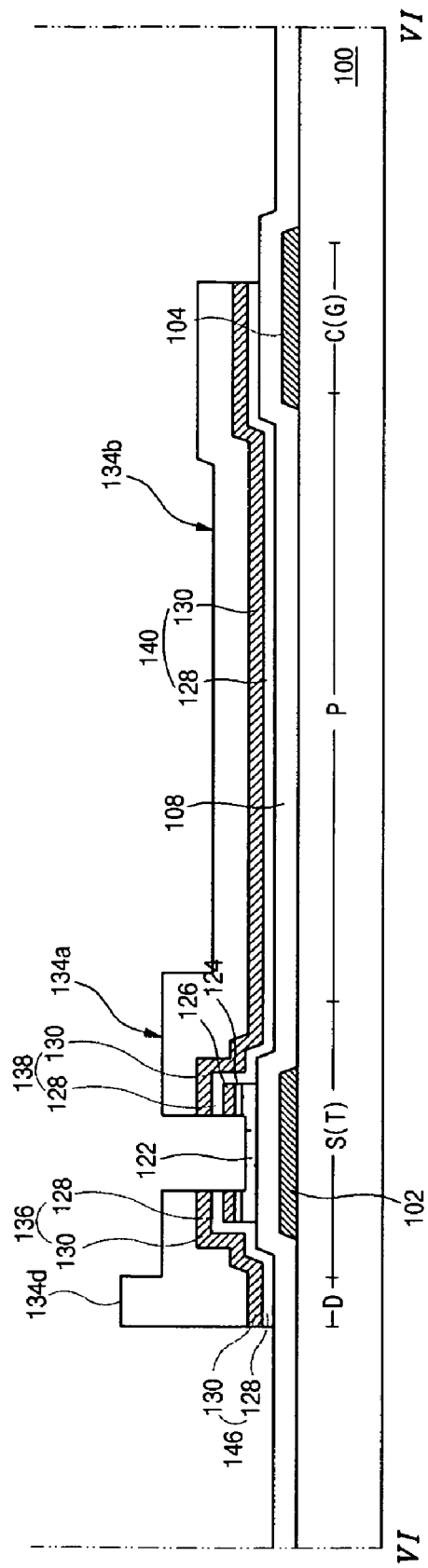
Figure 10H:
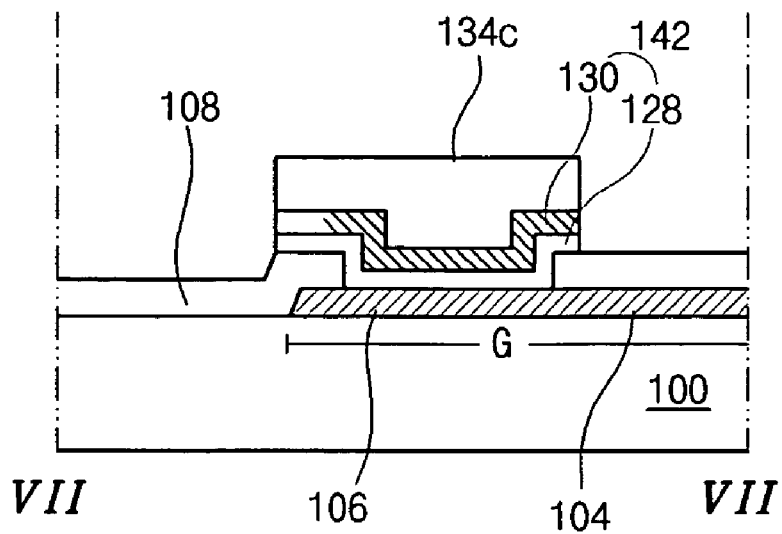
Figure 11H:
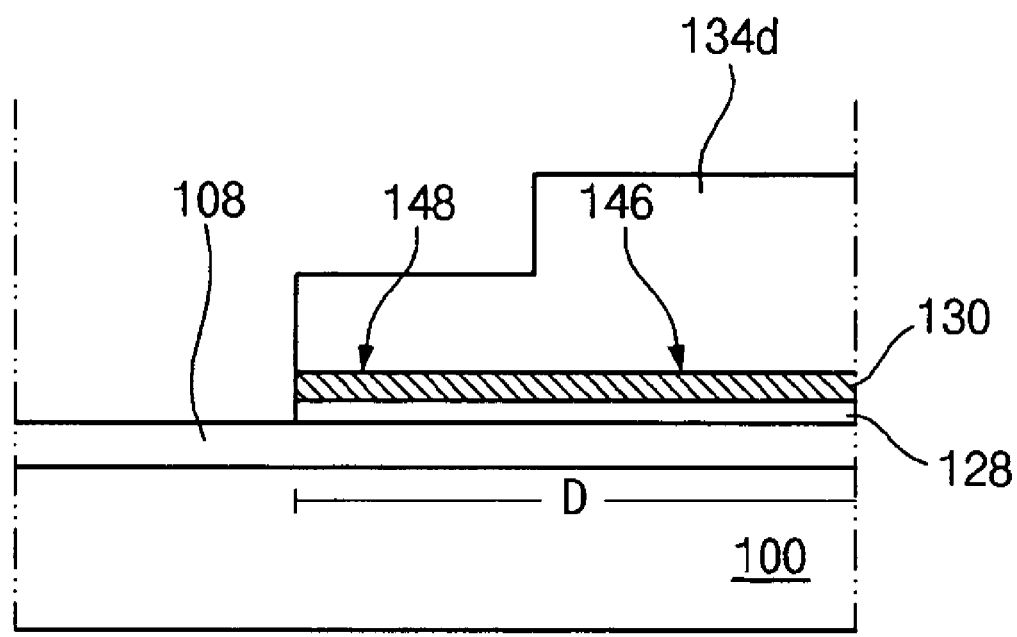

In FIG. 9H, FIG. 10H and FIG. 11H, a source electrode 136, a drain electrode 138, a pixel electrode 140, a gate pad electrode 142, a data pad 148, and a data line 146 are formed. The source electrode 136 and the drain electrode 138 are formed under the first photoresist pattern 134a in the switching region S. The pixel electrode 140 is formed under the second photoresist pattern 134b in the pixel region P. The pixel electrode 140 extends from the drain electrode 138. The gate pad electrode 142 is formed under the third photoresist pattern 134c in the gate region G and contacts the gate pad 106. The data pad 148 and the data line 146 are formed under the fourth photoresist pattern 134d. The data pad 148 is disposed at one end of the data line 146.

Each of the source and drain electrodes 136 and 138, the pixel electrode 140, the gate pad electrode 142, the data pad 148 and the data line 146 includes the transparent conductive layer 128 and the opaque conductive layer 130 sequentially deposited.

The buffer metallic layer 126 is exposed between the source and drain electrodes 136 and 138. The exposed buffer metallic layer 126 and the ohmic contact layer 124 are removed between the source and drain electrodes 136 and 138. In the switching region S, the active layer 122 is exposed between the source and drain electrodes 136 and 138.

Next, an ashing process is performed, thereby removing the first photoresist pattern 134a, the second photoresist pattern 134b, the third photoresist pattern 134c, and the second part of the fourth photoresist pattern 134d. There exists only the first part of the fourth photoresist pattern 134d.

Figure 9I:
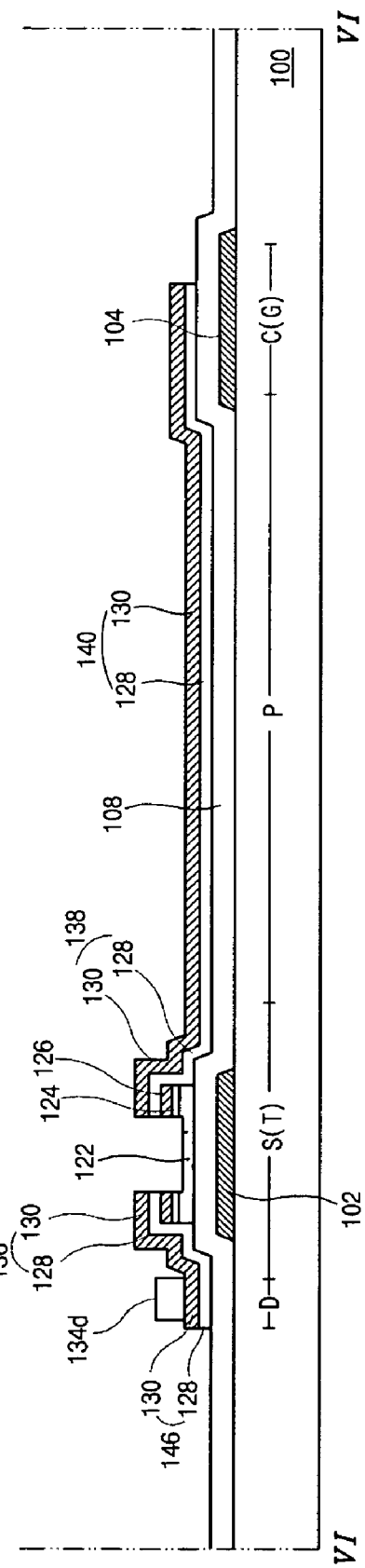
Figure 10I:
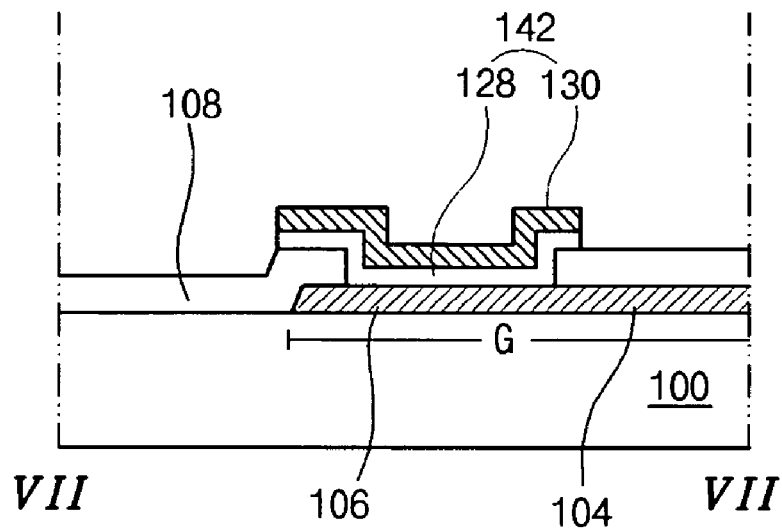
Figure 11I:
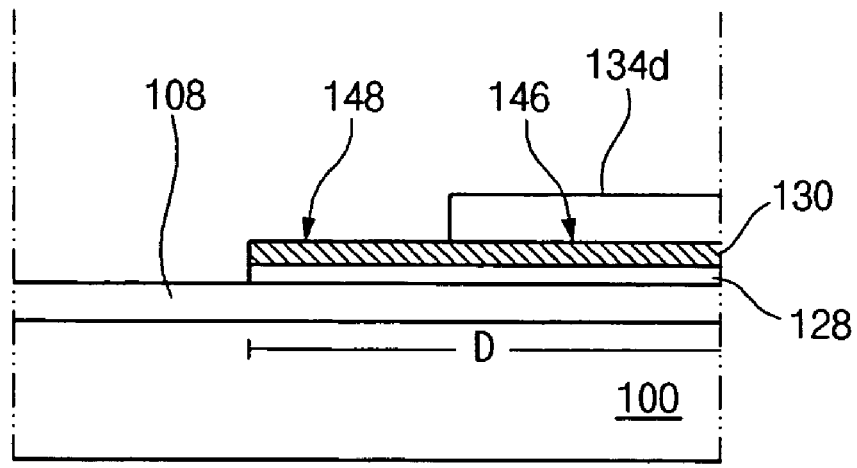

In FIG. 9I, FIG. 10I and FIG. 11I, the source and drain electrodes 136 and 138, the pixel electrode 140, the gate pad electrode 142, and the data pad 148 are exposed.

The opaque conductive layers 130 of the source and drain electrodes 136 and 138, the pixel electrode 140, the gate pad electrode 142, and the data pad 148 are removed, and thus the transparent conductive layers 128 remain.

Next, the first part of the fourth photoresist pattern 134d on the data line 146 is stripped.

Figure 9J:
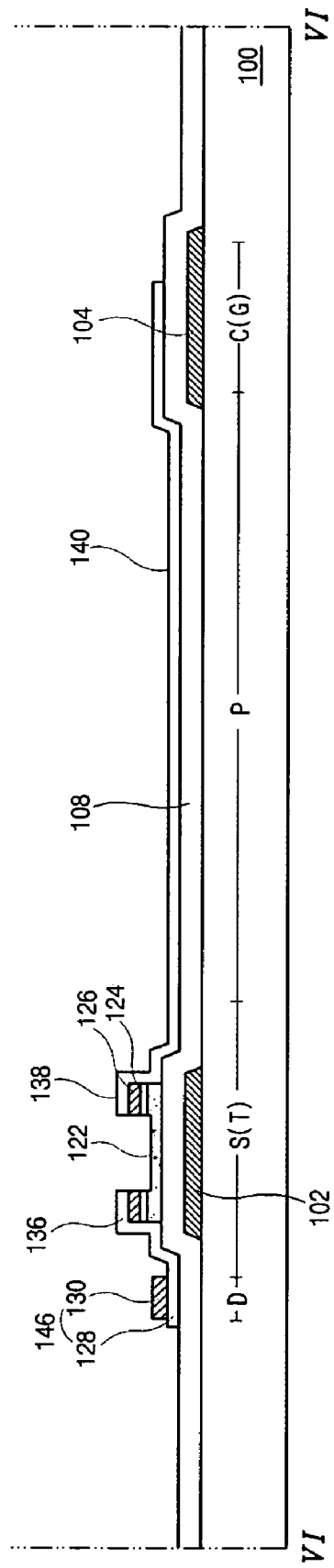
Figure 10J:
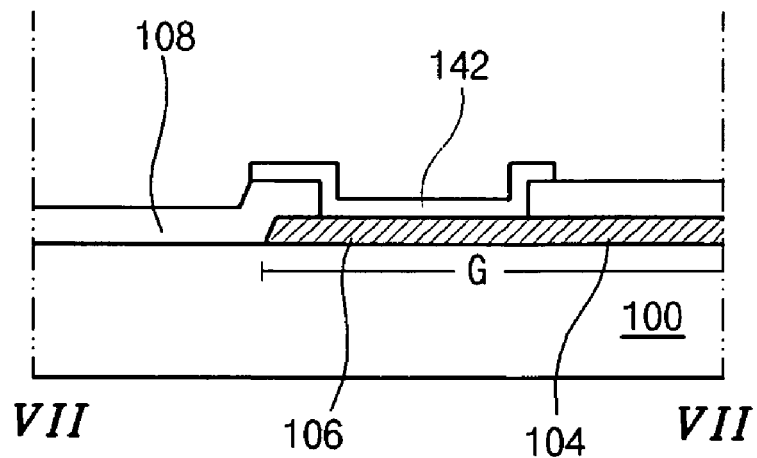
Figure 11J:
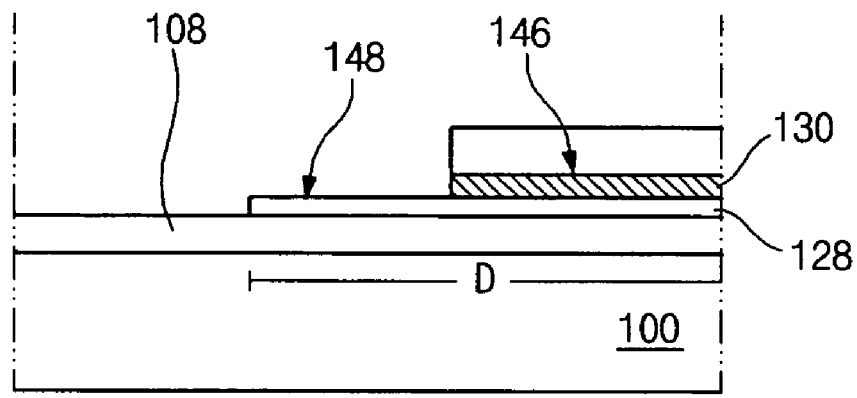

In FIG. 9J, FIG. 10J and FIG. 11J, the source and drain electrodes 136 and 138 are disposed in the switching region S, the pixel electrode 140 is disposed in the pixel region P, the gate pad electrode 142 is disposed in the gate region G, and the data line 146 and the data pad 148 are disposed in the data region D. The source and drain electrodes 136 and 138, the pixel electrode 140, the gate pad electrode 142 and the data pad 148 include only the transparent conductive layer. The data line 146 includes the transparent conductive layer 128 and the opaque conductive layer 130.

Here, the opaque conductive layer 130 of the data line 146 is partially removed at edges thereof.

Figure 9K:
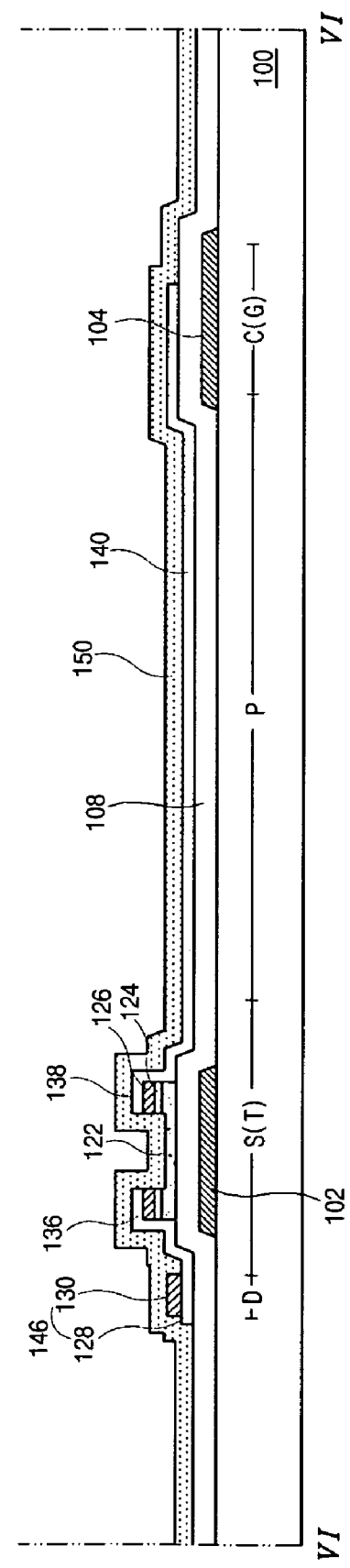
Figure 10K:
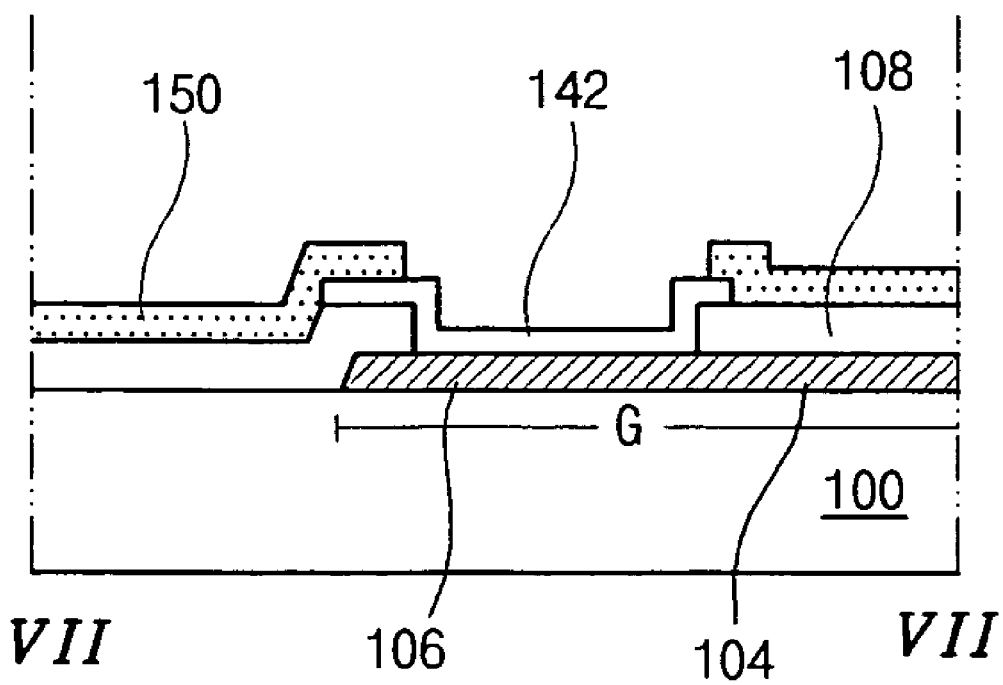
Figure 11K:
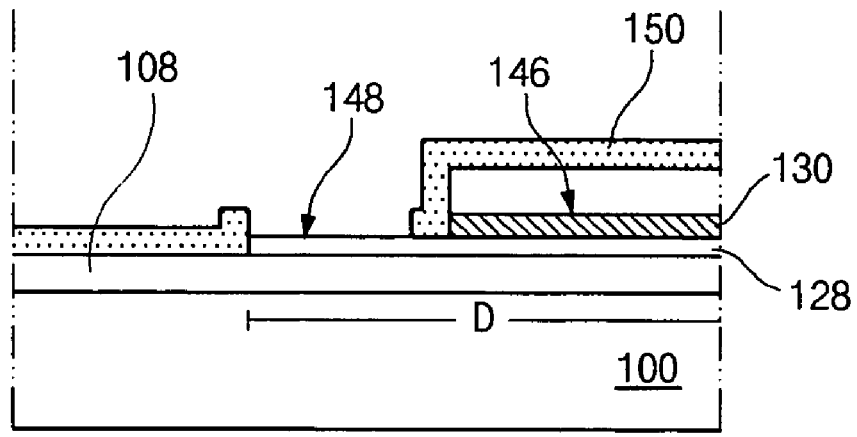

FIG. 9K, FIG. 10K and FIG. 11K show the array substrate in a fourth mask process. In FIG. 9K, FIG. 10K and FIG. 11K, a second insulating layer 150 is formed substantially on an entire surface of the substrate 100 by depositing one or more selected from an inorganic insulating material group including silicon nitride ($SiN_x$) and silicon oxide ($SiO_2$). The second insulating layer 150 is patterned through a fourth mask process, and thus the gate pad electrode 142 and the data pad 148 are exposed. The pixel electrode 140 may be also exposed.

Like this, the array substrate for an LCD device may be manufactured through 4 mask processes. That is, the gate electrode, the gate line and the gate pad are formed through the first mask process. The first insulating layer, the active layer, the ohmic contact layer, and the buffer metallic layer are formed through the second mask process, and the gate pad is exposed via the first insulating layer at this time. The source and drain electrodes, the pixel electrode, the gate pad electrode, the data line, and the data pad are formed through the third mask process. The source and drain electrodes, the pixel electrode, the gate pad electrode and the data pad include only a transparent conductive layer. The second insulating layer is formed and then is patterned through the fourth mask process, thereby exposing the gate pad electrode and the data pad.

In the first embodiment, by using a mask including a half-tone portion or a slit portion, the source and drain electrodes include only a transparent conductive layer, and the data line includes a transparent conductive layer and an opaque conductive layer.

In a second embodiment, the source and drain electrodes of the transparent conductive layer can be formed due to an etch bias. The method of manufacturing an array substrate according to the second embodiment will be described hereinafter with reference to accompanying drawings. Here, first, second and fourth mask processes of the second embodiment are the same as those of the first embodiment, and explanation of the first, second and fourth mask processes will be omitted.

FIGS. 12A to 12E show an array substrate in a third mask process according to the second embodiment. FIGS. 12A to 12E are cross-sectional views along the line VI-VI of FIG. 7. FIGS. 13A and 13B are schematic plan views of showing a data line, a source electrode and a drain electrode in the second embodiment. FIG. 13A corresponds to the area E1 of FIG. 12D, and FIG. 13B corresponds to the area E2 of FIG. 12E. The structures and steps for a gate pad portion and a data pad portion are the same as those in the first embodiment, and thus drawings for the gate pad portion and the data pad portion will be abbreviated.

Figure 12A:
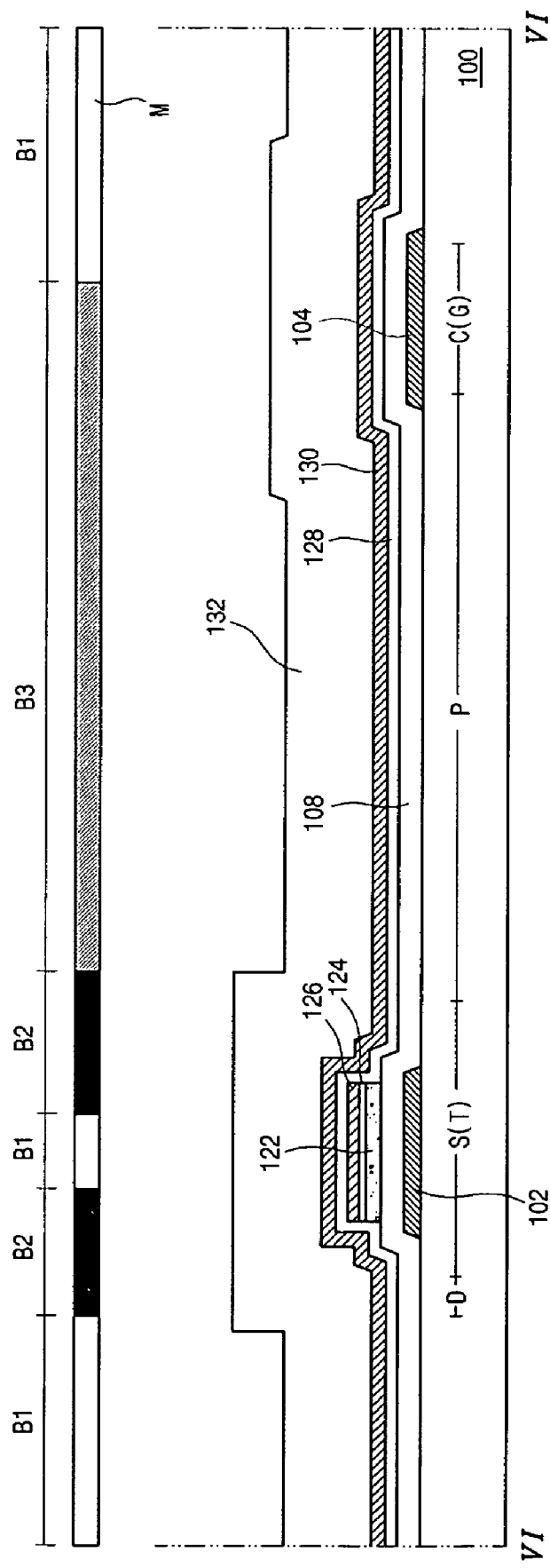
FIGS. 12A to 12E are cross-sectional views of an array substrate in a third mask process according to a second embodiment.
Figure 13A:
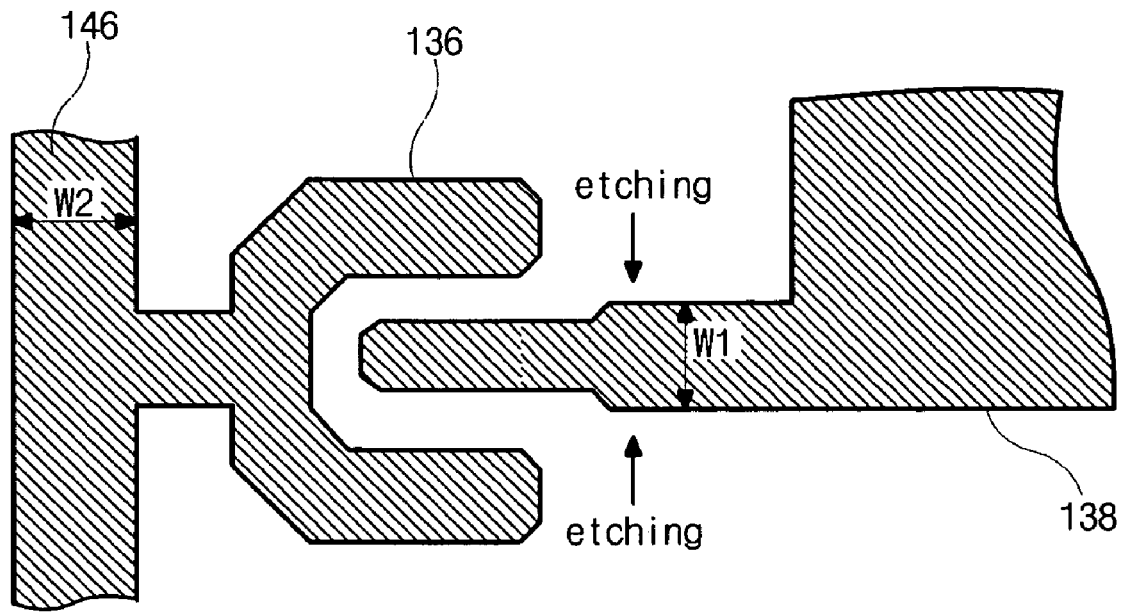
FIGS. 13A and 13B are schematic plan views of showing a data line, a source electrode and a drain electrode in the second embodiment.
Figure 13B:
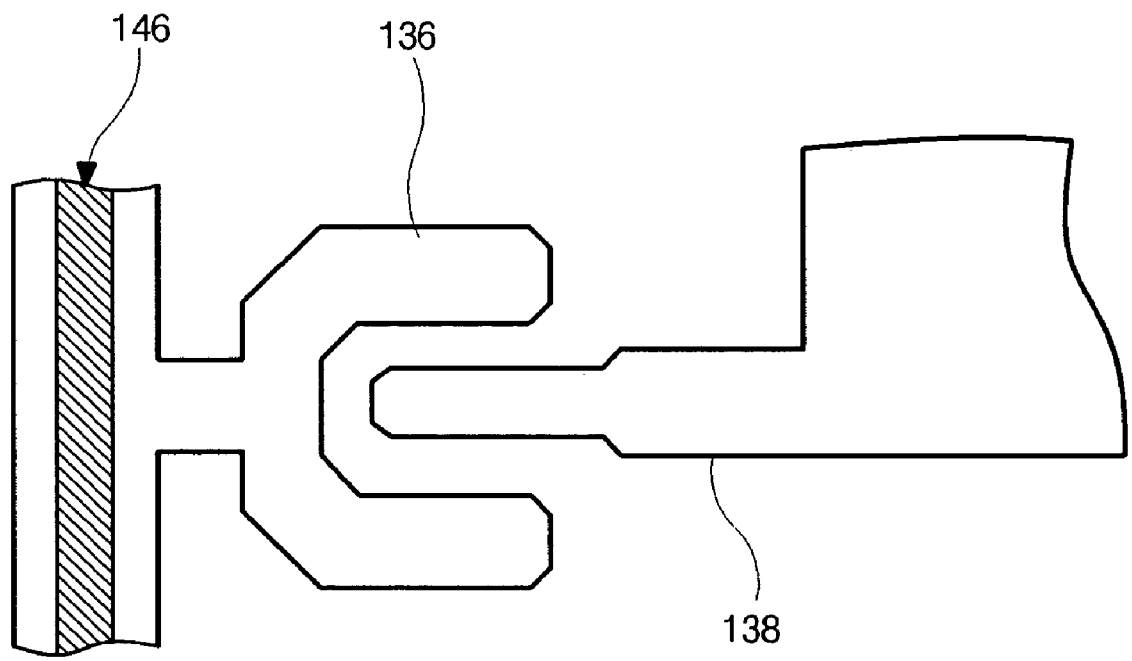

In FIG. 12A, a transparent conductive layer 128 and an opaque conductive layer 130 are sequentially formed substantially on an entire surface of the substrate 100 including the active layer 122, the ohmic contact layer 124 and the buffer metallic layer 126 in the switching region S through the second mask process. A photoresist layer 132 is formed on the opaque conductive layer 130 by coating the substrate 100 with photoresist. A mask M is disposed over the photoresist layer 132. The mask M includes a light-transmitting portion B1, a light-blocking portion B2 and a light-half transmitting portion B3.

The light-blocking portion B2 corresponds to both sides of the switching region S and the data region D except one end thereof. The light-half transmitting portion B3 corresponds to the pixel region P, the gate region G for the gate pad 106 of FIG. 10F, and the one end of the data region D of FIG. 11F. The light-half transmitting portion B3 also corresponds to a part of the storage region C. The light-transmitting portion B1 corresponds to the center of the switching region C between the both sides of the switching region S and other regions.

The photoresist layer 132 is exposed to light through the mask M and then is developed.

Figure 12B:
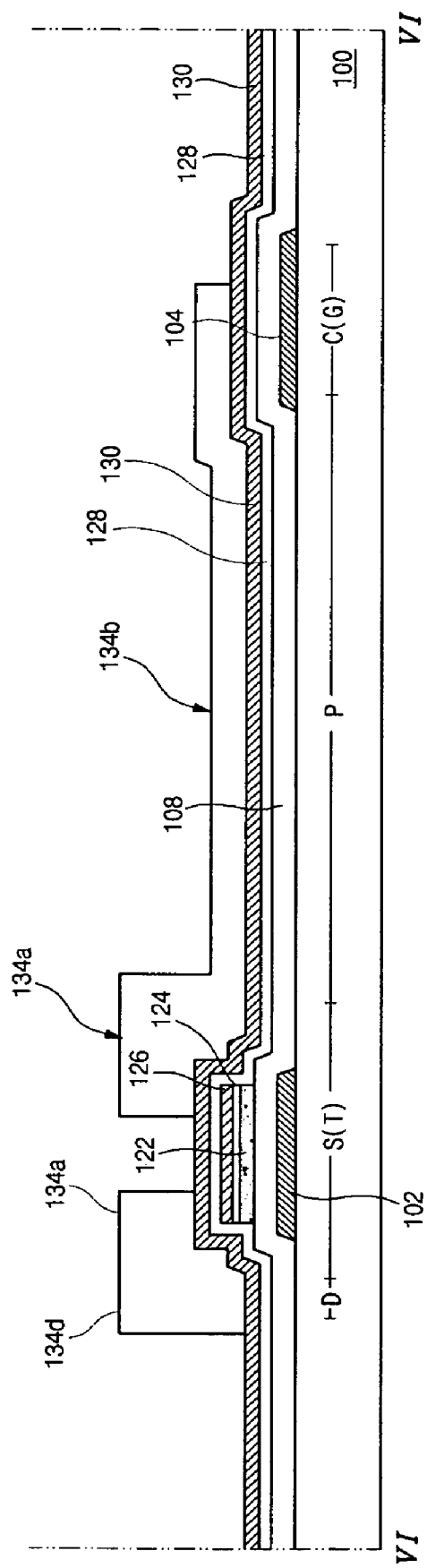

In FIG. 12B, first, second, third, and fourth photoresist patterns 134a, 134b, 134c of FIG. 10G, and 134d are formed. The first photoresist pattern 134a is disposed in the switching region S. The first photoresist pattern 134a includes two parts spaced apart from each other. The second photoresist pattern 134b is disposed in the pixel region P and the part of the storage region C. The third photoresist pattern 134c of FIG. 10G is disposed in the gate region G for the gate pad 106. The fourth photoresist pattern 134d is disposed in the data region D. The fourth photoresist pattern 134d includes a first part and a second part, and the second part of the photoresist pattern 134d corresponds to the one end of the data region D of FIG. 10G. The first photoresist pattern 134a and the first part of the fourth photoresist pattern 134d have a first thickness that is substantially the same as the original thickness of the photoresist layer. The second photoresist pattern 134b, the third photoresist pattern 134c of FIG. 10G and the second part of the fourth photoresist pattern 134d of FIG. 10G have a second thickness that is thinner than the first thickness.

The opaque conductive layer 130 and the transparent conductive layer 128 are removed by using the first, second, third and fourth photoresist patterns 134a, 134b, 134c and 134d as an etching mask.

Figure 12C:
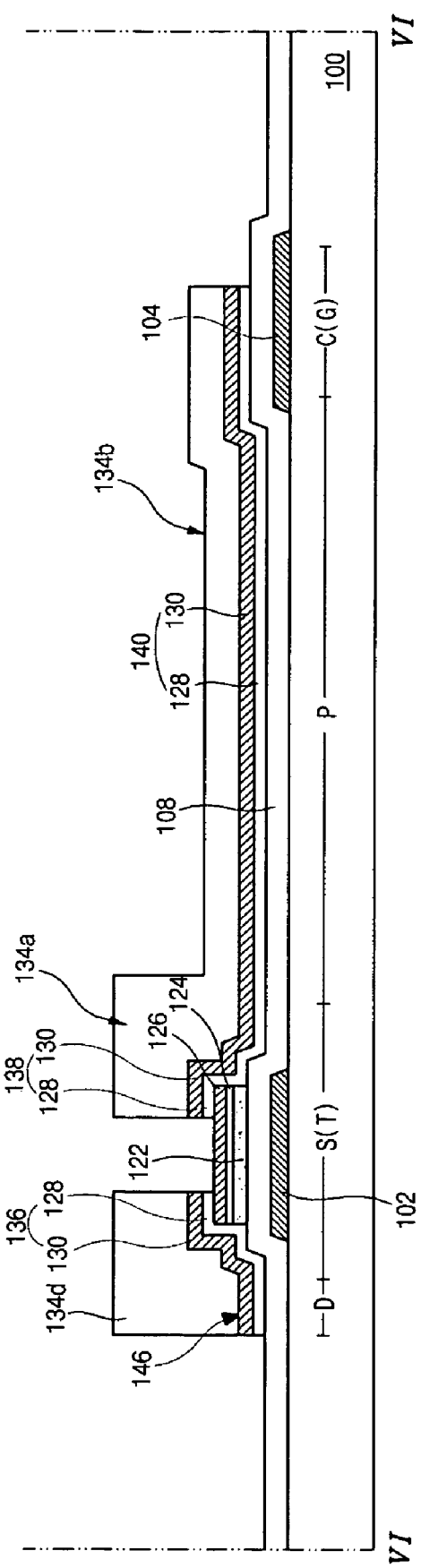

In FIG. 12C, a source electrode 136, a drain electrode 138, a pixel electrode 140, a gate pad electrode 142 of FIG. 10H, a data pad 148 of FIG. 11H, and a data line 146 are formed. The source electrode 136 and the drain electrode 138 are formed under the first photoresist pattern 134a in the switching region S. The pixel electrode 140 is formed under the second photoresist pattern 134b in the pixel region P. The pixel electrode 140 extends from the drain electrode 138. The gate pad electrode 142 of FIG. 10H is formed under the third photoresist pattern 134c of FIG. 10H in the gate region G and contacts the gate pad 106 of FIG. 10H. The data pad 148 of FIG. 11H and the data line 146 are formed under the fourth photoresist pattern 134d. The data pad 148 of FIG. 11H is disposed at one end of the data line 146.

Each of the source and drain electrodes 136 and 138, the pixel electrode 140, the gate pad electrode 142 of FIG. 10H, the data pad 148 of FIG. 11H and the data line 146 includes the transparent conductive layer 128 and the opaque conductive layer 130 sequentially deposited.

Figure 12D:
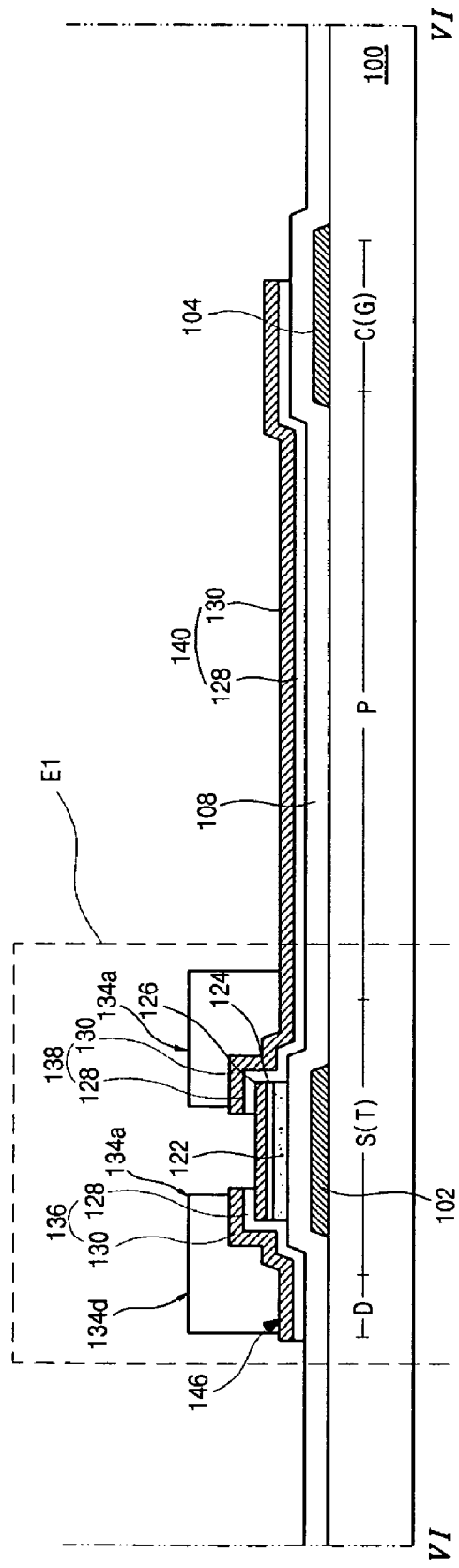

In FIG. 12D, an ashing process is performed, thereby removing the second photoresist pattern 134b, the third photoresist pattern 134c of FIG. 10H, and the second part of the fourth photoresist pattern 134d of FIG. 11H. There exist the first photoresist pattern 134a and the first part of the fourth photoresist pattern 134d. The opaque conductive layers 130 of the pixel electrode 140, the gate pad electrode 142 of FIG. 10I and the data pad 148 of FIG. 11I are exposed.

The opaque conductive layers 130 of the pixel electrode 140, the gate pad electrode 142 of FIG. 10I and the data pad 148 of FIG. 11I are removed, and thus the transparent conductive layers 128 remain. At this time, the opaque conductive layers 130 of the source and drain electrodes 136 and 138 are also removed by using an etchant for only the opaque conductive layers 130. As shown in FIG. 13A, widths W1 of the source and drain electrodes 136 and 138 are narrower than a width W2 of the data line 146. That is, while the width W2 of the data line 146 is within a range of about 6 μm to about 7 μm, the widths W1 of the source and drain electrodes 136 and 138 are about 5 μm. The opaque conductive layers 130 are over-etched according as it takes a long time to dip the substrate 100 into the etchant. Since the source and drain electrodes 136 and 138 have relatively narrower widths W1 than the data line 146, the opaque conductive layers 130 of the source and drain electrodes 136 and 138 can be removed by over-etching the opaque conductive layers 130.

Figure 12E:
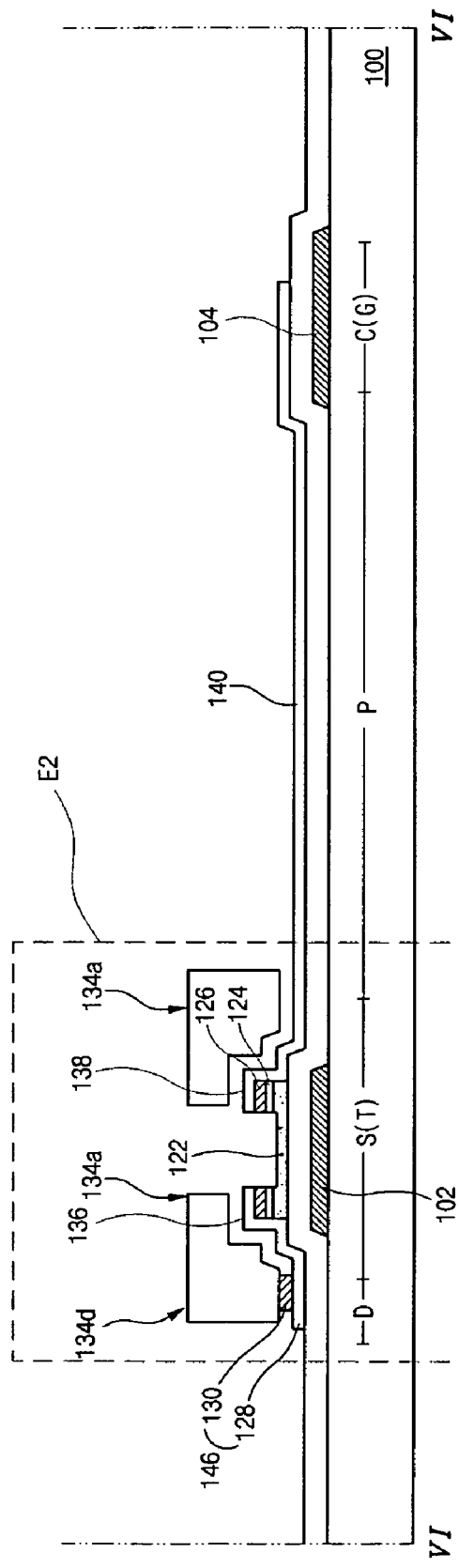

In FIG. 12E, the source and drain electrodes 136 and 138 are disposed in the switching region S, the pixel electrode 140 is disposed in the pixel region P, the gate pad electrode 142 is disposed in the gate region G, and the data line 146 and the data pad 148 are disposed in the data region D. The source and drain electrodes 136 and 138, the pixel electrode 140, the gate pad electrode 142 of FIG. 10J and the data pad 148 of FIG. 10J include only the transparent conductive layer. The data line 146 includes the transparent conductive layer 128 and the opaque conductive layer 130.

The buffer metallic layer 126 is exposed between the source and drain electrodes 136 and 138. The exposed buffer metallic layer 126 and the ohmic contact layer 124 are removed between the source and drain electrodes 136 and 138. In the switching region S, the active layer 122 is exposed between the source and drain electrodes 136 and 138.

Next, the first and fourth photoresist patterns 134a and 134d are removed.

As stated above, the third mask process according to the second embodiment is performed.

Meanwhile, an array substrate for an in-plane switching (IPS) mode LCD device, which includes a pixel electrode and a common electrode on the same substrate, may be manufactured through the 4 mask processes according to the present invention.

Figure 14:
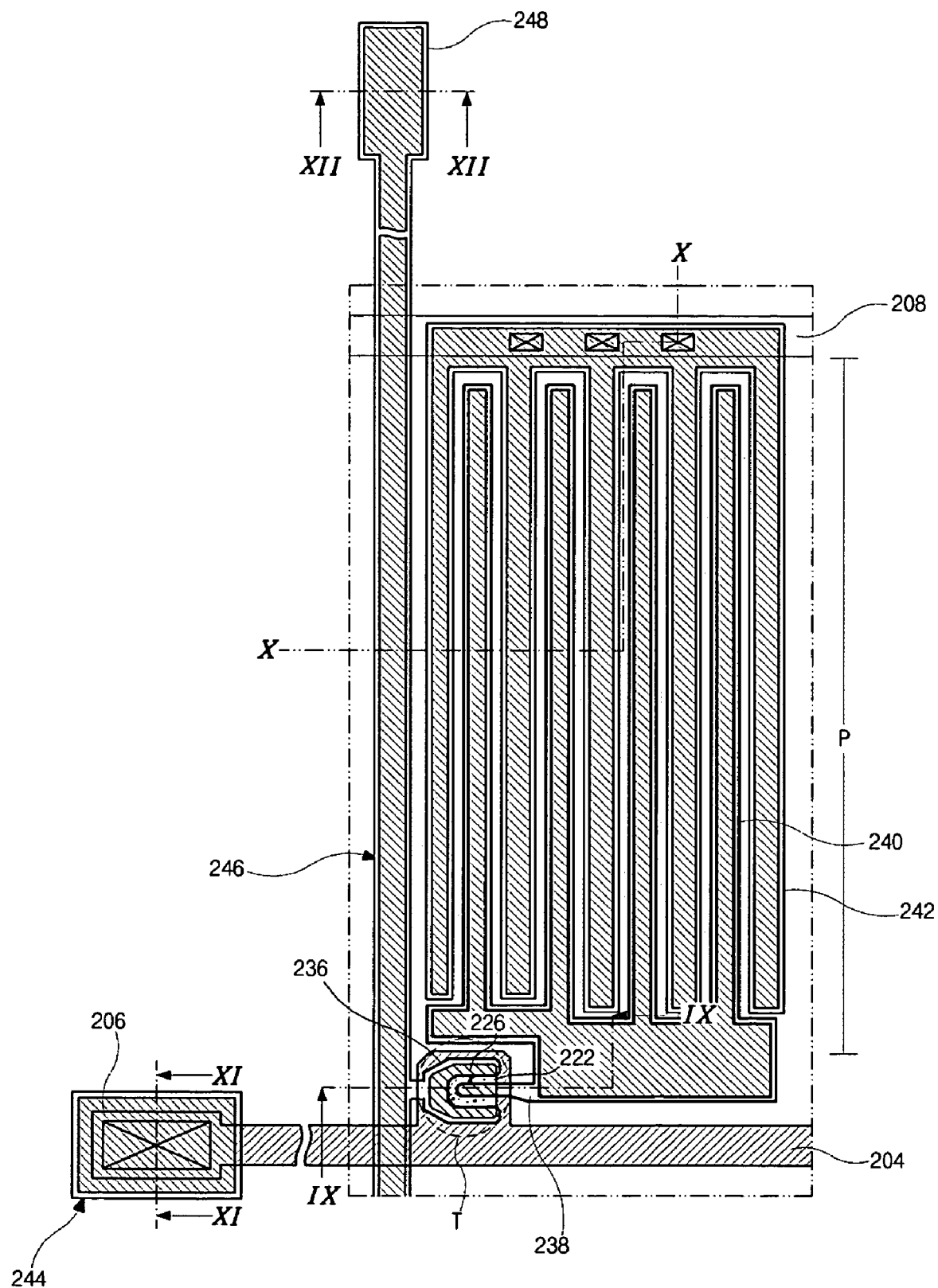
FIG. 14 is a plan view of an array substrate for an IPS mode LCD device according to a third embodiment of the present invention.
Figure 15C:
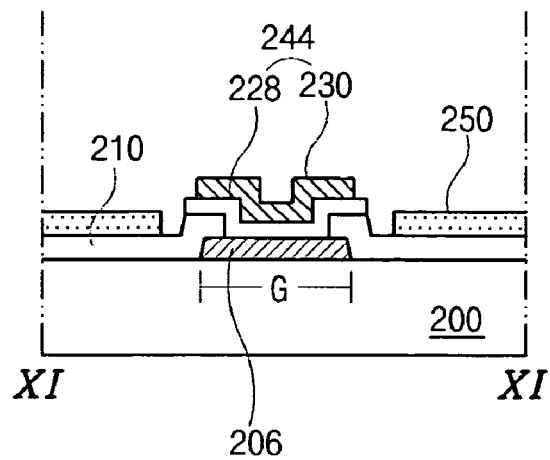
Figure 15D:
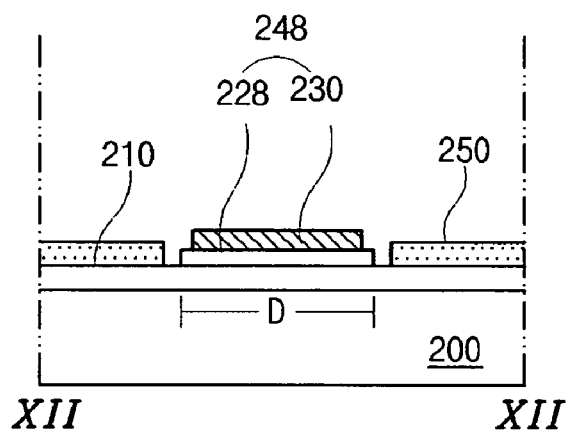

FIG. 14 is a plan view of an array substrate for an IPS mode LCD device according to a third embodiment of the present invention. In FIG. 14, a gate line 204 is formed on an insulating substrate along a first direction, and a data line 246 is formed along a second direction. The gate line 204 and the data line 246 cross each other to define a pixel region P. A common line 208 is formed along the first direction. A gate pad 206 is formed at one end of the gate line 204, and a data pad 248 is formed at one end of the data line 246. A gate pad electrode 244 is formed on the gate pad 206. The gate pad electrode 244 includes a transparent conductive layer and an opaque conductive layer.

A thin film transistor T is formed at a crossing point of the gate line 204 and the data line 246. The thin film transistor T includes a gate electrode 202, an active layer 222, an ohmic contact layer (not shown), a buffer metallic layer 226, a source electrode 236 and a drain electrode 238. The buffer metallic layer 226 contacts the ohmic contact layer and the source and drain electrodes 236 and 238.

Pixel electrodes 240 and common electrodes 242 are formed in the pixel region P along the second direction and are parallel to the data line 246. The pixel electrodes 240 and the common electrodes 242 alternate with each other. The pixel electrodes 240 are connected to the drain electrode 238. The common electrodes 242 are connected to the common line 208.

The array substrate of FIG. 14 is manufactured through 4 mask processes. Here, the active layer 222 is formed over and within the gate electrode 202, and there is no semiconductor layer under the data line 246. Thus, there is no light incident on the active layer 222 from a backlight under the array substrate.

FIGS. 15A, 15B, 15C and 15D are cross-sectional views of an array substrate according to the third embodiment of the present invention. FIGS. 15A, 15B, 15C and 15D correspond to the line IX-IX, the line X-X, the line XI-XI and the line XII-XII of FIG. 14, respectively.

In FIGS. 15A, 15B, 15C and 15D, a pixel region P, a gate region G, a data region D, a switching region S, and a common signal region CS are defined on a substrate 200. A thin film transistor is formed in the switching region S on the substrate 200. The thin film transistor includes a gate electrode 202, a first insulating layer 210, an active layer 222, an ohmic contact layer 224, a buffer metallic layer 226, and source and drain electrodes 236 and 238 that are sequentially formed. Each of the source and drain electrodes 236 and 238 includes only a transparent conductive layer 228. The buffer metallic layer 226 decreases contact resistance between the ohmic contact layer 224 and the transparent conductive layer 228.

A data line 246 is formed along a side of the pixel region P. The data line 246 is disposed in the data region D and is connected to the source electrode 236. A data pad 248 is formed at one end of the data line 246 in the data region D. Each of the data line 246 and the data pad 248 includes a transparent conductive layer 228 and an opaque conductive layer 230.

A gate line (not shown) is formed along another side of the pixel region P and crosses the data line 246. The gate line is formed in the same layer as and connected to the gate electrode 202. A gate pad 206 is formed at one end of the gate line in the gate region G. A gate pad electrode 244 is formed on the gate pad 206. The gate pad electrode 244 includes a transparent conductive layer 228 and an opaque conductive layer 230.

A common line 208 is formed in the common signal region CS. Although not shown in the figure, the common line 208 is parallel to the gate line. The first insulating layer 210 covers the gate electrode 202, the gate line (not shown), the gate pad 206, and the common line 208.

Pixel electrodes 240 and common electrodes 242 are formed in the pixel region P on the first insulating layer 210. The pixel electrodes 240 contact the drain electrode 238, and the common electrodes 242 contact the common line 208. The pixel electrodes 240 and the common electrodes 242 alternate with each other. Each of the pixel electrodes 240 and the common electrodes 242 includes a transparent conductive layer 228 and an opaque conductive layer 230, wherein the opaque conductive layer 230 has a narrower width than the transparent conductive layer 228 and the transparent conductive layer 228 is exposed. The exposed transparent conductive layer 228 increases an aperture area, and the brightness of the device is improved. A second insulating layer 250 covers the thin film transistor, the data line 246, the pixel electrodes 240, and the common electrodes 242 and exposes the gate pad electrode 244 and the data pad 248.

Here, the active layer 222 and the ohmic contact layer 224 are formed over and within the gate electrode 202, and there are no intrinsic amorphous silicon layer and impurity-doped amorphous silicon layer under the data line 246. Therefore, the wavy noise does not occur, and the aperture ratio is prevented from decreasing.

In addition, as stated above, since the source and drain electrodes 236 and 238 are transparent, the source and drain electrodes 236 and 238 do not reflect light from a backlight at a rear side of the substrate 200. Thus, the light from the backlight is prevented from going on the active layer 222, and the photo-leakage currents are not caused in the active layer 222.

A method of manufacturing the array substrate for an IPS mode LCD device through 4 mask processes will be explained hereinafter with reference to accompanying drawings.

FIGS. 16A to 16L, FIGS. 17A to 17L, FIGS. 18A to 18L, and FIGS. 19A to 19L illustrate an array substrate in processes of manufacturing the same according to the third embodiment of the present invention. FIGS. 16A to 16L are cross-sectional views along the line IX-IX of FIG. 14, FIGS. 17A to 17L are cross-sectional views along the line X-X of FIG. 14, FIGS. 18A to 18L are cross-sectional views along the line XI-XI of FIG. 14, and FIGS. 19A to 19L are cross-sectional views along the line XII-XII of FIG. 14.

FIG. 16A, FIG. 17A, FIG. 18A, and FIG. 19A show the array substrate in a first mask process. In FIG. 16A, FIG. 17A, FIG. 18A, and FIG. 19A, a switching region S, a pixel region P, a gate region G, a data region D, and a common signal region CS are defined on a substrate 200.

A first conductive metallic layer (not shown) is formed on the substrate 200, where the regions S, P, G, D and CS are defined, by depositing one or more selected from a conductive metallic group including aluminum (Al), aluminum alloy (AlNd), chromium (Cr), molybdenum (Mo), tungsten (W), titanium (Ti), copper (Cu), and tantalum (Ta). The first conductive metallic layer is patterned through a first mask process, and a gate electrode 202, a gate line (not shown), a gate pad 206 and a common line 208 are formed on the substrate 200. The gate electrode 202 is disposed in the switching region S, and the gate line and the gate pad 206 are disposed in the gate region G The gate pad 206 is formed at one end of the gate line. The common line 208 is disposed in the common signal region CS and is parallel to the gate line.

FIGS. 16B to 16F, FIGS. 17B to 17F, FIGS. 18B to 18F and FIGS. 19B to 19F show the array substrate in a second mask process.

In FIG. 16B, FIG. 17B, and FIG. 18B and FIG. 19B, a first insulating layer 210, an intrinsic amorphous silicon layer (a-Si:H) 212, an impurity-doped amorphous silicon layer (for example, n+ a-Si:H) 214, and a second conductive metallic layer 216 are sequentially formed substantially on an entire surface of the substrate 200 including the gate electrode 202, the gate line, the gate pad 206 and the common line 208. A photoresist layer 218 is formed on the second conductive metallic layer 216 by coating the substrate 200 with photoresist.

The first insulating layer 210 may be formed by depositing one or more selected from an inorganic insulating material group including silicon nitride ($SiN_x$) and silicon oxide ($SiO_2$). The second conductive metallic layer 216 may be formed of one selected from the above-mentioned conductive metallic group, and the second conductive metallic layer 216, beneficially, may be formed of a metallic material that can be dry-etched, for example, molybdenum (Mo).

A mask M is disposed over the photoresist layer 218. The mask M includes a light-transmitting portion B1, a light-blocking portion B2, and a light-half transmitting portion B3. The light-blocking portion B2 corresponds to the switching region S, the light-transmitting portion B1 corresponds to the common signal region CS and the gate region G for the gate pad 206, and the light-half transmitting portion B3 corresponds to other regions except the switching region S, the common signal region CS and the gate region G for the gate pad 206. The size of the light-blocking portion B2 corresponding to the switching region S is not larger than the gate electrode 202.

Next, the photoresist layer 218 is exposed to light through the mask M and then is developed.

In FIG. 16C, FIG. 17C, FIG. 18C and FIG. 19C, a photoresist pattern 220 is formed after developing the photoresist layer 218 of FIG. 16B, FIG. 17B, FIG. 18B and FIG. 19B. The photoresist pattern 220 has a first part of a first thickness in the switching region S and a second part of a second thickness in other regions except the switching region S, the gate region G for the gate pad 206, and the common signal region CS. The photoresist pattern 220 is removed in the gate region G for the gate pad 206 and the common signal region CS to expose the second conductive metallic layer 216. The first thickness is substantially the same as the original thickness of the photoresist layer FIG. 16B, FIG. 17B, FIG. 18B and FIG. 19B. The second thickness is thinner than the first thickness.

The exposed second conductive metallic layer 216, the impurity-doped amorphous silicon layer 214, the intrinsic amorphous silicon layer 212 and the first insulating layer 210 are removed in the gate region G for the gate pad 206 and in the common signal region CS.

In FIG. 16D, FIG. 17D, FIG. 18D and FIG. 19D, a common line contact hole CH1 and a gate pad contact hole CH2 are formed. The common line contact hole CH1 exposes the common line 208, and the gate pad contact hole CH2 exposes the gate pad 206.

Figure 16A:
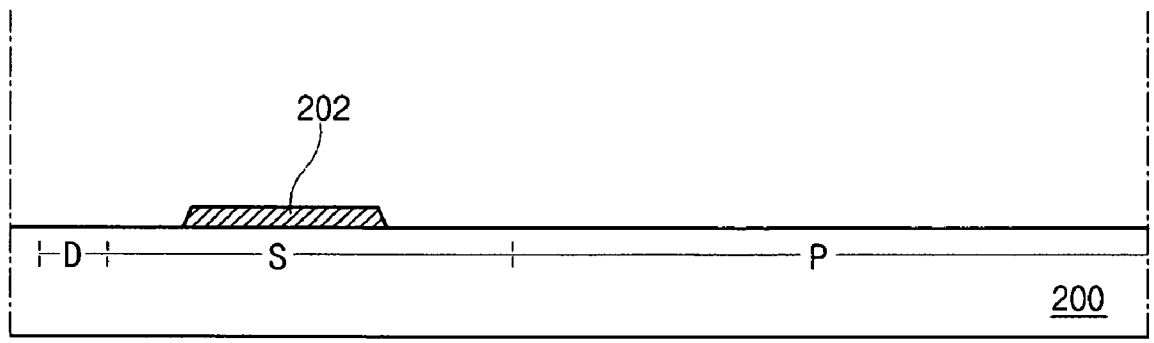
Figure 16B:
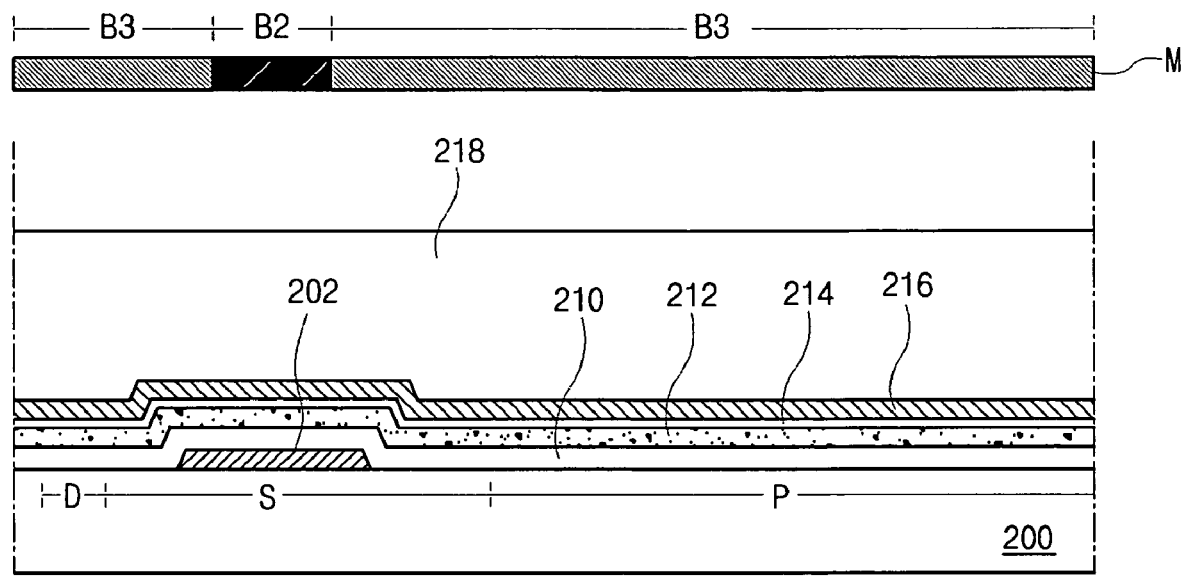
Figure 16C:
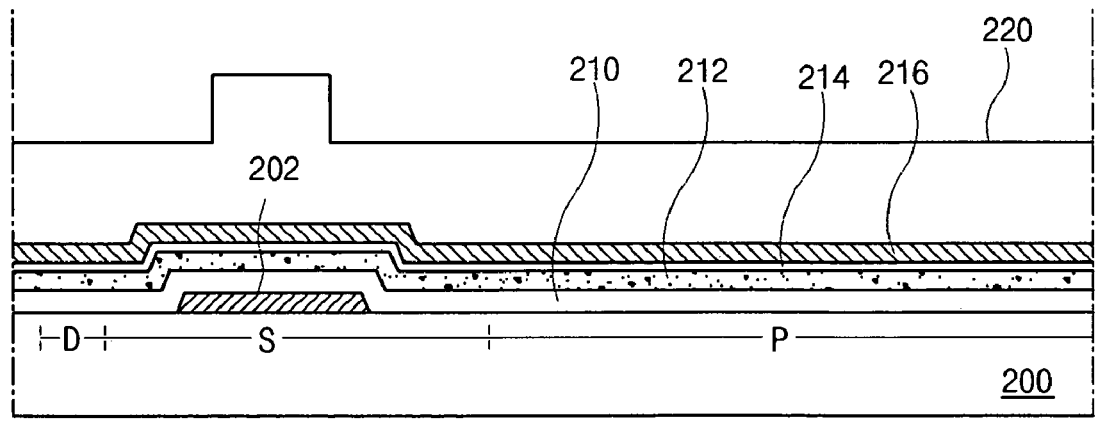
Figure 16D:
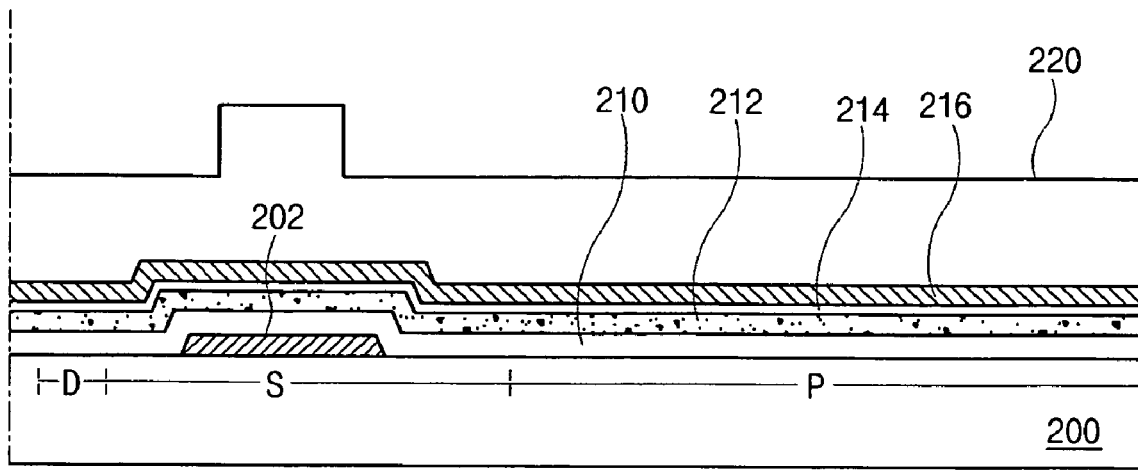
Figure 16E:
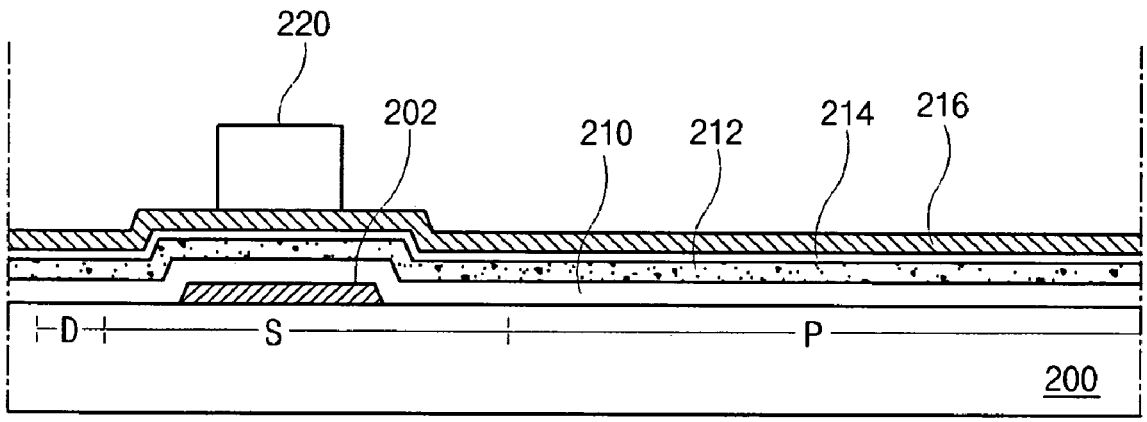
Figure 16F:
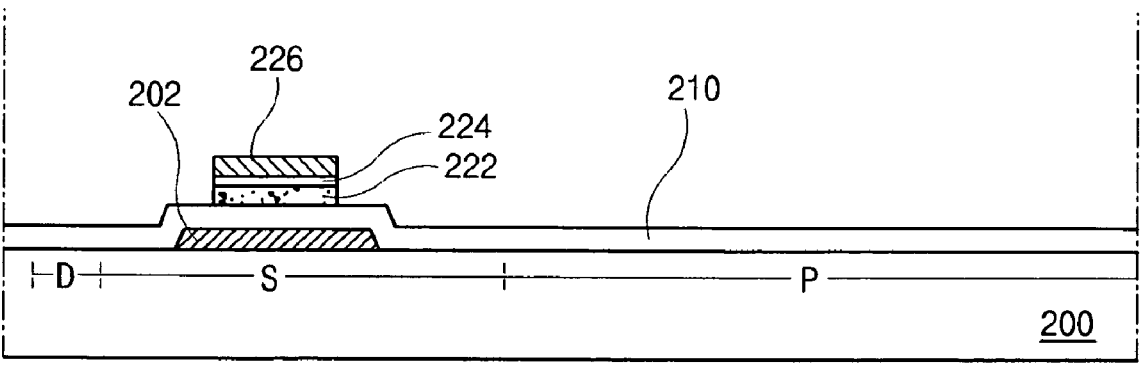
Figure 16G:
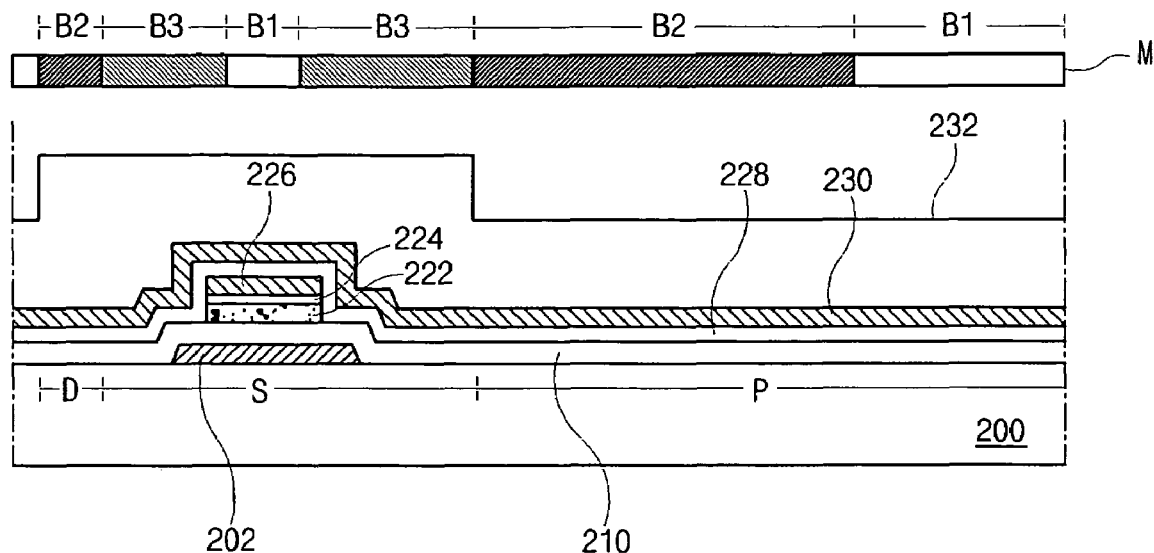
Figure 16H:
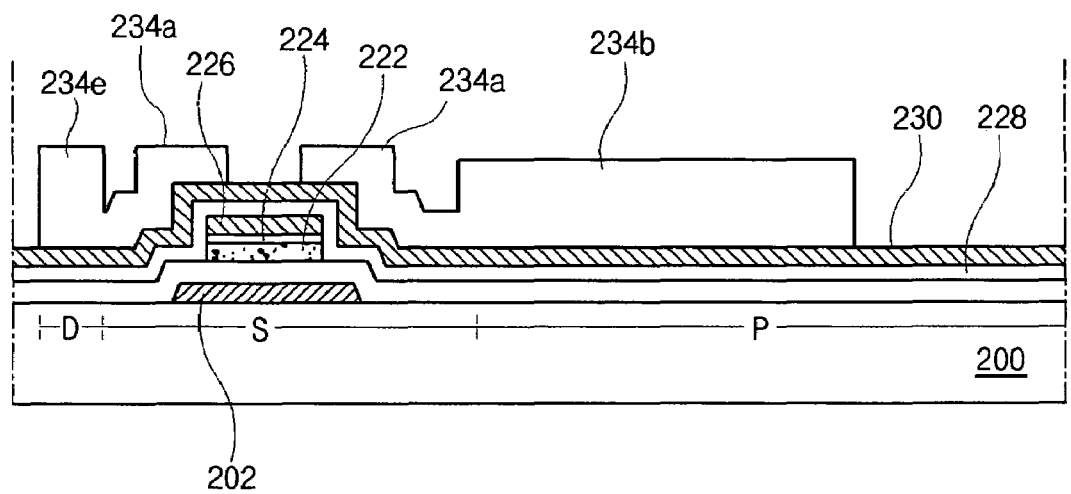
Figure 16I:
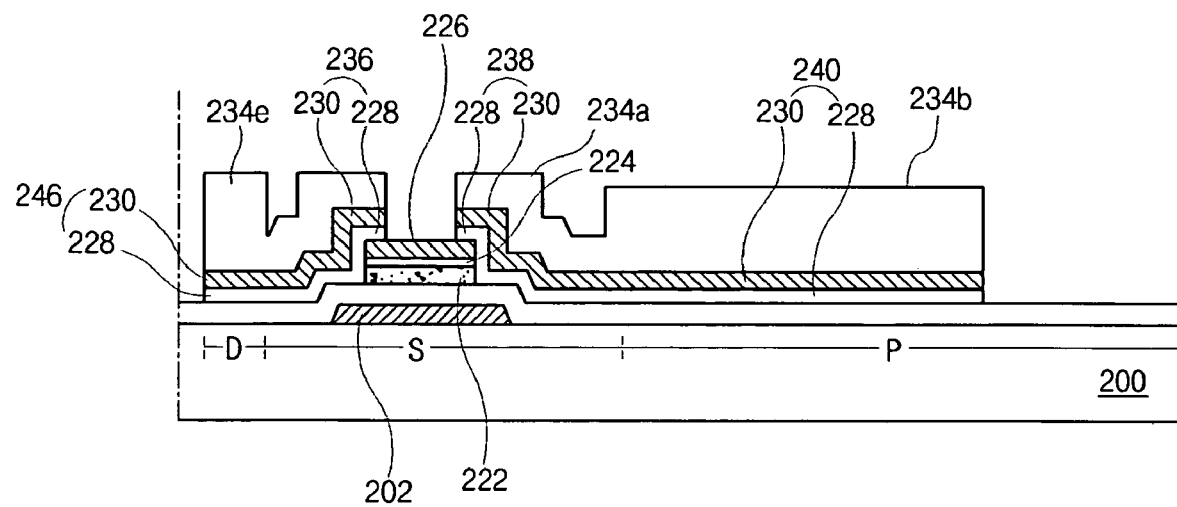
Figure 16J:
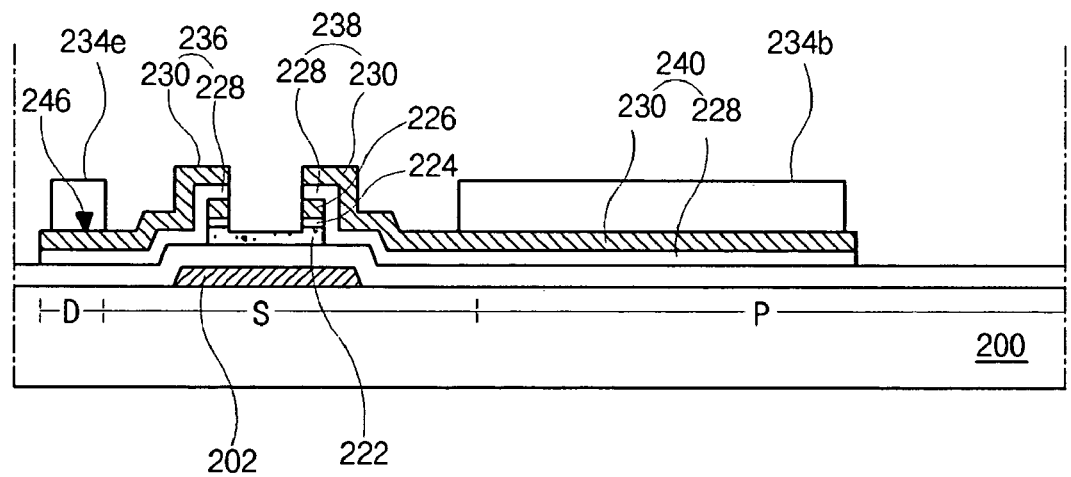
Figure 16K:
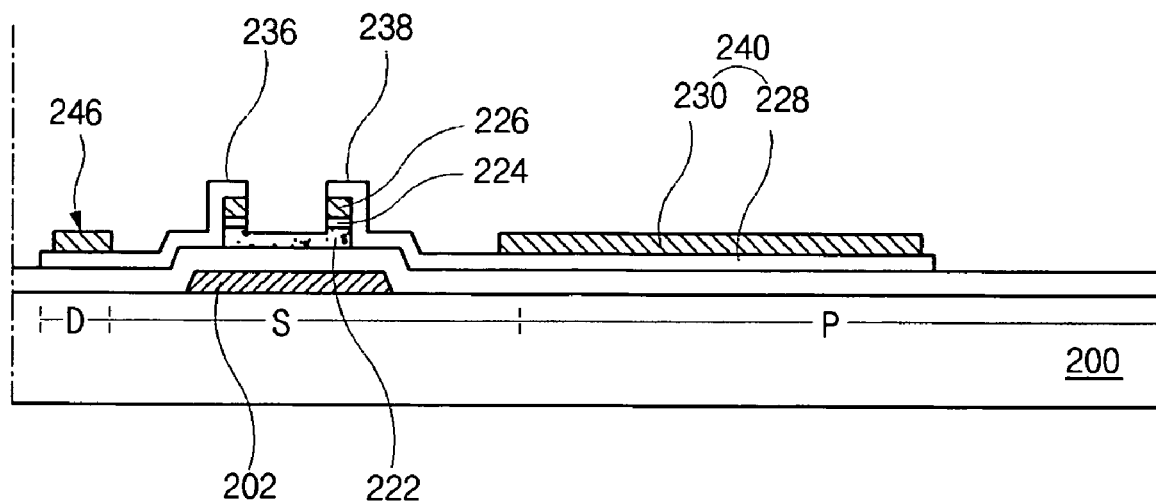
Figure 16L:
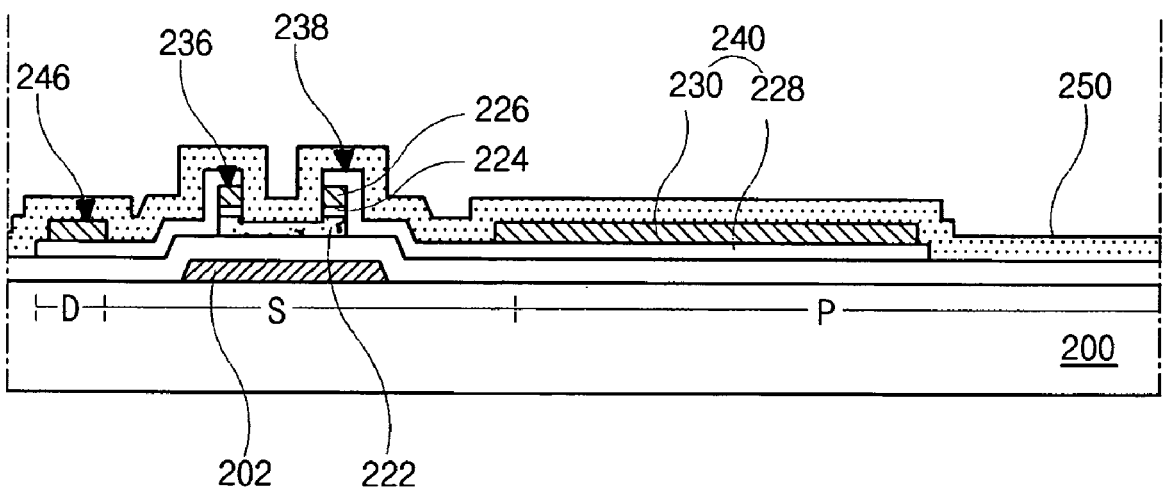
Figure 17C:
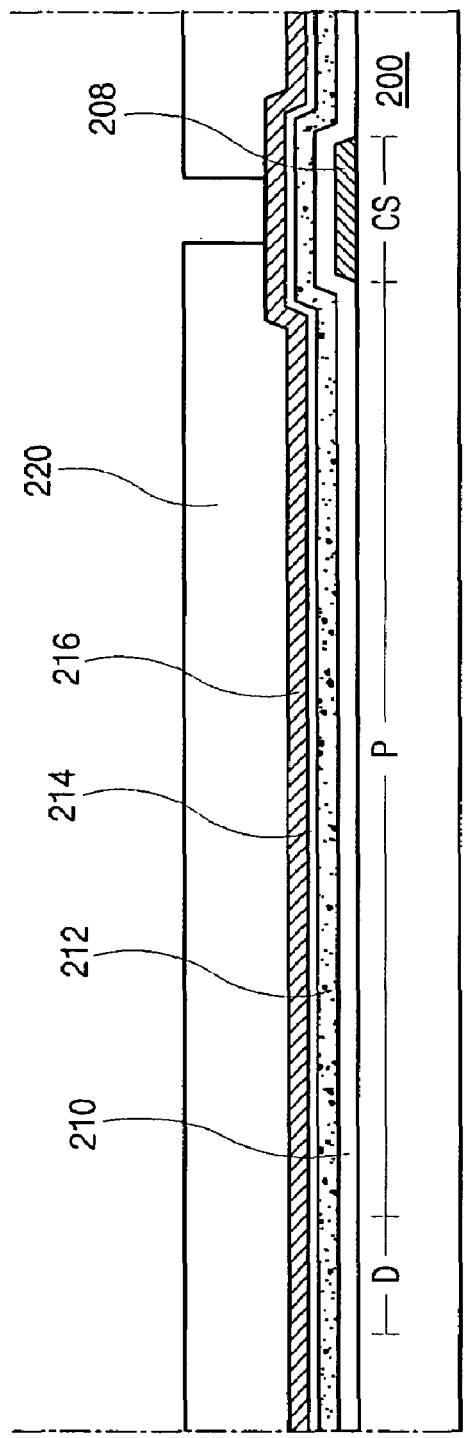
Figure 17D:
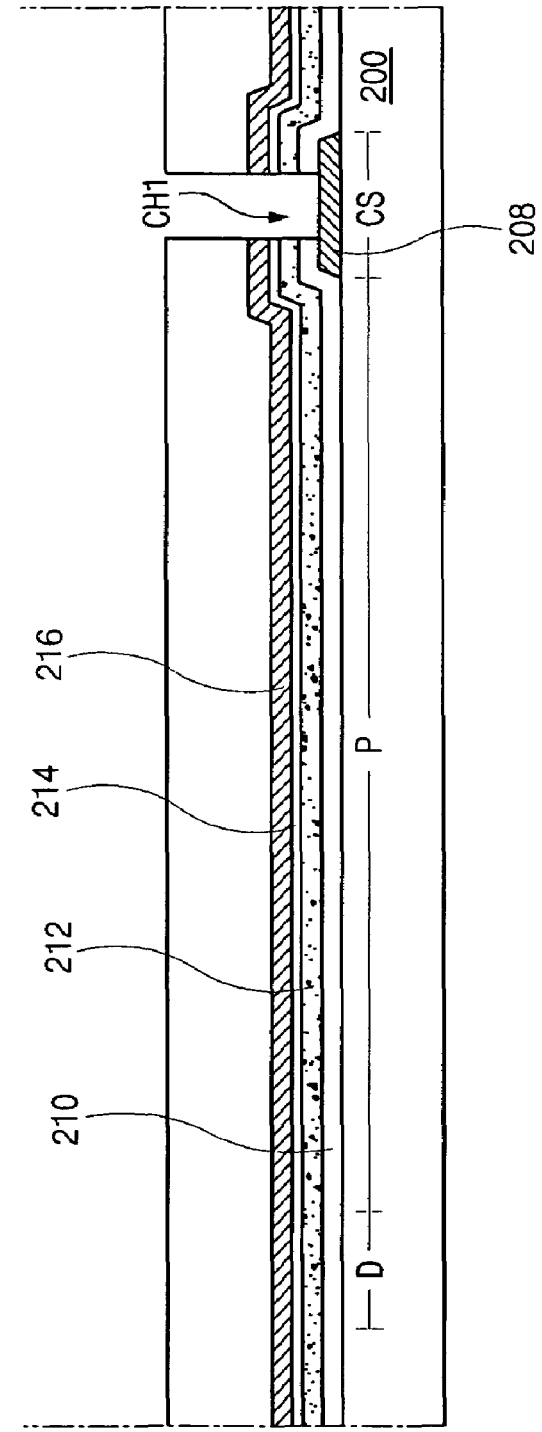
Figure 17G:
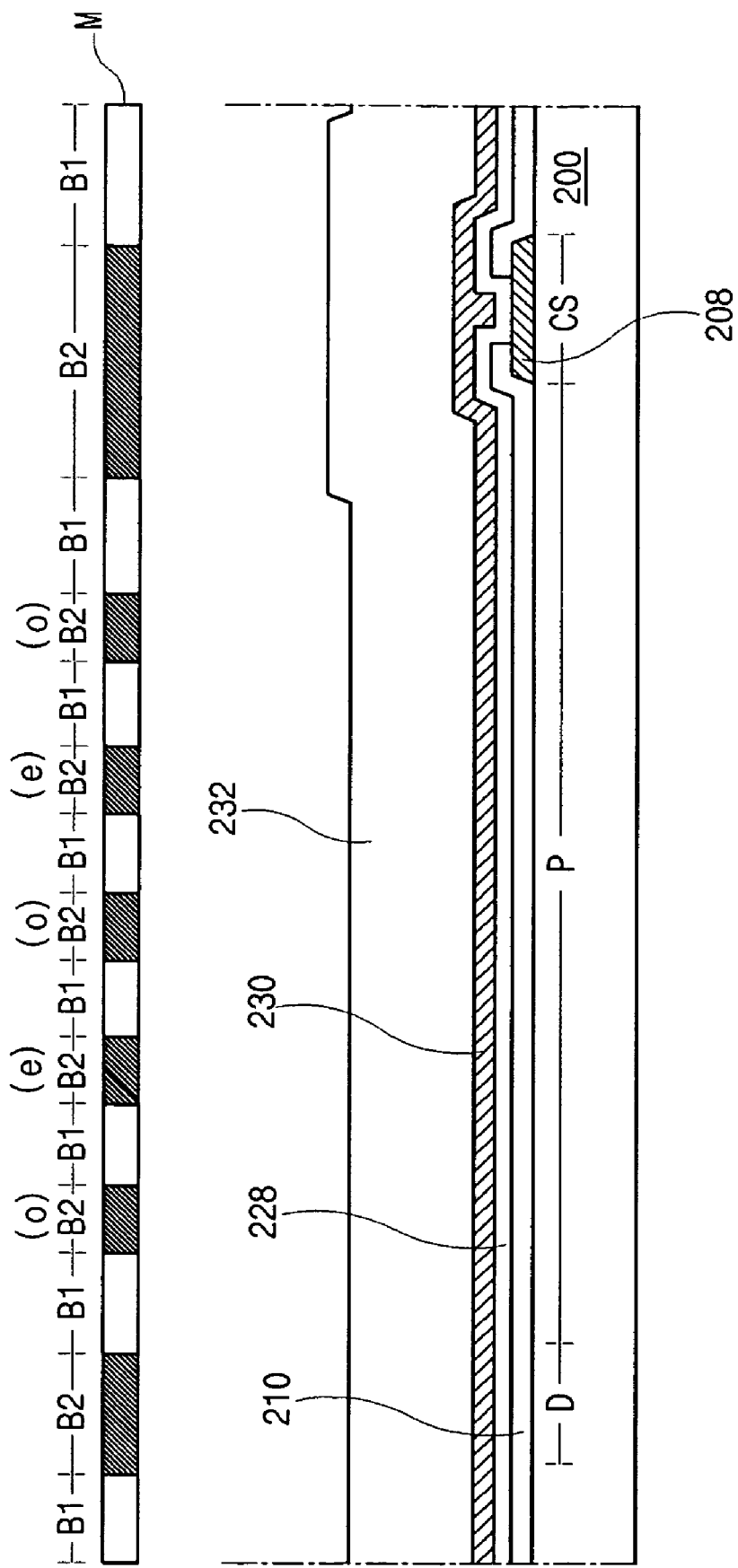
Figure 17H:
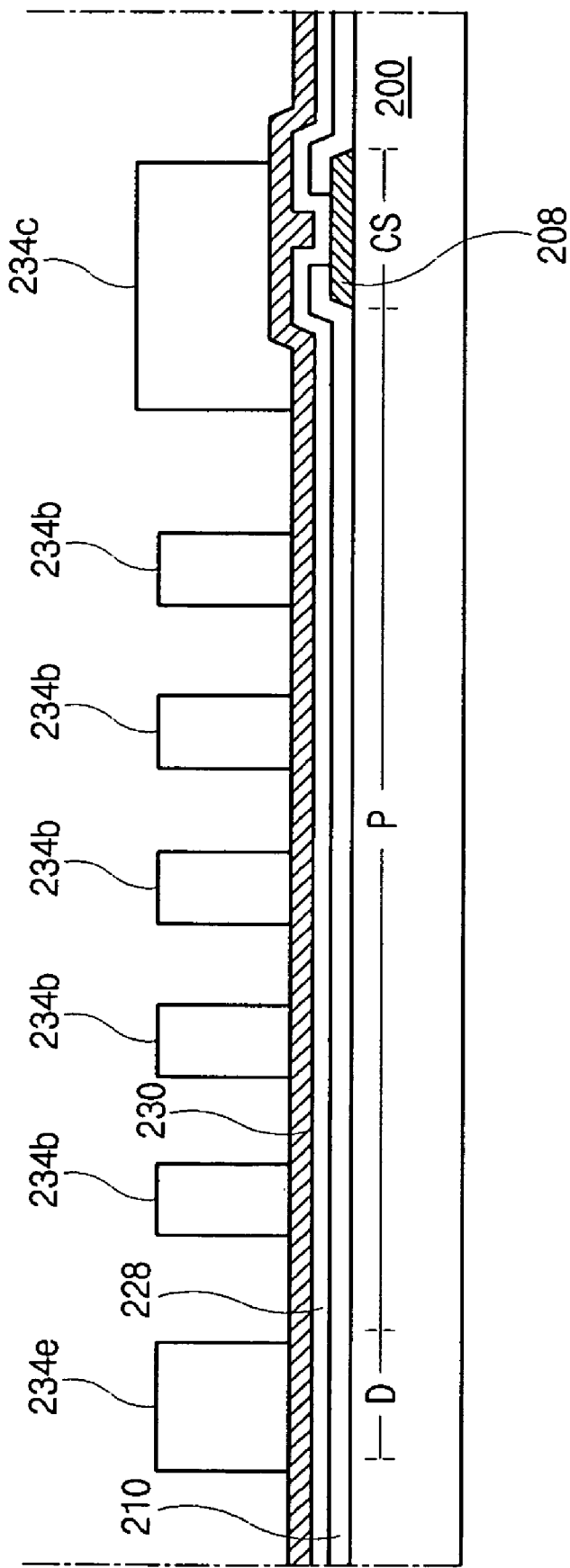
Figure 17I:
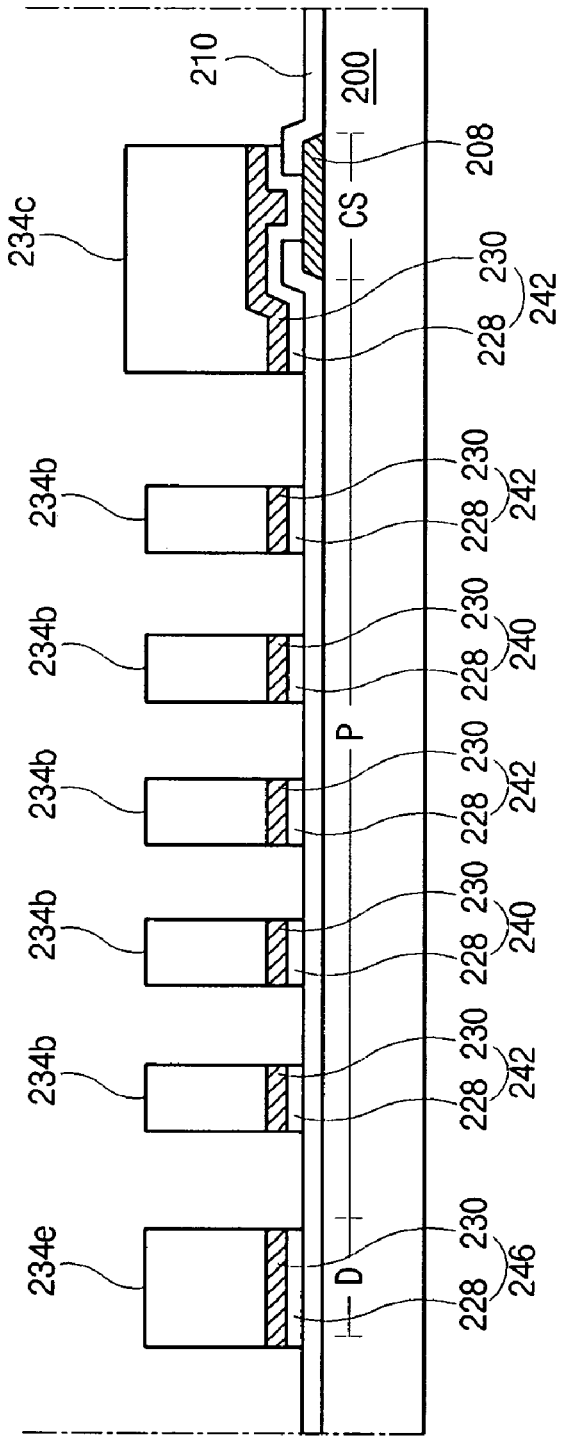
Figure 17J:
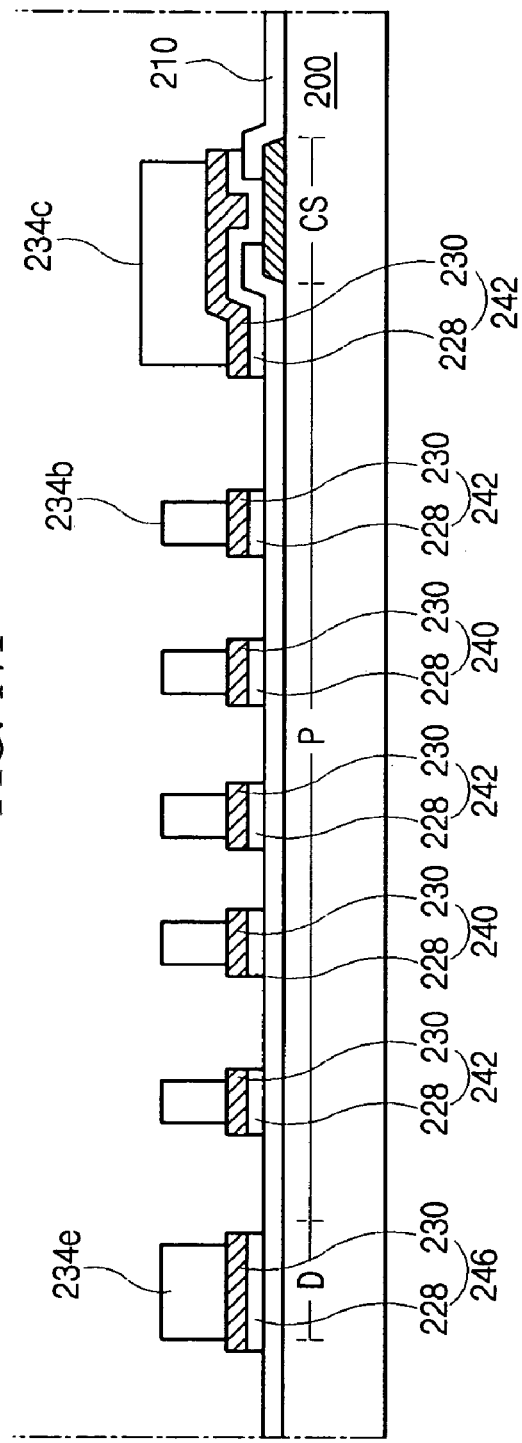
Figure 17K:
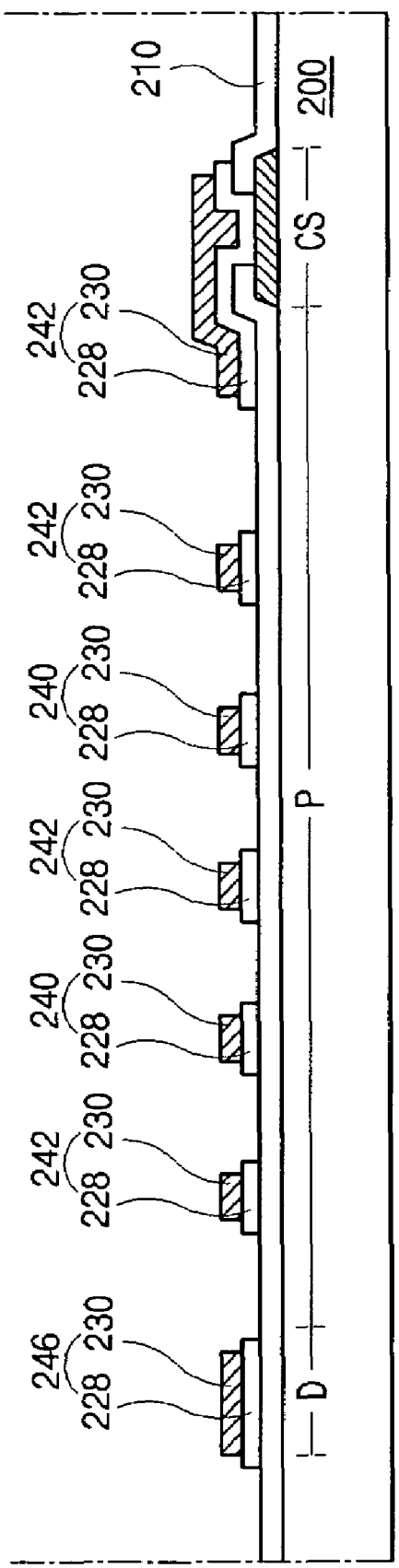
Figure 17L:
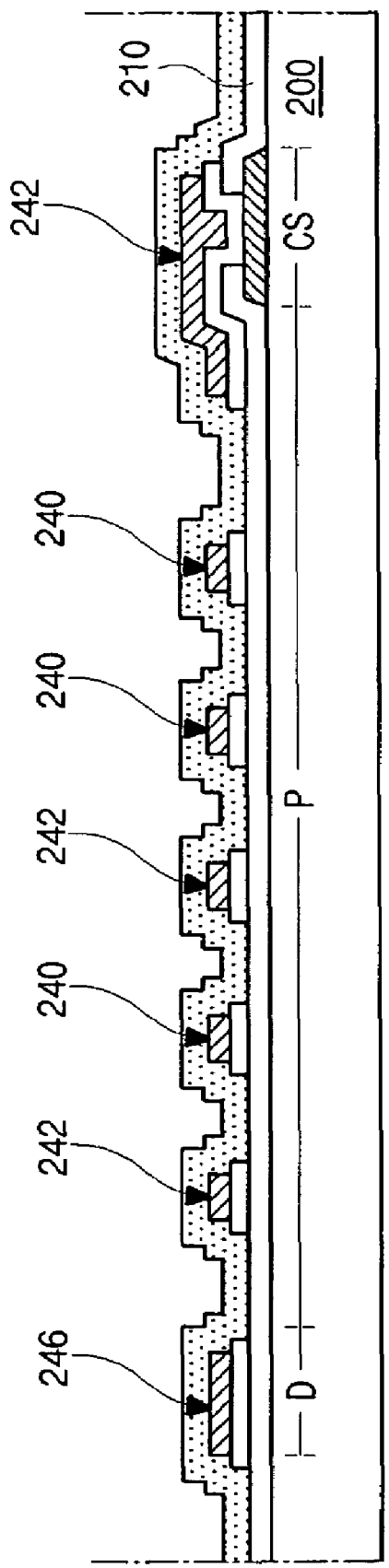

In FIG. 16E, FIG. 17E, FIG. 18E and FIG. 19E, an ashing process is performed to thereby remove the second part of the photoresist pattern 220 of FIGS. 16D, 17D, 18D, and 19D. At this time, the first part of the photoresist pattern 220 of FIG. 16D is also partially removed in the switching region S and has a reduced thickness. The second conductive metallic layer 216 is exposed in the other regions except the switching region S, the gate region G for the gate pad 206, and the common signal region CS.

The exposed second conductive metallic layer 216, the impurity-doped amorphous silicon layer 214, and the intrinsic amorphous silicon layer 212 are removed by using the photoresist pattern 220 as an etching mask. Then, the photoresist pattern 220 is removed.

In FIG. 16F, FIG. 17F, FIG. 18F and FIG. 19F, an active layer 222, an ohmic contact layer 224, and a buffer metallic layer 226 are formed in the switching region S. The common line 208 and the gate pad 206 are exposed through the common line contact hole CH1 and the gate pad contact hole CH2 of the first insulating layer 210, respectively.

FIGS. 16G to 16K, FIGS. 17G to 17K, FIGS. 18G to 18K and FIGS. 19G to 19K show the array substrate in a third mask process.

In FIG. 16G, FIG. 17G, FIG. 18G and FIG. 19G, a transparent conductive layer 228 and an opaque conductive layer 230 are sequentially formed substantially on an entire surface of the substrate 200. A photoresist layer 232 is formed on the opaque conductive layer 230 by coating the substrate 200 with photoresist. The transparent conductive layer 228 is formed of one selected from a transparent conductive material group including indium tin oxide (ITO) and indium zinc oxide (IZO). The opaque conductive layer 230 is formed of one selected from the above-mentioned conductive metallic group.

A mask M is disposed over the photoresist layer 232. The mask M includes a light-transmitting portion B1, a light-blocking portion B2 and a light-half transmitting portion B3. The light-half transmitting portion B3 corresponds to both sides of the switching region S. The light-blocking portion B2 corresponds to the gate region G for the gate pad 206, the data region D, and a part of the common signal region CS. In the pixel region P, the light-transmitting portion B1 and the light-blocking portion B2(o, e) alternate with each other. The light-transmitting portion B1 corresponds to the center of the switching region S between the both sides of the switching region S and other regions.

Although not shown in the figure, the light-blocking portion B2(o, e) corresponding to the pixel region P includes bar-type parts. Odd parts of the light-blocking portion B2(o) of the pixel region P are united with the light-blocking portion B2 of the common signal region CS, and even parts of the light-blocking portion B2(e) of the pixel region P are united with a part of the light-half transmitting portion B3 of the switching region S.

The photoresist layer 232 is exposed to light through the mask M and then is developed.

In FIG. 16H, FIG. 17H, FIG. 18H and FIG. 19H, first, second, third, fourth and fifth photoresist patterns 234a, 234b, 234c, 234d and 234e are formed. The first photoresist pattern 234a is disposed in the switching region S. The first photoresist pattern 234a includes two parts spaced apart from each other. The second photoresist pattern 234b includes a plurality of parts spaced apart from each other in the pixel region P. The third photoresist pattern 234c is disposed in the common signal region CS and is united with the odd parts of the second photoresist pattern 234b. The even parts of the second photoresist pattern 234b are united with one part of the first photoresist pattern 234a. The fourth photoresist pattern 234d is disposed in the gate region G for the gate pad 206. The fifth photoresist pattern 234e is disposed in the data region D. The first photoresist pattern 234a has a thinner thickness than the second, third, fourth and fifth photoresist patterns 234b, 234c, 234d and 234e.

The opaque conductive layer 230 and the transparent conductive layer 228 are removed by using the first, second, third, fourth and fifth photoresist patterns 234a, 234b, 234c, 234d and 234e as an etching mask.

In FIG. 16I, FIG. 17I, FIG. 18I and FIG. 19I, a source electrode 236, a drain electrode 238, pixel electrodes 240, common electrodes 242, a gate pad electrode 244, a data pad 248, and a data line 246 are formed. The source electrode 236 and the drain electrode 238 are formed under the first photoresist pattern 234a in the switching region S. The pixel electrodes 240 are formed under the even parts of the second photoresist pattern 234b in the pixel region P. The pixel electrodes 240 are connected to the drain electrode 238. The common electrodes 242 are formed under the odd parts of the second photoresist pattern 234b in the pixel region P and the third photoresist pattern 234c in the common signal region CS. The common electrodes 242 are connected to the common line 208. The common electrodes 242 alternate with the pixel electrodes 240. The gate pad electrode 244 is formed under the fourth photoresist pattern 234d in the gate region G and contacts the gate pad 206. The data pad 248 and the data line 246 are formed under the fifth photoresist pattern 234e in the data region D. The data pad 248 is disposed at one end of the data line 246.

Each of the source and drain electrodes 236 and 238, the pixel electrodes 240, the common electrodes 242, the gate pad electrode 244, the data pad 248 and the data line 246 includes the transparent conductive layer 228 and the opaque conductive layer 230 sequentially deposited.

The buffer metallic layer 226 is exposed between the source and drain electrodes 236 and 238. The exposed buffer metallic layer 226 and the ohmic contact layer 224 are removed between the source and drain electrodes 236 and 238. In the switching region S, the active layer 222 is exposed between the source and drain electrodes 236 and 238. Next, the first photoresist pattern 234a is removed through an ashing process.

In FIG. 16J, FIG. 17J, FIG. 18J and FIG. 19J, the opaque conductive layer 230 of the source and drain electrode 236 and 238 is exposed in the switching region S. The source and drain the second, third, fourth and fifth photoresist patterns 234b, 234c, 234d and 234e are also partially removed through the ashing process and have reduced thicknesses.

The opaque conductive layers 230 of the source and drain electrodes 236 and 238 are removed, and then the second, third, fourth and fifth photoresist patterns 234b, 234c, 234d and 234e are removed.

In FIG. 16K, FIG. 17K, FIG. 18K and FIG. 19K, the source and drain electrodes 236 and 238 are disposed in the switching region S, the pixel electrodes 240 and the common electrodes 242 are disposed in the pixel region P, the gate pad electrode 244 is disposed in the gate region G, and the data line 246 and the data pad 248 are disposed in the data region D. The source and drain electrodes 236 and 238 include only the transparent conductive layer. Each of the pixel electrodes 240, the common electrodes 242, the gate pad electrode 244, the data line 246 and the data pad 248 includes the transparent conductive layer 228 and the opaque conductive layer 230. The opaque conductive layer 230 is partially removed at edges thereof and has a narrower width than the transparent conductive layer 228 to expose the transparent conductive layer 228. The exposed part of the transparent conductive layer 228 functions as the aperture area, and the brightness of the device increases.

FIG. 16L, FIG. 17L, FIG. 18L and FIG. 19L show the array substrate in a fourth mask process. In FIG. 16L, FIG. 17L, FIG. 18L and FIG. 19L, a second insulating layer 250 is formed substantially on an entire surface of the substrate 200 by depositing one or more selected from the above-mentioned inorganic insulating material group. The second insulating layer 250 is patterned through a fourth mask process, and the gate pad electrode 244 and the data pad 248 are exposed.

Like this, the array substrate for an IPS mode LCD device may be manufactured through 4 mask processes according to the second embodiment.

Here, the amorphous silicon layer does not exist under the data line and is disposed over and within the gate electrode. Thus, light from a backlight disposed at a rear side of the substrate 200 is prevented from going into the amorphous silicon layer.

In addition, since the source and drain electrodes 236 and 238 are transparent, the source and drain electrodes 236 and 238 do not reflect light from the backlight. Thus, the light is prevented from going on the active layer 222, and the photo-leakage currents are not caused in the active layer 222.

In a fourth embodiment, the source and drain electrodes of the transparent conductive layer and the data line of the transparent conductive layer and the opaque conductive layer can be formed through the same process due to etching properties of the transparent conductive layer and the opaque conductive layer. The method of manufacturing an array substrate according to the fourth embodiment will be described hereinafter with reference to accompanying drawings. Here, first, second and fourth mask processes of the second embodiment are the same as those of the first embodiment, and explanation of the first, second and fourth mask processes will be omitted.

FIGS. 20A to 20D and FIGS. 21A to 21D show an array substrate in a third mask process according to the fourth embodiment. FIGS. 20A to 20D are cross-sectional views along the line IX-IX of FIG. 14. FIGS. 21A to 21D are cross-sectional views along the line X-X of FIG. 14. FIGS. 22A and 22B are schematic plan views of showing a data line, a source electrode and a drain electrode in the fourth embodiment. FIG. 22A corresponds to the area F1 of FIG. 20C, and FIG. 22B corresponds to the area F2 of FIG. 20D. The structures and steps for a gate pad portion and a data pad portion are the same as those in the first embodiment, and thus drawings for the gate pad portion and the data pad portion will be abbreviated.

A gate electrode 202, a first insulating layer 210, an active layer 222, an ohmic contact layer 224 and a buffer metallic layer 226 are sequentially formed in the switching region S on the substrate 200 through the first and second mask processes. The first insulating layer 210 covers substantially an entire surface of the substrate 200 and exposes the gate pad 206 of FIG. 18G.

Figure 20A:
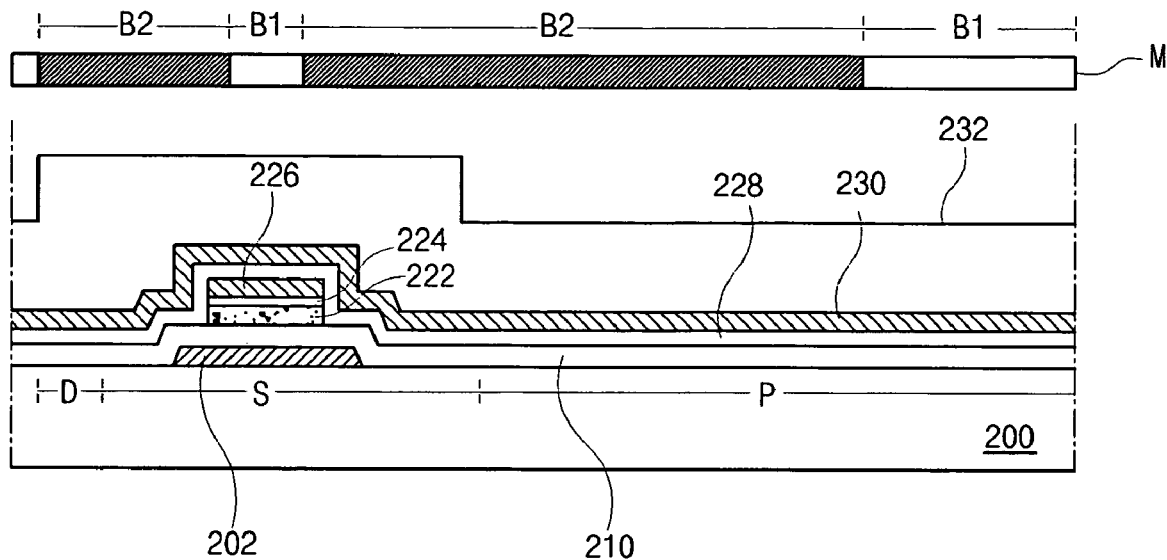
FIGS. 20A to 20D and FIGS. 21A to 21D are cross-sectional views of an array substrate in a third mask process according to a fourth embodiment.
Figure 21A:
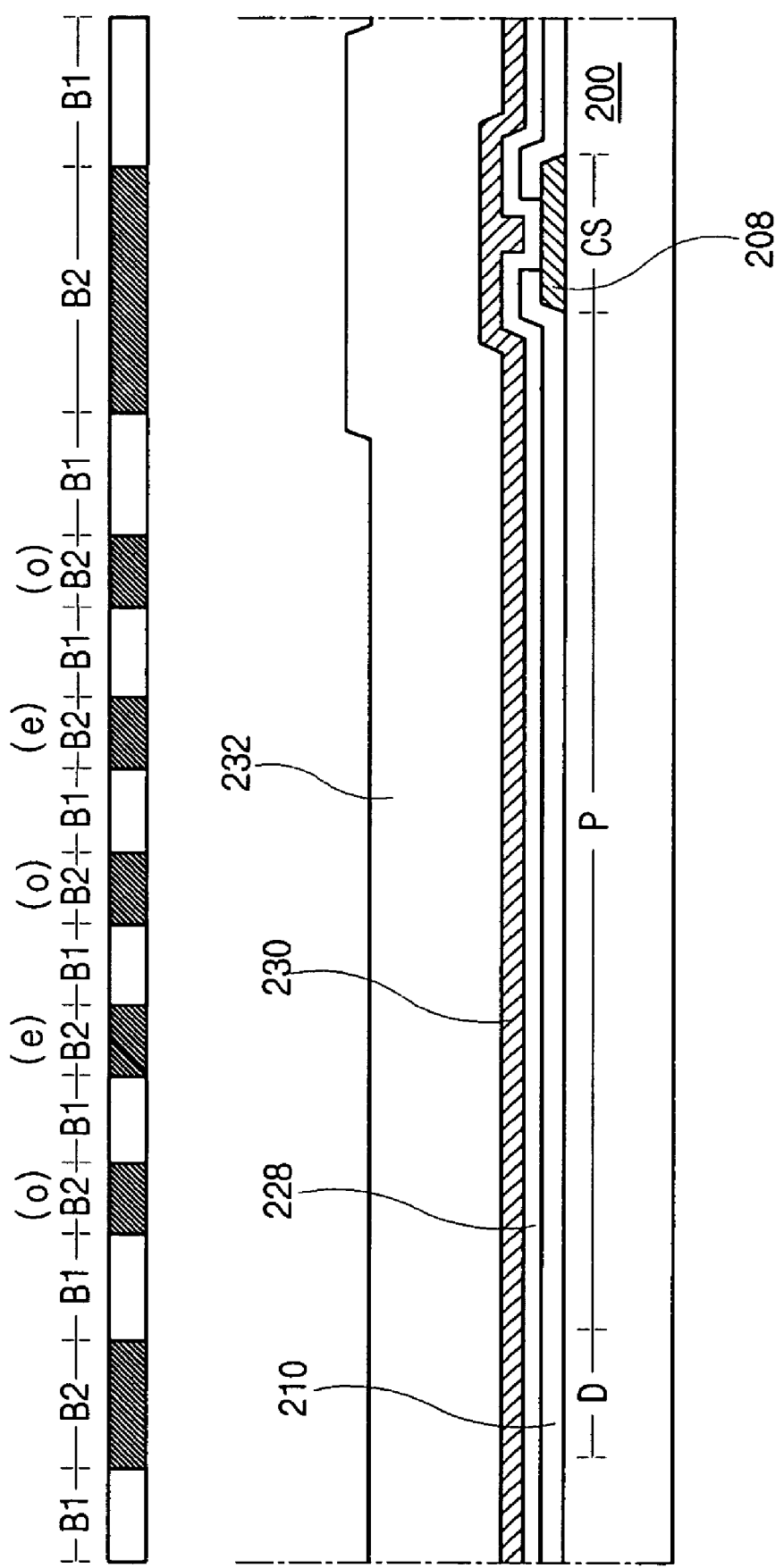
Figure 22A:
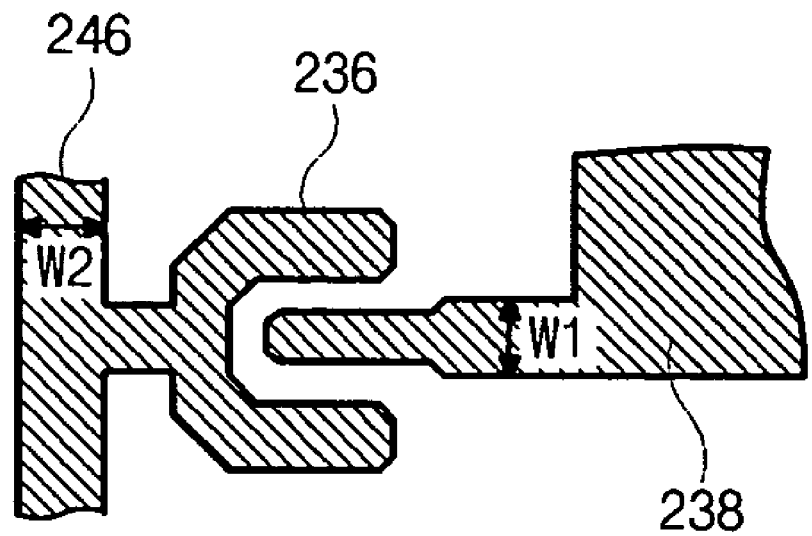
FIGS. 22A and 22B are schematic plan views of showing a data line, a source electrode and a drain electrode in the fourth embodiment.
Figure 22B:
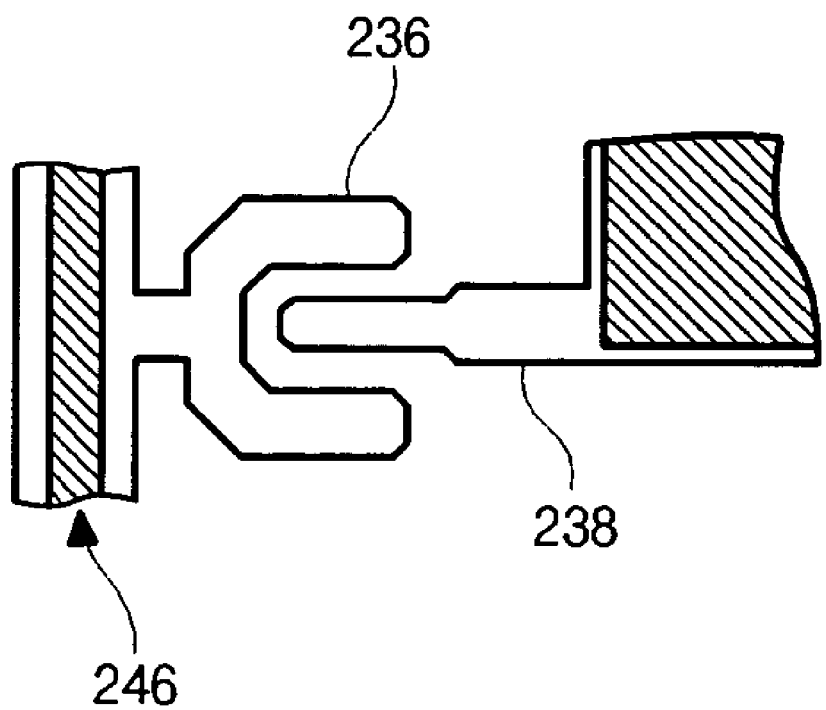

In FIG. 20A and FIG. 21A, a transparent conductive layer 228 and an opaque conductive layer 230 are sequentially formed substantially on an entire surface of the substrate 200. A photoresist layer 232 is formed on the opaque conductive layer 230 by coating the substrate 200 with photoresist. The transparent conductive layer 228 is formed of one selected from a transparent conductive material group including indium tin oxide (ITO) and indium zinc oxide (IZO). The opaque conductive layer 230 is formed of one selected from the above-mentioned conductive metallic group.

A mask M is disposed over the photoresist layer 232. The mask M includes a light-transmitting portion B1 and a light-blocking portion B2. The light-blocking portion B2 corresponds to both sides of the switching region S, the gate region G for the gate pad 206 of FIG. 18G, the data region D, and a part of the common signal region CS. In the pixel region P, the light-transmitting portion B1 and the light-blocking portion B2(o, e) alternate with each other. The light-transmitting portion B1 corresponds to the center of the switching region S between the both sides of the switching region S and other regions.

Although not shown in the figure, the light-blocking portion B2(o, e) corresponding to the pixel region P includes bar-type parts. Odd parts of the light-blocking portion B2(o) of the pixel region P are united with the light-blocking portion B2 of the common signal region CS, and even parts of the light-blocking portion B2(e) of the pixel region P are united with a part of the light-blocking portion B2 of the switching region S.

The photoresist layer 132 is exposed to light through the mask M and then is developed.

Figure 18A:
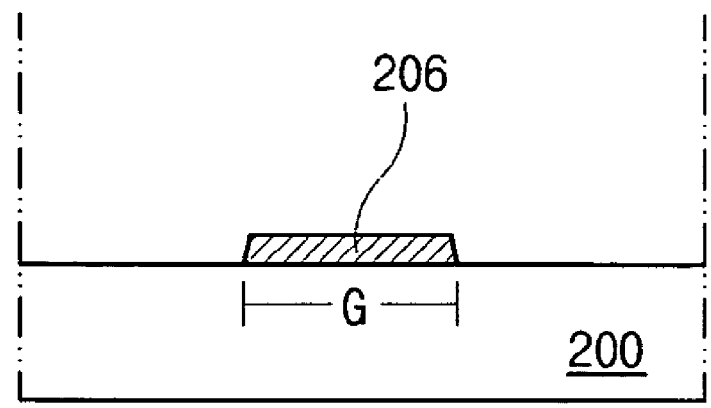
Figure 18B:
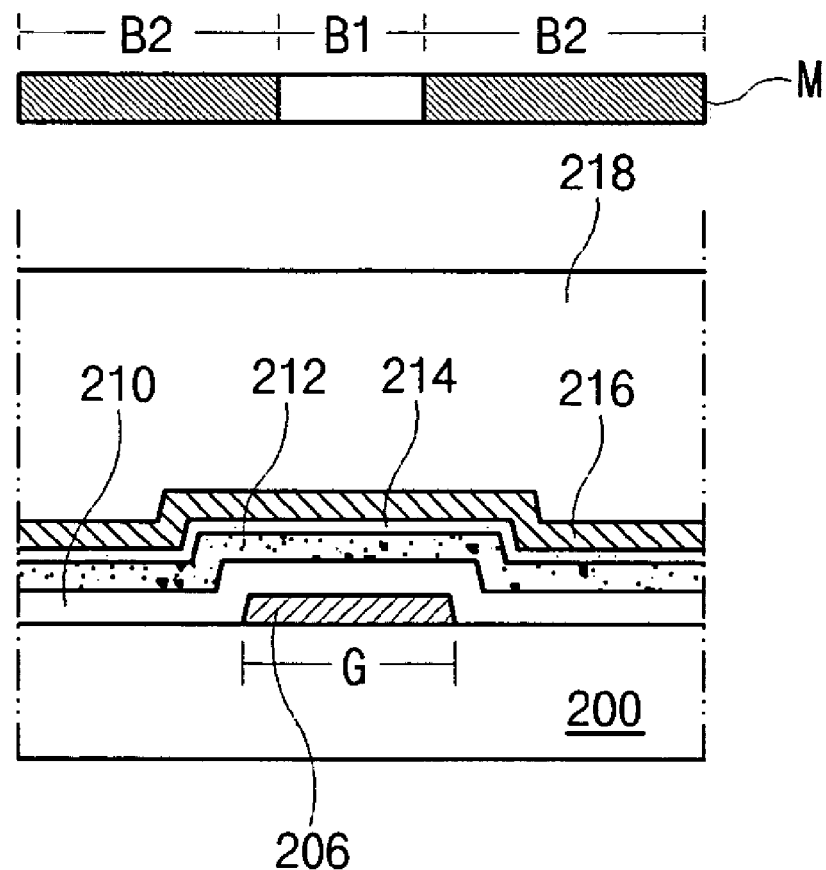
Figure 18C:
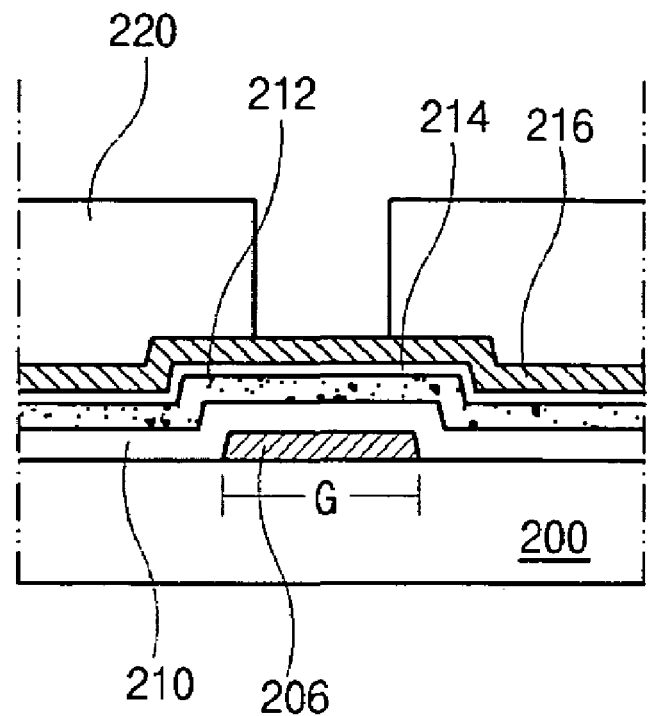
Figure 18D:
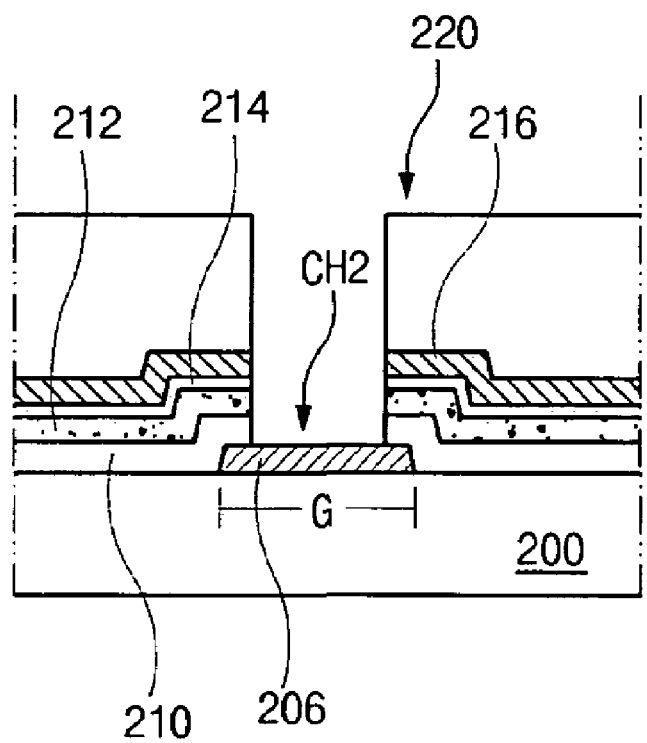
Figure 18E:
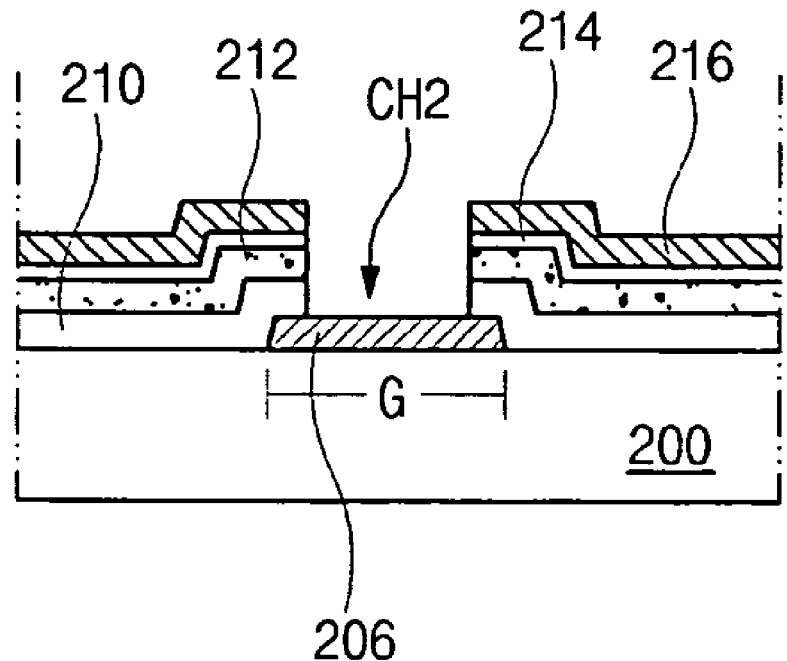
Figure 18F:
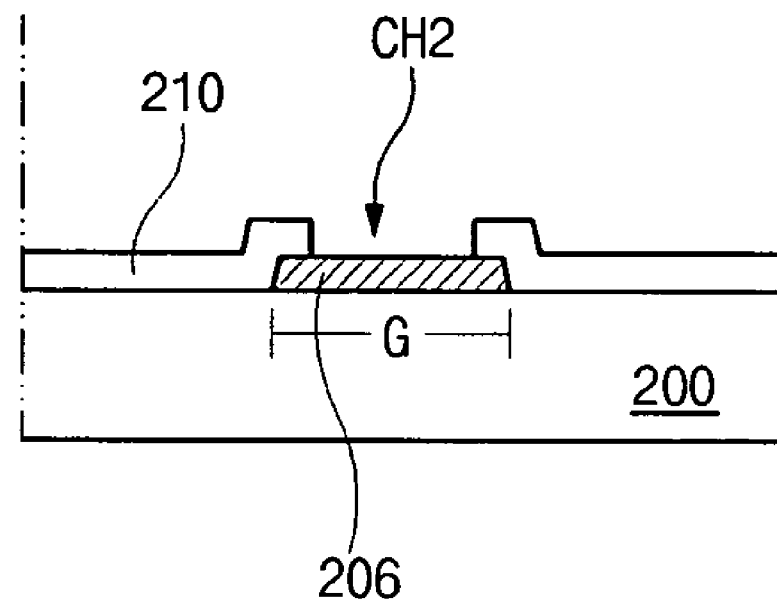
Figure 18G:
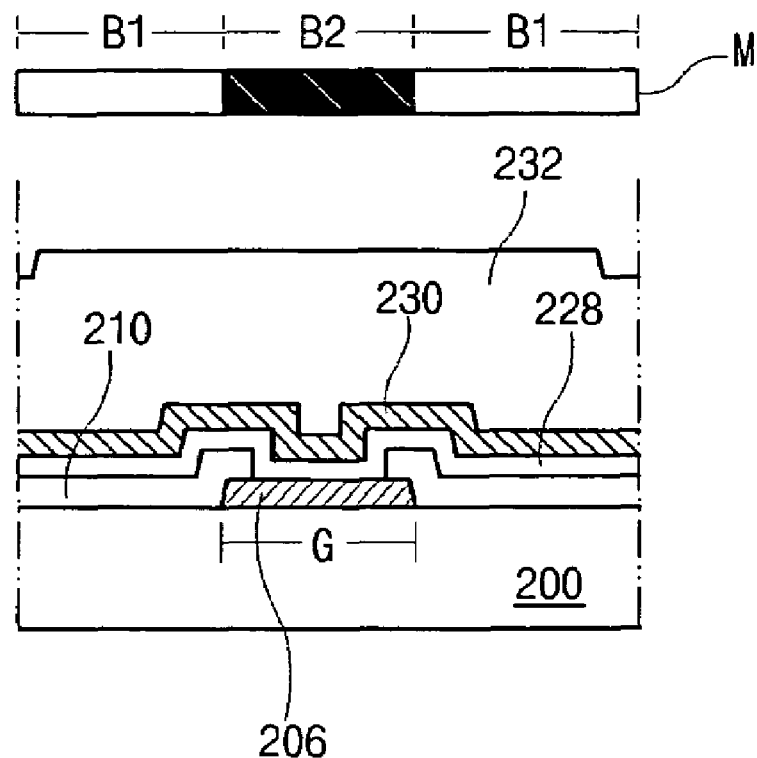
Figure 18H:
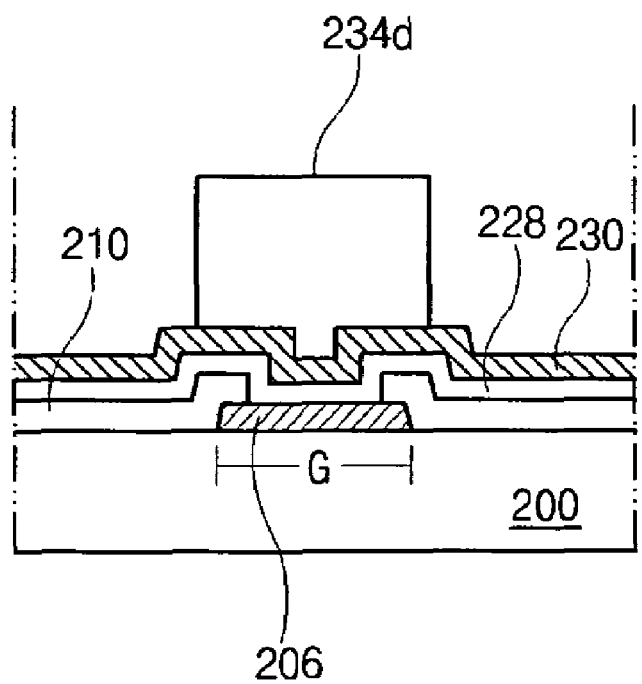
Figure 20B:
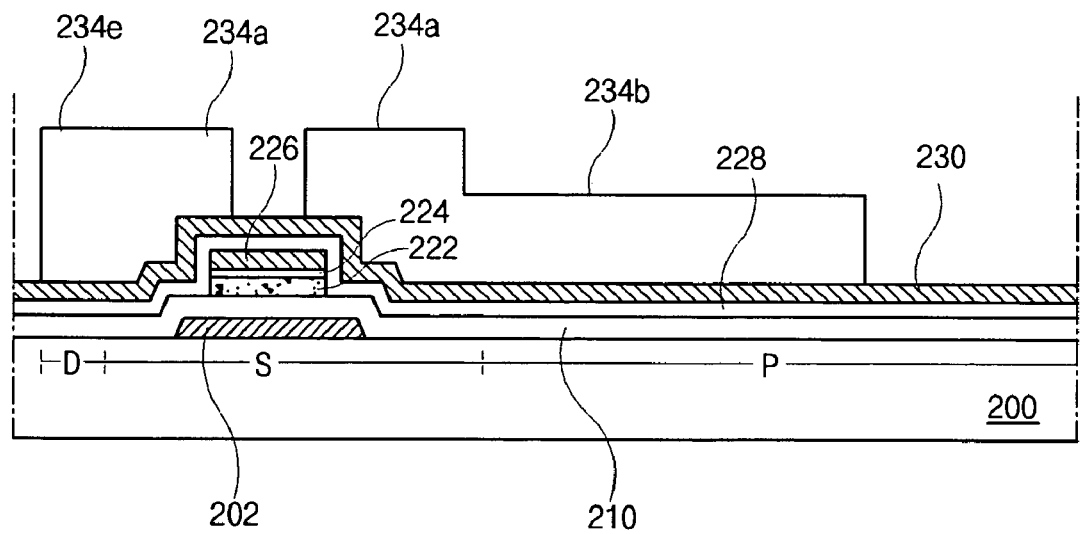
Figure 21B:
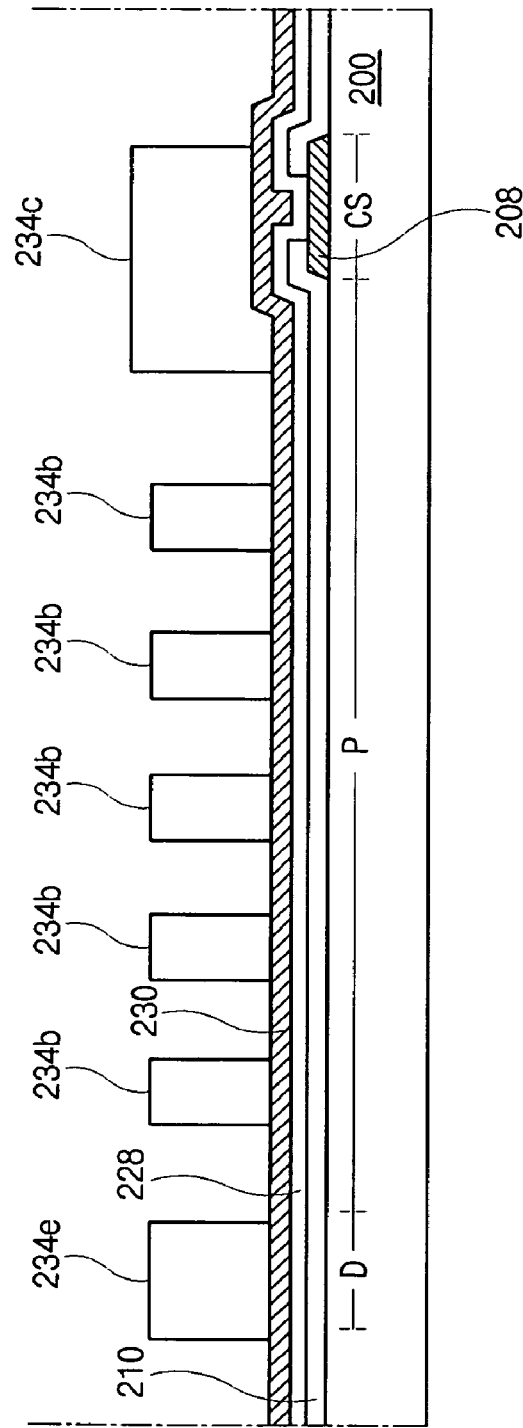

In FIG. 20B and FIG. 21B, first, second, third, fourth and fifth photoresist patterns 234a, 234b, 234c, 234d of FIG. 18H and 234e are formed. The first photoresist pattern 234a is disposed in the switching region S. The first photoresist pattern 234a includes two parts spaced apart from each other. The second photoresist pattern 234b includes a plurality of parts spaced apart from each other in the pixel region P. The third photoresist pattern 234c is disposed in the common signal region CS and is united with the odd parts of the second photoresist pattern 234b. The even parts of the second photoresist pattern 234b are united with one part of the first photoresist pattern 234a. The fourth photoresist pattern 234d of FIG. 18H is disposed in the gate region G for the gate pad 206. The fourth photoresist pattern 234e is disposed in the data region D.

The opaque conductive layer 230 and the transparent conductive layer 228 are removed by using the first, second, third, fourth and fifth photoresist patterns 234a, 234b, 234c, 234d and 234e as an etching mask.

Figure 18I:
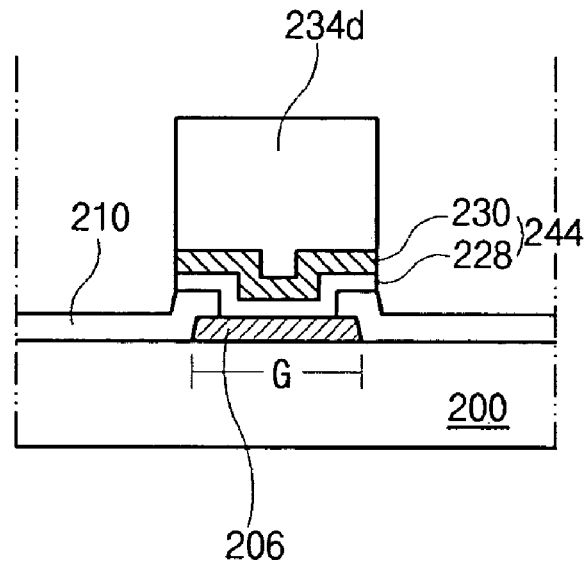
Figure 18J:
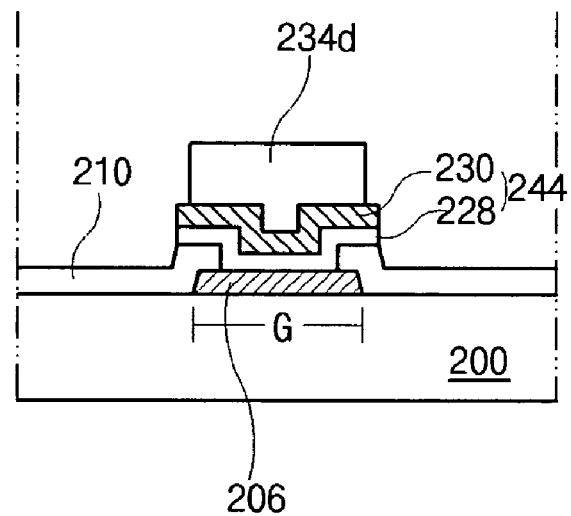
Figure 18K:
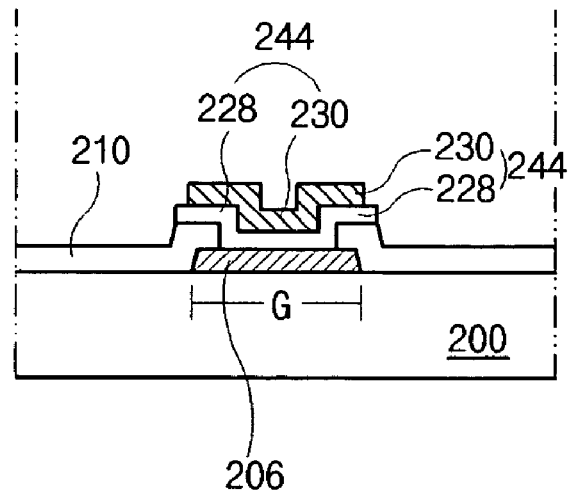
Figure 18L:
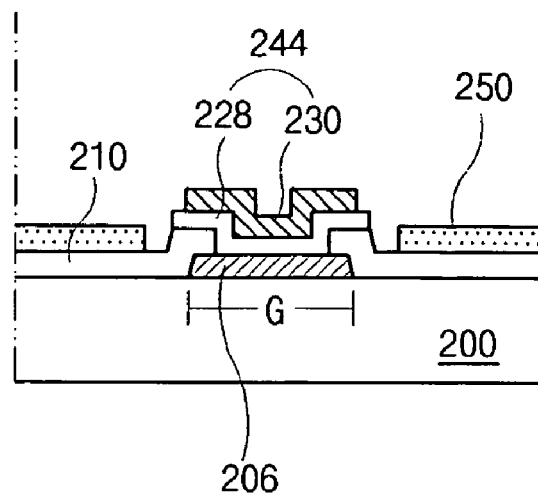
Figure 19A:
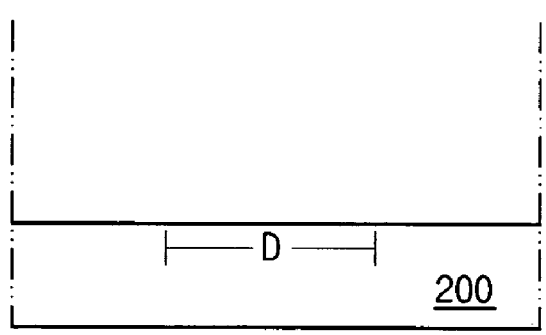
Figure 19B:
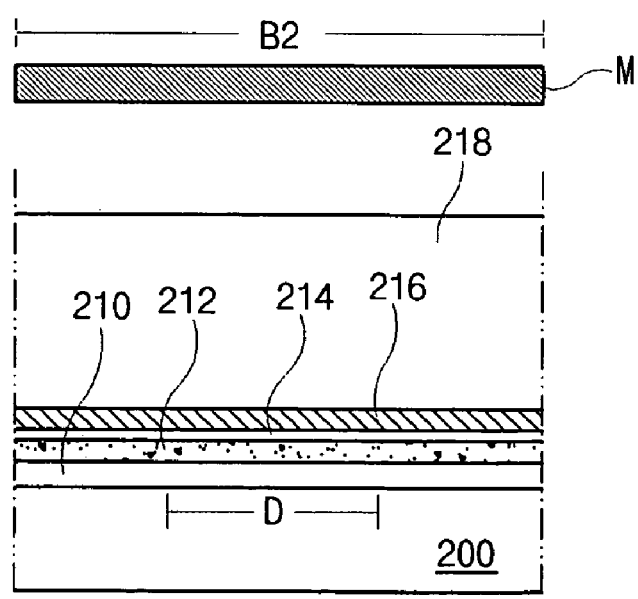
Figure 19C:
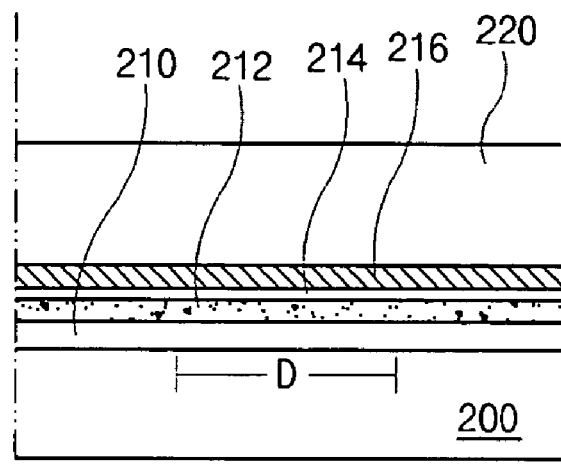
Figure 19D:
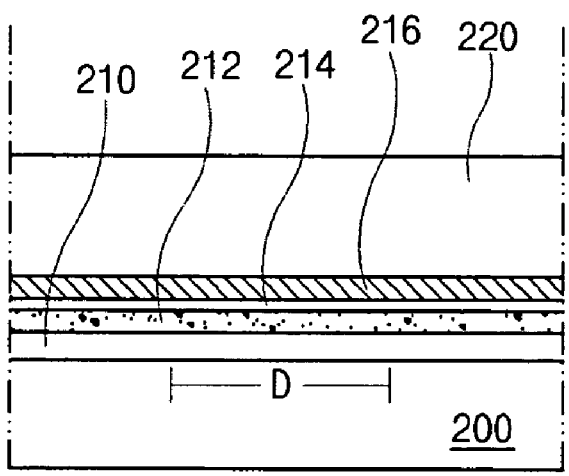
Figure 19E:
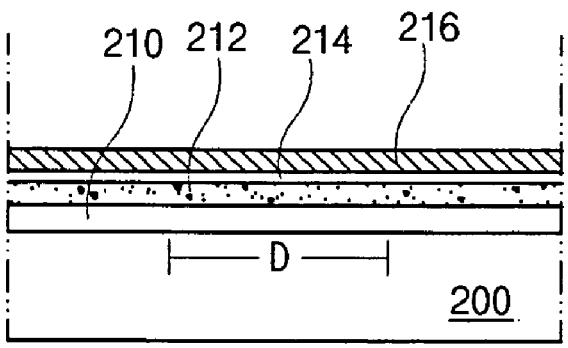
Figure 19F:
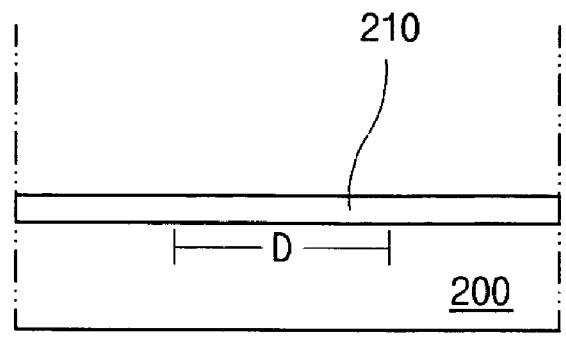
Figure 19G:
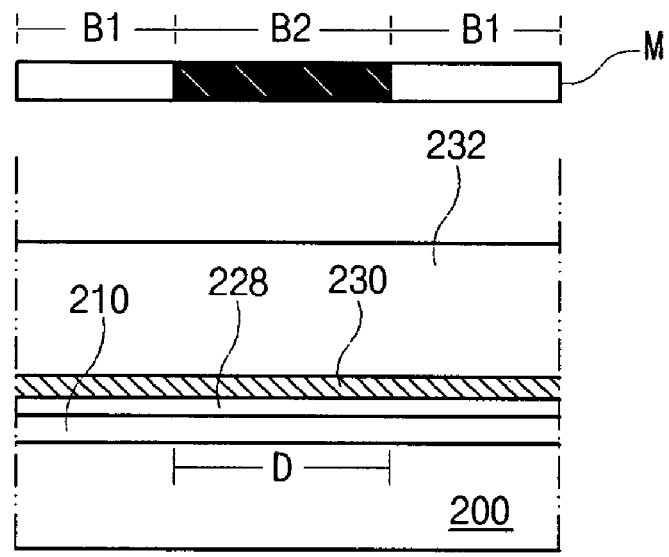
Figure 19H:
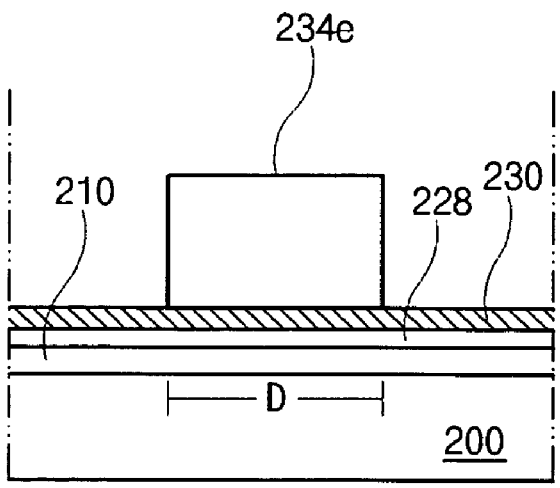
Figure 19I:
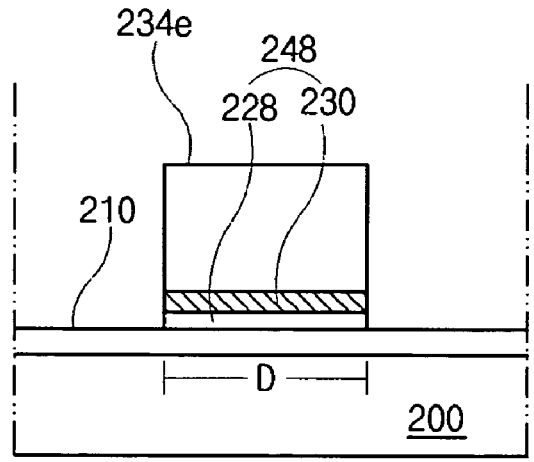
Figure 19J:
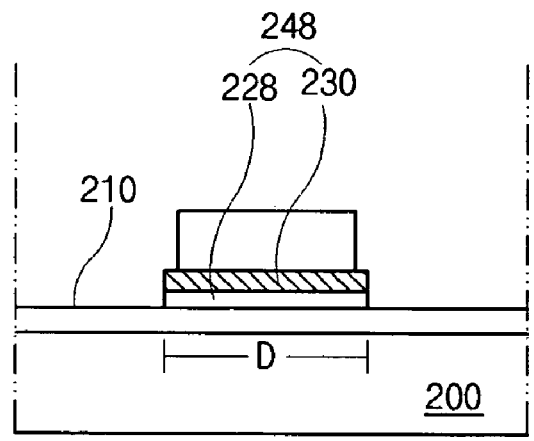
Figure 19K:
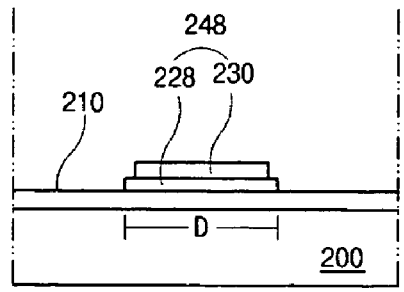
Figure 19L:
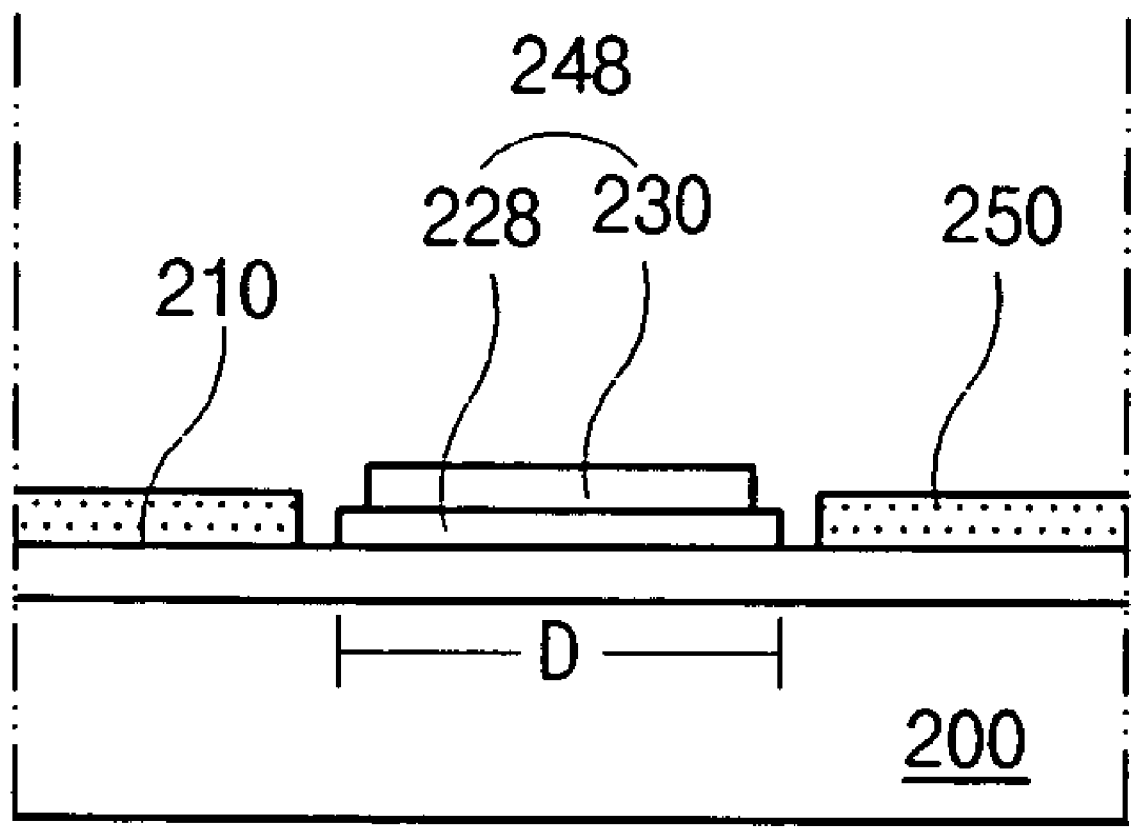
Figure 20C:
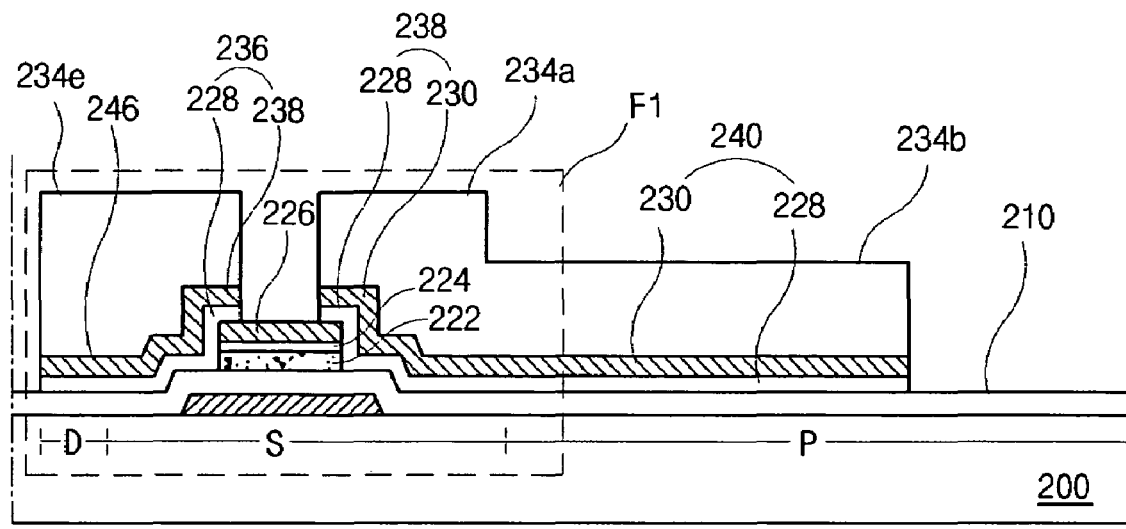
Figure 21C:
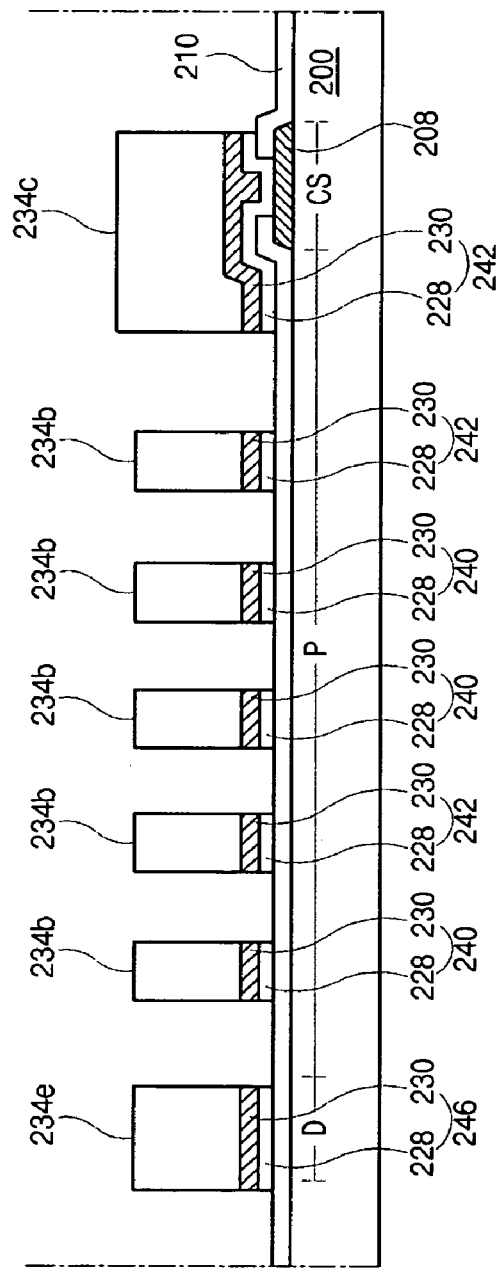

In FIG. 20C and FIG. 21C, a source electrode 236, a drain electrode 238, pixel electrodes 240, common electrodes 242, a gate pad electrode 244 of FIG. 18I, a data pad 248 of FIG. 19I, and a data line 246 are formed. The source electrode 236 and the drain electrode 238 are formed under the first photoresist pattern 234a in the switching region S. The pixel electrodes 240 are formed under the even parts of the second photoresist pattern 234b in the pixel region P. The pixel electrodes 240 are connected to the drain electrode 238. The common electrodes 242 are formed under the odd parts of the second photoresist pattern 234b in the pixel region P and the third photoresist pattern 234c in the common signal region CS. The common electrodes 242 are connected to the common line 208. The common electrodes 242 alternate with the pixel electrodes 240. The gate pad electrode 244 of FIG. 18I is formed under the fourth photoresist pattern 234d of FIG. 18I in the gate region G and contacts the gate pad 206 of FIG. 18I. The data pad 248 of FIG. 19I and the data line 246 are formed under the fifth photoresist pattern 234e. The data pad 248 of FIG. 19I is disposed at one end of the data line 246.

Each of the source and drain electrodes 236 and 238, the pixel electrodes 240, the common electrodes 242, the gate pad electrode 244 of FIG. 18I, the data pad 248 of FIG. 19I and the data line 246 includes the transparent conductive layer 228 and the opaque conductive layer 230 sequentially deposited.

Figure 20D:
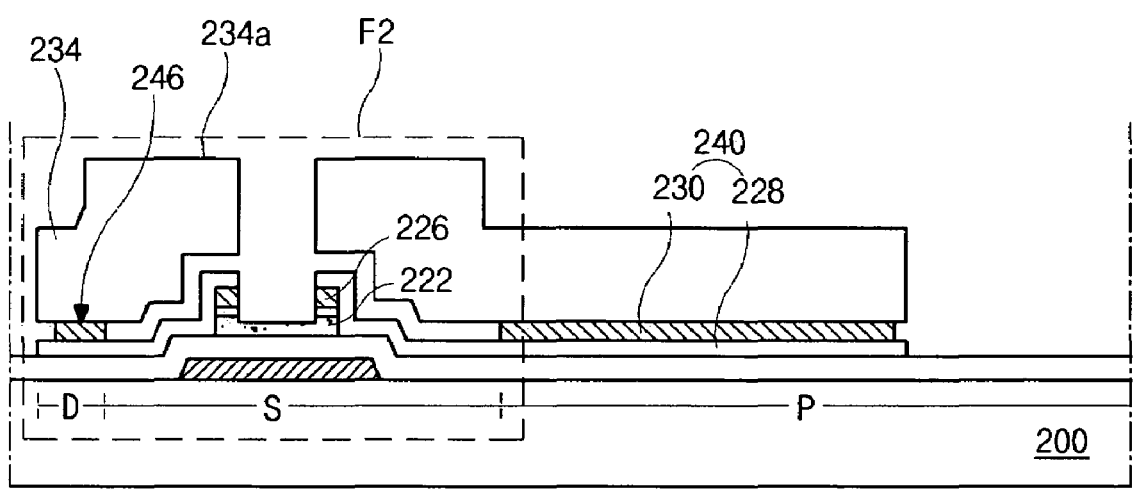
Figure 21D:
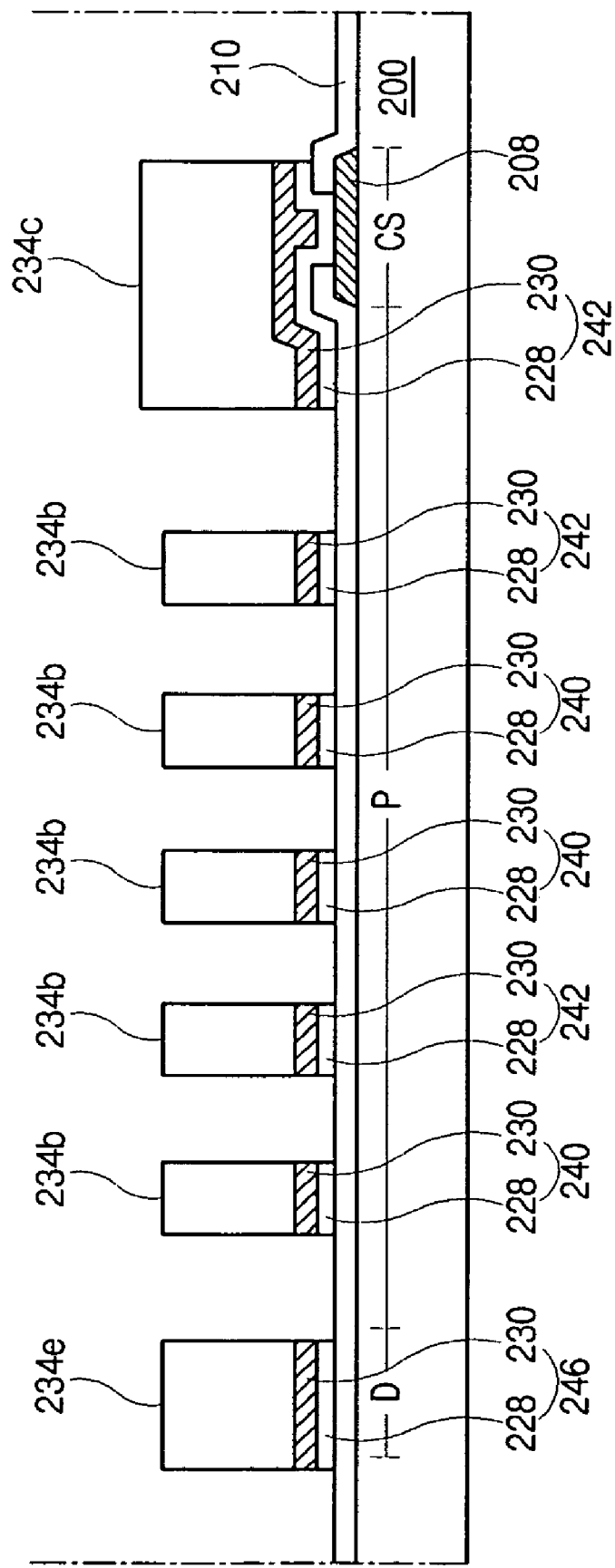

In FIG. 20D and FIG. 21D, the opaque conductive layers 230 of the source and drain electrodes 236 and 238 are removed by dipping the substrate 200 into an etchant for only the opaque conductive layers 230. As shown in FIG. 21A, widths W1 of the source and drain electrodes 236 and 238 are narrower than a width W2 of the data line 246. Since the source and drain electrodes 236 and 238 have relatively narrower widths W1 than the data line 246, the opaque conductive layers 230 of the source and drain electrodes 236 and 238 can be removed by over-etching the opaque conductive layers 230.

Edges of the opaque conductive layers 228 of the pixel electrodes 240 and the common electrodes 242 are also removed to thereby expose edges of the transparent conductive layer 230. The exposed transparent conductive layer 230 increases the aperture area, and the brightness is improved.

The source and drain electrodes 236 and 238 include only the transparent conductive layer. Each of the pixel electrodes 240, the common electrodes 242, the gate pad electrode 244 of FIG. 18K, the data line 246 and the data pad 248 of FIG. 19K includes the transparent conductive layer 228 and the opaque conductive layer 230.

The buffer metallic layer 226 is exposed between the source and drain electrodes 236 and 238. The exposed buffer metallic layer 226 and the ohmic contact layer 224 are removed between the source and drain electrodes 236 and 238. In the switching region S, the active layer 222 is exposed between the source and drain electrodes 236 and 238.

Next, the first, second, third, fourth and fifth photoresist patterns 234a, 234b, 234c, 234d and 234e are removed.

As stated above, the third mask process according to the fourth embodiment is performed.

In the present invention, the amorphous silicon layer does not exist under the data line and is disposed over and within the gate electrode. Accordingly, light from a backlight is prevented from going into the amorphous silicon layer, and the wavy noise does not occur. In addition, the aperture ratio increases, and the brightness of the device is improved.

Since the source and drain electrodes and are transparent, the source and drain electrodes do not reflect light from the backlight. Thus, the light from the backlight is prevented from going on the active layer, and the photo-leakage currents are not caused in the active layer.

In an IPS mode LCD device according to the present invention, each of the pixel electrodes and the common electrodes includes a transparent conductive layer and an opaque conductive layer. The opaque conductive layer has a narrower width than the transparent conductive layer, and the transparent conductive layer is exposed at its edges. The exposed transparent conductive layer increases the aperture area, and the brightness of the device is improved.

It will be apparent to those skilled in the art that various modifications and variations can be made in the liquid crystal display device of the present invention without departing from the spirit or scope of the invention. Thus, it is intended that the present invention cover the modifications and variations of this invention provided they come within the scope of the appended claims and their equivalents.

What is claimed is:

1. An array substrate for a liquid crystal display device comprising:
    a substrate;
    a gate line on the substrate;
    a data line crossing the gate line to define a pixel region;
    a thin film transistor connected to the gate line and the data line and including a gate electrode, an active layer, an ohmic contact layer, a buffer metallic layer, a source electrode and a drain electrode; and
    a pixel electrode in the pixel region and connected to the thin film transistor,
    wherein the data line includes a transparent conductive layer and an opaque conductive layer, and each of the source and drain electrodes and the pixel electrode includes a transparent conductive layer; and
    wherein the opaque conductive layer of the data line has a narrower width than the transparent conductive layer of the data line.

2. The array substrate according to claim 1, further comprising a gate pad and a gate pad electrode, wherein the gate pad is disposed at one end of the gate line, and the gate pad electrode contacts the gate pad, the gate pad electrode including a transparent conductive layer.

3. The array substrate according to claim 2 further comprising an insulating layer covering the gate line, the thin film transistor and the data line and exposing the gate pad electrode and the data pad.

4. The array substrate according to claim 1 further comprising a data pad at one end of the data line, wherein the data pad includes a transparent conductive layer.

5. The array substrate according to claim 1, wherein a part of the active layer disposed between the source and drain electrodes functions as a channel of the thin film transistor, and wherein the channel comprises a U-shaped structure.

6. The array substrate according to claim 1, wherein the source and drain electrodes and the pixel electrode comprise indium tin oxide.

7. The array substrate according to claim 1, wherein the active layer comprises an island shaped structure and is disposed over and within the gate electrode.

8. The array substrate according to claim 1, wherein the pixel electrode overlaps the gate line to form a storage capacitor, and wherein the gate line acts as a first capacitor electrode and the pixel electrode functions as a second capacitor electrode.

9. The array substrate according to claim 1, wherein the source electrode is integral with the transparent conductive layer of the data line.

10. An array substrate for a liquid crystal display device comprising:
a substrate;
a gate line on the substrate;
a data line crossing the gate line to define a pixel region;
a thin film transistor connected to the gate line and the data line and including a gate electrode, an active layer, an ohmic contact layer, a buffer metallic layer, a source electrode and a drain electrode;
pixel electrodes in the pixel region and connected to the thin film transistor; and
common electrodes in the pixel region and alternating with the pixel electrodes,
wherein the data line includes a transparent conductive layer and an opaque conductive layer, and each of the source and drain electrodes includes a transparent conductive layer.

11. The array substrate according to claim 10, wherein each of the common electrodes and the pixel electrodes comprises a transparent conductive layer and an opaque conductive layer.

12. The array substrate according to claim 11, wherein the transparent conductive layer of each of the common electrodes and the pixel electrodes has a greater width than the opaque conductive layer of each of the common electrodes and the pixel electrodes.

13. The array substrate according to claim 10 further comprising a gate pad, a data pad and a gate pad electrode, wherein the gate pad is disposed at one end of the gate line, the data pad is disposed at one end of the data line, and the gate pad electrode contacts the gate pad, each of the gate pad electrode and the data pad including a transparent conductive layer.

14. The array substrate according to claim 13, wherein each of the gate pad electrode and the data pad further includes an opaque conductive layer.

15. The array substrate according to claim 10, wherein the active layer has a smaller size than the gate electrode.

16. The array substrate according to claim 10 further comprising a common line parallel to the gate line.

17. The array substrate according to claim 16, wherein the common electrodes contact the common line.

18. An array substrate for a liquid crystal display device comprising:
a substrate;
a gate line on the substrate;
a data line crossing the gate line to define a pixel region;
a thin film transistor connected to the gate line and the data line and including a gate electrode protruded from the gate line, an active layer and an ohmic contact layer overlapped with the gate electrode, a source electrode and a drain electrode protruded from the data line on the active and ohmic contact layers and a buffer metallic layer interposed between the active and ohmic contact layers and the source and drain electrodes; and
a pixel electrode in the pixel region and connected to the thin film transistor,
wherein the data line includes a transparent conductive layer and an opaque conductive layer on the transparent conductive layer, and each of the source and drain electrodes and the pixel electrode includes a transparent conductive layer; and wherein the opaque conductive layer of the data line has a narrower width than the transparent conductive layer of the data line.

* * * * *

UNITED STATES PATENT AND TRADEMARK OFFICE
CERTIFICATE OF CORRECTION

PATENT NO.         : 7,528,409 B2
APPLICATION NO.    : 11/639567
DATED              : May 5, 2009
INVENTOR(S)        : Kim et al.

Page 1 of 1

It is certified that error appears in the above-identified patent and that said Letters Patent is hereby corrected as shown below:

On the title page,

[*] Notice:    Subject to any disclaimer, the term of this patent is extended or adjusted under 35 USC 154(b) by (59) days Delete the phrase "by 59 days" and insert -- by 38 days --

Signed and Sealed this

Third Day of November, 2009

David J. Kappos
*Director of the United States Patent and Trademark Office*